US012757598B2

(12) United States Patent
Yu et al.

(10) Patent No.: US 12,757,598 B2
(45) Date of Patent: Oct. 6, 2026

(54) DISPLAY SUBSTRATE, DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Ziyang Yu, Beijing (CN); Tiaomei Zhang, Beijing (CN); Zhiliang Jiang, Beijing (CN); Ming Hu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 337 days.

(21) Appl. No.: 18/702,914

(22) PCT Filed: Apr. 27, 2023

(86) PCT No.: PCT/CN2023/091129
§ 371 (c)(1),
(2) Date: Apr. 19, 2024

(87) PCT Pub. No.: WO2024/221329
PCT Pub. Date: Oct. 31, 2024

(65) Prior Publication Data

US 2025/0234727 A1 Jul. 17, 2025

(51) Int. Cl.

| | |
|---|---|
| ***H01L 21/78*** | (2006.01) |
| ***H10K 59/122*** | (2023.01) |
| ***H10K 59/131*** | (2023.01) |

(52) U.S. Cl.
CPC ......... *H10K 59/131* (2023.02); *H10K 59/122* (2023.02)

(58) Field of Classification Search
CPC ..... H10K 59/131; H10K 59/122; G06F 3/041
(Continued)

(56) References Cited

U.S. PATENT DOCUMENTS 10,559,261 B2 * 2/2020 Chang ................ H10K 59/1213
11,502,142 B2 11/2022 Lee
(Continued)

FOREIGN PATENT DOCUMENTS

CN 112133731 A 12/2020
CN 112838167 A 5/2021
(Continued)

*Primary Examiner* — Vu A Vu
(74) *Attorney, Agent, or Firm* — Westman, Champlin & Koehler, P.A.

(57) ABSTRACT

A display substrate, a display panel and a display device are provided. The display substrate includes: sub-pixels; a first initialization voltage signal line; a first electrode disposed on the base substrate; a pixel defining layer disposed on a side of the first electrode layer away from the base substrate. At least one sub-pixel includes a pixel opening located in the pixel defining layer. The first initialization voltage signal line includes a first sub-line with a main body extending in a first direction and a second sub-line with a main body extending in a second direction. An orthographic projection of one second sub-line on the base substrate is located on a first side of a midpoint of a pixel opening of one first sub-pixel, and an orthographic projection of another second sub-line on the base substrate is located on a second side of a midpoint of a pixel opening of the other first sub-pixel.

20 Claims, 27 Drawing Sheets

(58) Field of Classification Search
USPC ........................................................ 257/91
See application file for complete search history.

(56) References Cited

U.S. PATENT DOCUMENTS

| | | | | |
|---|---|---|---|---|
| 11,706,957 | B2 * | 7/2023 | Kim | G09G 3/3233<br>257/40 |
| 11,864,416 | B2 | 1/2024 | Lee et al. | |
| 11,875,743 | B2 * | 1/2024 | Jeong | G09G 3/3275 |
| 12,057,066 | B2 * | 8/2024 | An | G09G 3/3233 |
| 12,315,446 | B2 * | 5/2025 | Son | G09G 3/3233 |
| 2022/0085340 | A1 | 3/2022 | Lee et al. | |
| 2022/0140010 | A1 | 5/2022 | Lee | |
| 2023/0411406 | A1 * | 12/2023 | Kim | H10D 86/60 |
| 2024/0099056 | A1 | 3/2024 | Lee et al. | |
| 2024/0155881 | A1 | 5/2024 | Liu et al. | |
| 2024/0244906 | A1 * | 7/2024 | Son | H10K 59/1216 |

FOREIGN PATENT DOCUMENTS

| | | | |
|---|---|---|---|
| CN | 113257885 | A | 8/2021 |
| CN | 113658995 | A | 11/2021 |
| CN | 114171560 | A | 3/2022 |
| CN | 114171564 | A | 3/2022 |
| CN | 216015371 | U | 3/2022 |
| CN | 114447034 | A | 5/2022 |
| CN | 114899198 | A | 8/2022 |
| CN | 115376452 | A | 11/2022 |

* cited by examiner

IL3/PLN2

DISPLAY SUBSTRATE, DISPLAY PANEL AND DISPLAY DEVICE

CROSS-REFERENCE TO RELATED APPLICATION(S)

This application is a Section 371 National Stage Application of International Application No. PCT/CN2023/091129, filed on Apr. 27, 2023, entitled "DISPLAY SUBSTRATE, DISPLAY PANEL AND DISPLAY DEVICE", the content of which is incorporated herein by reference in its entirety.

TECHNICAL FIELD

The present disclosure relates to a field of display technology, in particular to a display substrate, a display panel and a display device.

BACKGROUND

Organic light-emitting diode (OLED) display device is a type of display device that uses light-emitting OLEDs to display images and other information. OLED display device has characteristics such as low power consumption, high brightness and high response speed. With a development of OLED technology, the requirements for display effects are becoming higher and higher, and performance parameters such as color deviation need to be continuously improved. There are many factors that affect color deviation of products. From the perspective of substrate design, a planarity of a planarization layer or a pixel electrode has a great impact on color deviation.

The above information disclosed in this section is only for the purpose of understanding the background of the technical concept of the present disclosure. Therefore, the above information may include information that does not constitute the prior art.

SUMMARY

In an aspect, a display substrate is provided. The display substrate includes: a base substrate; a plurality of sub-pixels arranged in an array along a first direction and a second direction on the base substrate, so as to form a plurality of rows of sub-pixels and a plurality of columns of sub-pixels, respectively, where at least one sub-pixel includes a light-emitting element; a first initialization voltage signal line disposed on the base substrate, where the first initialization voltage signal line is configured to transmit a first initialization voltage signal; a first electrode layer disposed on the base substrate, where the light-emitting element of the at least one sub-pixel includes a first electrode located in the first electrode layer; and a pixel defining layer disposed on a side of the first electrode layer away from the base substrate, where the at least one sub-pixel includes a pixel opening located in the pixel defining layer, an orthographic projection of the pixel opening of the at least one sub-pixel on the base substrate falls into an orthographic projection of the first electrode of the at least one sub-pixel on the base substrate. The first initialization voltage signal line includes a first initialization voltage signal sub-line and a second initialization voltage signal sub-line, a main body of the first initialization voltage signal sub-line extends in the first direction, and a main body of the second initialization voltage signal sub-line extends in the second direction. The at least one sub-pixel includes a plurality of first sub-pixels, and the plurality of first sub-pixels are sub-pixels of a first color. Orthographic projections of a plurality of second initialization voltage signal sub-lines on the base substrate partially overlap with orthographic projections of the first electrodes of the plurality of first sub-pixels on the base substrate, respectively. Orthographic projections of the pixel openings of the plurality of first sub-pixels have respective first sides and respective second sides on the base substrate, respectively. Orthographic projections of the pixel openings of the plurality of first sub-pixels have respective midpoints on the base substrate, respectively. The midpoint is a midpoint of a virtual line segment of the orthographic projection of the pixel opening on the base substrate extending in the first direction, and the first side and the second side are opposite sides relative to the midpoint in the first direction. For at least two first sub-pixels, an orthographic projection of one second initialization voltage signal sub-line on the base substrate is located on the first side of the midpoint of the pixel opening of one first sub-pixel among the two first sub-pixels. An orthographic projection of another second initialization voltage signal sub-line on the base substrate is located on the second side of the midpoint of the pixel opening of the other first sub-pixel among the two first sub-pixels.

According to some exemplary embodiments, the two first sub-pixels are any two adjacent first sub-pixels located in a same row.

According to some exemplary embodiments, a plurality of first initialization voltage signal sub-lines intersect with a plurality of second initialization voltage signal sub-lines, and the plurality of first initialization voltage signal sub-lines are connected to the plurality of second initialization voltage signal sub-lines, so that the first initialization voltage signal line forms a mesh structure.

According to some exemplary embodiments, the orthographic projections of the plurality of second initialization voltage signal sub-lines on the base substrate partially overlap with the orthographic projections of the pixel openings of the plurality of first sub-pixels on the base substrate, respectively.

According to some exemplary embodiments, for the any two adjacent first sub-pixels located in the same row, orthographic projections of the two second initialization voltage signal sub-lines partially overlapping with the first electrodes of the two first sub-pixels on the base substrate are symmetrical relative to a first symmetry axis. The first symmetry axis passes through a center point of a line connecting centers of the pixel openings of the two first sub-pixels and extends in the second direction.

According to some exemplary embodiments, for any two adjacent first sub-pixels located in a same column, an orthographic projection of one second initialization voltage signal sub-line on the base substrate is located on the first side of the orthographic projection of the pixel opening of one first sub-pixel among the two first sub-pixels on the base substrate, and an orthographic projection of another second initialization voltage signal sub-line on the base substrate is located on the second side of the orthographic projection of the pixel opening of the other first sub-pixel among the two first sub-pixels on the base substrate.

According to some exemplary embodiments, the plurality of rows of sub-pixels include a plurality of rows of first sub-pixels, and the plurality of columns of sub-pixels include a plurality of columns of first sub-pixels. A position of the second initialization voltage signal sub-line partially overlapping with the first electrode of the first sub-pixel in an $i^{th}$ row and a $j^{th}$ column and a position of the second initialization voltage signal sub-line partially overlapping with the first electrode of the first sub-pixel in an $(i+4)^{th}$ row and the $j^{th}$ column are aligned in the second direction, where i is a positive integer greater than or equal to 1, and j is a positive integer greater than or equal to 1.

According to some exemplary embodiments, the plurality of rows of sub-pixels include a plurality of rows of first sub-pixels, and the plurality of columns of sub-pixels include a plurality of columns of first sub-pixels. A position of the second initialization voltage signal sub-line partially overlapping with the first electrode of the first sub-pixel in an $i^{th}$ row and a $j^{th}$ column and a position of the second initialization voltage signal sub-line partially overlapping with the first electrode of the first sub-pixel in an $(i+2)^{th}$ row and the $j^{th}$ column are aligned in the second direction, where i is a positive integer greater than or equal to 1, and j is a positive integer greater than or equal to 1.

According to some exemplary embodiments, at least one second initialization voltage signal sub-line is located between two adjacent first initialization voltage signal sub-lines. At least one second initialization voltage signal sub-line includes a first portion, a second portion and a third portion. The second portion is located between the first portion and the third portion. The first portion and the third portion both extend in the second direction. The second portion extends in a third direction. The third direction intersects with the first direction, and the third direction intersects with the second direction.

According to some exemplary embodiments, a distance between a center of the pixel opening of the first sub-pixel and a first portion of a second initialization voltage signal sub-line closest to the center of the pixel opening of the first sub-pixel in the first direction is a first distance. A distance between the center of the pixel opening of the first sub-pixel and a third portion of a second initialization voltage signal sub-line closest to the center of the pixel opening of the first sub-pixel in the first direction is a second distance. The first distance is less than the second distance.

According to some exemplary embodiments, the display substrate includes a first conductive layer and a second conductive layer which are disposed on the base substrate. The second conductive layer is located between the first conductive layer and the first electrode layer. The first initialization voltage signal line is located in the first conductive layer. The display substrate further includes a data line located in the second conductive layer. The data line is configured to transmit a data signal. The display substrate further includes a data signal transfer portion located in the first conductive layer. The data signal transfer portion is electrically connected to the data line. An extension line of the first portion of the at least one second initialization voltage signal sub-line in the second direction passes through at least one data signal transfer portion. The third portion of the at least one second initialization voltage signal sub-line and at least one data signal transfer portion are spaced apart from each other in the first direction.

According to some exemplary embodiments, the display substrate further includes a first insulation layer located between the first conductive layer and the second conductive layer; and a plurality of via holes located in the first insulation layer. For any two adjacent first sub-pixels located in a same row, orthographic projections of some via holes among the plurality of via holes on the base substrate are located on the first side of the orthographic projection of the pixel opening of one first sub-pixel among the two first sub-pixels on the base substrate. Orthographic projections of some other via holes among the plurality of via holes on the base substrate are located on the second side of the orthographic projection of the pixel opening of the other first sub-pixel among the two first sub-pixels on the base substrate.

According to some exemplary embodiments, for the any two adjacent first sub-pixels located in the same row, the orthographic projections of said some via holes on the base substrate and the orthographic projections of said some other via holes on the base substrate are symmetrical relative to a first symmetry axis. The first symmetry axis passes through a center point of a line connecting centers of the pixel openings of the two first sub-pixels and extends in the second direction.

According to some exemplary embodiments, the display substrate further includes a first electrode transfer portion located in the first conductive layer and a second electrode transfer portion located in the second conductive layer. The plurality of via holes located in the first insulation layer include a first via hole. The first electrode is electrically connected to the second electrode transfer portion. The second electrode transfer portion is electrically connected to the first electrode transfer portion through the first via hole. Said some via holes include at least one first via hole, and said some other via holes include at least one first via hole.

According to some exemplary embodiments, said some via holes include two first via holes, and said some other via holes include two first via holes.

According to some exemplary embodiments, the display substrate further includes a voltage signal transfer portion located in the first conductive layer and a first voltage signal line located in the second conductive layer. The plurality of via holes located in the first insulation layer include a second via hole, and the first voltage signal line is electrically connected to the voltage signal transfer portion through the second via hole. Said some via holes include at least one second via hole, and said some other via holes include at least one second via hole.

According to some exemplary embodiments, the voltage signal transfer portion includes a first voltage signal transfer portion. The first voltage signal transfer portion includes a first part, a second part and a third part. The second part extends in the second direction, the first part and the third part respectively extend in the first direction. The first part and the third part respectively extend in opposite directions from the second part. An orthographic projection of an end of the first part away from the second part on the base substrate at least partially overlaps with an orthographic projection of one second via hole on the base substrate. An orthographic projection of an end of the third part away from the second part on the base substrate at least partially overlaps with an orthographic projection of another one second via hole on the base substrate.

According to some exemplary embodiments, the voltage signal transfer portion includes a second voltage signal transfer portion. The second voltage signal transfer portion includes a first part and a second part. The second part extends in the second direction, the first part extends in the first direction, and the first part extends from the second part towards one side. An orthographic projection of an end of the first part away from the second part on the base substrate at least partially overlaps with an orthographic projection of one second via hole on the base substrate.

According to some exemplary embodiments, the voltage signal transfer portion includes a third voltage signal transfer portion. The third voltage signal transfer portion includes a second part and a third part. The second part extends in the second direction. The third part extends in the first direction.

The third part extends from the second part towards the other side. An orthographic projection of an end of the third part away from the second part on the base substrate at least partially overlaps with an orthographic projection of one second via hole on the base substrate.

According to some exemplary embodiments, the first voltage signal transfer portion is provided between the second voltage signal transfer portion and the third voltage signal transfer portion adjacent to the second voltage signal transfer portion in the first direction.

According to some exemplary embodiments, the display substrate includes a plurality of pixel driving circuits disposed on the base substrate. The plurality of pixel driving circuits are arranged in an array along the first direction and the second direction. The plurality of pixel driving circuits are configured to drive the light-emitting elements of the plurality of sub-pixels, respectively. The display substrate further includes: a first semiconductor layer disposed on the base substrate; a third conductive layer located on a side of the first semiconductor layer away from the base substrate; a fourth conductive layer located on a side of the third conductive layer away from the base substrate; a second semiconductor layer located on a side of the fourth conductive layer away from the base substrate; a fifth conductive layer located on a side of the second semiconductor layer away from the base substrate; and a second insulation layer disposed between the fifth conductive layer and the first conductive layer. The pixel driving circuit includes a first reset transistor. The first reset transistor includes an active layer, a gate, a source and a drain. The active layer of the first reset transistor is located in the first semiconductor layer. The display substrate further includes a third via hole located in the second insulation layer. The first initialization voltage signal line is electrically connected to the source of the first reset transistor or the drain of the first reset transistor through the third via hole.

According to some exemplary embodiments, the pixel driving circuit further includes a second reset transistor. The second reset transistor includes an active layer, a gate, a source and a drain. The active layer of the second reset transistor is located in the second semiconductor layer. The display substrate further includes a second initialization voltage signal line disposed on the base substrate. The second initialization voltage signal line is configured to transmit a second initialization voltage signal. The second initialization voltage signal line is electrically connected to the source of the second reset transistor or the drain of the second reset transistor. The second initialization voltage signal line is located in the fourth conductive layer. The second initialization voltage signal line extends in the first direction.

According to some exemplary embodiments, the plurality of sub-pixels further include a second sub-pixel and a third sub-pixel. The orthographic projection of the second initialization voltage signal sub-line on the base substrate does not overlap with an orthographic projection of a first electrode of the second sub-pixel on the base substrate. The orthographic projection of the second initialization voltage signal sub-line on the base substrate does not overlap with an orthographic projection of a first electrode of the third sub-pixel on the base substrate.

According to some exemplary embodiments, orthographic projections of the plurality of first initialization voltage signal sub-lines on the base substrate partially overlaps with an orthographic projection of the first electrode of at least one third sub-pixel on the base substrate; and/or, the orthographic projection of the first initialization voltage signal sub-line on the base substrate does not overlap with an orthographic projection of the first electrode of the first sub-pixel on the base substrate; and/or, the orthographic projection of the first initialization voltage signal sub-line on the base substrate does not overlap with the orthographic projection of the first electrode of the second sub-pixel on the base substrate.

According to some exemplary embodiments, the first sub-pixel is a red sub-pixel, the second sub-pixel is a blue sub-pixel, and the third sub-pixel is a green sub-pixel.

In another one aspect, a display substrate is provided. The display substrate includes: a base substrate; a plurality of sub-pixels arranged in an array along a first direction and a second direction on the base substrate, so as to form a plurality of rows of sub-pixels and a plurality of columns of sub-pixels, respectively, where at least one sub-pixel includes a light-emitting element; a first initialization voltage signal line disposed on the base substrate, where the first initialization voltage signal line is configured to transmit a first initialization voltage signal; a first electrode layer disposed on the base substrate, where the light-emitting element of the at least one sub-pixel includes a first electrode located in the first electrode layer; and a pixel defining layer disposed on a side of the first electrode layer away from the base substrate, where the at least one sub-pixel includes a pixel opening located in the pixel defining layer, an orthographic projection of the pixel opening of the at least one sub-pixel on the base substrate falls into an orthographic projection of the first electrode of the at least one sub-pixel on the base substrate. The at least one sub-pixel includes a plurality of first sub-pixels, and the plurality of first sub-pixels are sub-pixels of a first color. Orthographic projections of a plurality of second initialization voltage signal sub-lines on the base substrate partially overlap with orthographic projections of the first electrodes of the plurality of first sub-pixels on the base substrate, respectively. Orthographic projections of pixel openings of the plurality of first sub-pixels have respective first sides and respective second sides on the base substrate, respectively. Orthographic projections of the pixel openings of the plurality of first sub-pixels have respective midpoints on the base substrate, respectively. The midpoint is a midpoint of a virtual line segment of the orthographic projection of the pixel opening on the base substrate extending in the first direction. The first side and the second side are opposite sides relative to the midpoint in the first direction. The display substrate further includes: a first conductive layer and a second conductive layer which are disposed on the base substrate; a first insulation layer located between the first conductive layer and the second conductive layer; and a plurality of via holes located in the first insulation layer. The second conductive layer is located between the first conductive layer and the first electrode layer. The first initialization voltage signal line is located in the first conductive layer. For at least two first sub-pixels, orthographic projections of some via holes among the plurality of via holes on the base substrate are located on the first side of the midpoint of the pixel opening of one first sub-pixel among the two first sub-pixels. Orthographic projections of some other via holes among the plurality of via holes on the base substrate are located on the second side of the midpoint of the pixel opening of the other first sub-pixel among the two first sub-pixels.

In yet another one aspect, a display device is provided, including the display substrate as described above.

BRIEF DESCRIPTION OF THE DRAWINGS

Through describing exemplary embodiments of the present disclosure in detail with reference to the accompanying drawings, the features and advantages of the present disclosure will become more apparent.

FIG. 11 is a partial plan view of a light shielding layer of the display substrate. FIG. 12 is a partial plan view of a first semiconductor layer of the display substrate. FIG. 13 is a partial plan view of a third conductive layer of the display substrate. FIG. 14 is a partial plan view of a fourth conductive layer of the display substrate. FIG. 15 is a partial plan view of a second semiconductor layer of the display substrate. FIG. 16 is a partial plan view of a fifth conductive layer of the display substrate. FIG. 17 is a partial plan view of a first interlayer dielectric layer of the display substrate, which schematically shows a plurality of via holes located in the first interlayer dielectric layer. FIG. 18 is a partial plan view of a second interlayer dielectric layer of the display substrate, which schematically shows a plurality of via holes located in the second interlayer dielectric layer. FIG. 19 is a partial plan view of a first conductive layer of the display substrate. FIG. 20 is a partial plan view of the display substrate, which schematically shows an overlay from the light shielding layer to the first conductive layer. FIG. 21 is a partial plan view of a passivation layer of the display substrate, which schematically shows a plurality of via holes located in the passivation layer. FIG. 22 is a partial plan view of a first planarization layer of the display substrate, which schematically shows a plurality of via holes located in the first planarization layer. FIG. 23 is a partial plan view of a second conductive layer of the display substrate. FIG. 24 is a partial plan view of a second planarization layer of the display substrate, which schematically shows a plurality of via holes located in the second planarization layer. FIG. 25 is a partial plan view of a first electrode layer of the display substrate. FIG. 26 is a partial plan view of a pixel defining layer of the display substrate, which schematically shows a plurality of pixel openings located in the pixel defining layer. FIG. 27 is a partial plan view of the display substrate, which schematically shows an overlay from the first conductive layer to the pixel defining layer.

DETAILED DESCRIPTION OF EMBODIMENTS

Figure 1:
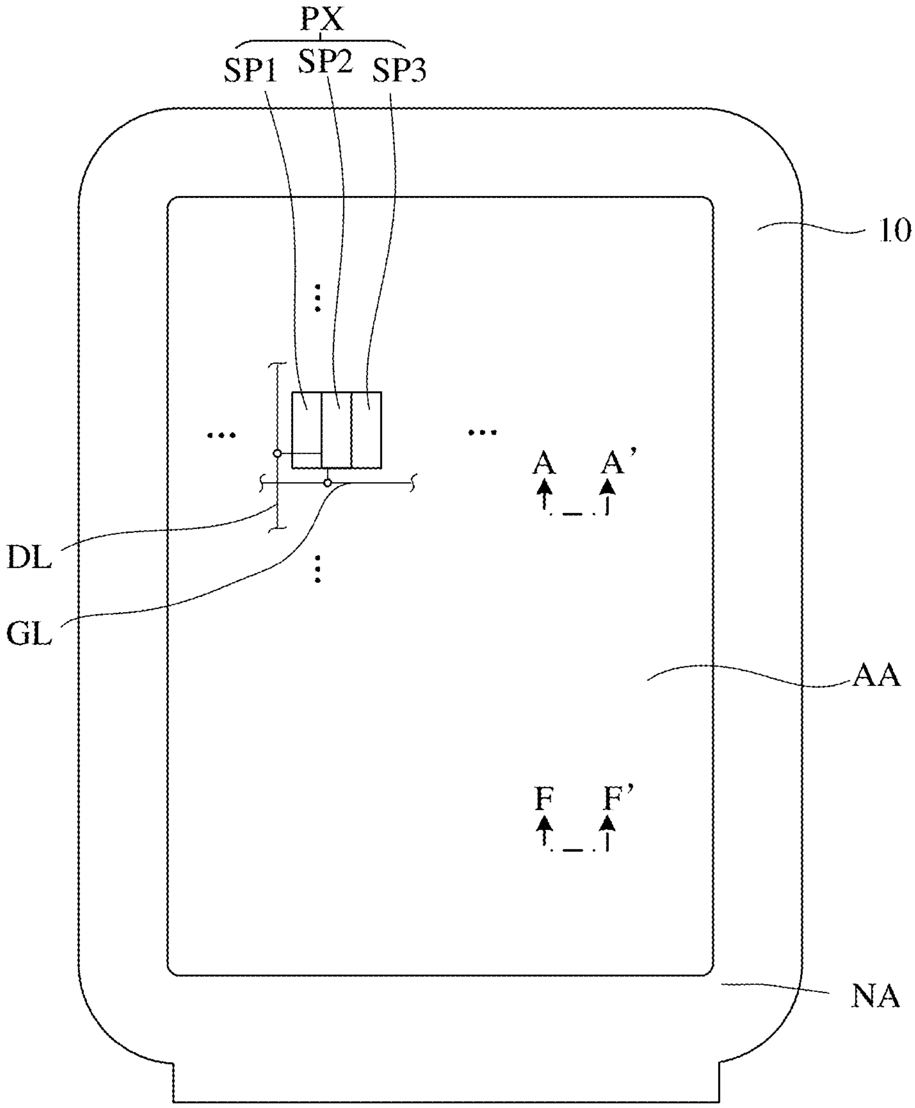
FIG. 1 is a schematic plan view of a display substrate according to embodiments of the present disclosure.

In order to make purposes, technical solutions, and advantages of embodiments of the present disclosure clearer, technical solutions in the embodiments of the present disclosure will be described clearly and completely in combination with accompanying drawings. Obviously, the described embodiments are only part of the embodiments of the present disclosure, not all of the embodiments. Based on the embodiments of the present disclosure provided, all other embodiments obtained by those of ordinary skilled in the art without creative labor, fall within scope of protection of the present disclosure.

It will be noted that, in the accompanying drawings, a dimension and a relative dimension of the elements may be exaggerated for clarity and/or description. In this way, features such as dimensions, relative dimensions, and overlapping relationships of components in the drawings may be extracted into the description or claims as technical features. In the specification and the accompanying drawings, the same or similar reference number represents the same or similar component.

When an element is described as being "on", "connected to", or "coupled to" another element, the element may be directly on, directly connected to, or directly coupled to the other element, or intermediate elements may be existed. However, when an element is described as being "directly on", "directly connected to", or "directly coupled to" another element, there is no intermediate element existed. Other terms and/or expressions used to describe a relationship between elements will be interpreted in a similar fashion, e.g., "between" versus "directly between", "adjacent" versus "directly adjacent", or "on" versus "directly on" etc. Furthermore, the term "connected" may refer to a physical connection, an electrical connection, a communication connection, and/or a fluid connection. In addition, an X axis, a Y axis and a Z axis are not limited to the three axes of a rectangular coordinate system, and may be interpreted in a broader sense. For example, the X, Y, and Z axes may be perpendicular to each other, or may represent different directions that are not perpendicular to each other. For the purposes of the present disclosure, "at least one of X, Y, and Z" and "at least one selected from the group formed by X, Y, and Z" may be interpreted as only X, only Y, only Z, or any combination of two or more of X, Y and Z such as XYZ, XYY, YZ and ZZ. As used herein, the term "and/or" includes any combination and all combinations of one or more of the listed associated items.

It should be noted that although the terms "first", "second", etc. may be used here to describe various components, members, elements, regions, layers, and/or parts, these components, members, elements, regions, layers, and/or parts should not be limited by these terms. Instead, these terms are used to distinguish one component, member, element, region, layer, and/or part from another component, member, element, region, layer, and/or part. Therefore, for example, the first component, the first member, the first element, the first region, the first layer, and/or the first part discussed below may be referred to as the second component, the second member, the second element, the second region, the second layer, and/or the second part, without departing from the teachings of the present disclosure.

For ease of description, a spatially relational term, e.g., "upper", "lower", "left", "right", etc. may be used herein to describe a relationship between one element or feature with another element or feature as shown in the drawings. It should be understood that the spatially relational terms are intended to encompass other different orientations of the apparatus in use or operation in addition to an orientation depicted in the drawings. For example, if the apparatus in the drawings is turned over, the elements described as "below" or "beneath" the other elements or features would then be oriented "above" or "on" the other elements or features.

In the present disclosure, the terms "basically", "about", "approximately", "substantially" and other similar terms are used as approximate terms rather than as terms of degree, and they are intended to explain the fixed deviation of measured or calculated values that will be recognized by those of ordinary skill in the art. Taking into account factors such as process fluctuations, measurement problems and errors related to the measurement of a specific amount (i.e., the limitations of the measurement system), the "about" or "approximately" used here includes the stated value, and indicates that the specific value determined by those of ordinary skill in the art is within the acceptable deviation range. For example, "about" may be expressed within one or more standard deviations, or within ±30%, ±20%, ±10%, ±5% of the stated values.

It should be noted that, in this text, the expression "same layer" refers to a layer structure which is formed by forming a layer used to form a specific pattern by the same film-forming process, and then patterning the layer by using the same mask through a one-time patterning process. According to the difference between the specific patterns, the one-time patterning process may include multiple exposures, developments or etching processes, and the specific pattern in the formed layer structure may be continuous or discontinuous. That is, multiple elements, components, structures and/or parts located in the "same layer" are made of the same material and formed by the same composition process. Generally, multiple elements, components, structures and/or parts located in the "same layer" have substantially the same thicknesses.

In this text, directional expressions such as "first direction" and "second direction" are used to describe different arrangement directions along sub-pixels, such as a vertical direction of a sub-pixel arrangement and a horizontal direction of the sub-pixel arrangement, or a row direction of the sub-pixel arrangement and a column direction of the sub-pixel arrangement. It should be understood that such representation is only an illustrative description, rather than a limit on the present disclosure.

The transistors used in the embodiments of the present disclosure may be all thin film transistors, field-effect transistors, or other devices with same characteristics. Since a source of the thin film transistor and a drain of the thin film transistor used here are symmetrical, the source of the thin film transistor and the drain of the thin film transistor may be interchanged. In the embodiments of the present disclosure, the transistor may include a gate, a first electrode and a second electrode, where the first electrode may represent one of the source and drain, and the second electrode may represent the other one of the source and drain. In the following examples, a case of P-type thin film transistors used as driving transistors is mainly described, while other transistors have the same or different types of driving transistors according to circuit design. Similarly, in other embodiments, the driving transistor may also be shown as an N-type thin film transistor.

The embodiments of the present disclosure at least provide a display substrate, provide a display substrate. The display substrate includes: a base substrate; a plurality of sub-pixels arranged in an array along a first direction and a second direction on the base substrate, so as to form a plurality of rows of sub-pixels and a plurality of columns of sub-pixels, respectively, where at least one sub-pixel includes a light-emitting element; a first initialization voltage signal line disposed on the base substrate, where the first initialization voltage signal line is configured to transmit a first initialization voltage signal; a first electrode layer disposed on the base substrate, where the light-emitting element of the at least one sub-pixel includes a first electrode located in the first electrode layer; and a pixel defining layer disposed on a side of the first electrode layer away from the base substrate, where the at least one sub-pixel includes a pixel opening located in the pixel defining layer, an orthographic projection of the pixel opening of the at least one sub-pixel on the base substrate falls into an orthographic projection of the first electrode of the at least one sub-pixel on the base substrate. The first initialization voltage signal line includes a first initialization voltage signal sub-line and a second initialization voltage signal sub-line. A main body of the first initialization voltage signal sub-line extends in the first direction, and a main body of the second initialization voltage signal sub-line extends in the second direction. The at least one sub-pixel includes a plurality of first sub-pixels, and the plurality of first sub-pixels are sub-pixels of a first color. Orthographic projections of a plurality of second initialization voltage signal sub-lines on the base substrate partially overlap with orthographic projections of the first electrodes of the plurality of first sub-pixels on the base substrate, respectively. Orthographic projections of pixel openings of the plurality of first sub-pixels have respective first sides and respective second sides on the base substrate, respectively. Orthographic projections of the pixel openings of the plurality of first sub-pixels have respective midpoints on the base substrate, respectively. The midpoint is a midpoint of a virtual line segment of the orthographic projection of the pixel opening on the base substrate extending in the first direction. The first side and the second side are opposite sides relative to the midpoint in the first direction. For at least two first sub-pixels, an orthographic projection of one second initialization voltage signal sub-line on the base substrate is located on the first side of the midpoint of the pixel opening of one first sub-pixel among the two first sub-pixels. An orthographic projection of the other one second initialization voltage signal sub-line on the base substrate is located on the second side of the midpoint of the pixel opening of the other first sub-pixel among the two first sub-pixels. In the display substrate provided in the embodiments of the present disclosure, there is almost no color deviation between adjacent sub-pixels in a row direction, that is, the display effect of the display substrate is good and there is no color deviation problem.

FIG. 1 is a schematic plan view of a display substrate according to embodiments of the present disclosure. With reference to FIG. 1, the display substrate according to the embodiments of the present disclosure may include a base substrate 10 and a pixel unit PX disposed on the base substrate 10.

The display substrate may include a display region AA and a non-display region NA. The display region AA may be a region where pixel units PX are provided for displaying an image. Each pixel unit PX will be described later. The non-display region NA is a region where pixel units PX are not provided, that is, the non-display region NA may be a region where the image is not displayed. The non-display region NA corresponds to the border in the final display device, and a width of the border may be determined based on a width of the non-display region NA.

The display region AA may have various shapes. For example, the display region AA may be provided in various shapes such as a closed polygon including straight edges (such as rectangle), a circle or ellipse, etc. including curved edges, and a semicircle or semi ellipse, etc. including straight edges and curved edges. In the embodiments of the present disclosure, the display region AA is provided as a region with a quadrilateral shape including straight edges. It should be understood that this is only an exemplary embodiment of the present disclosure, rather than a limit on the present disclosure.

The non-display region NA may be disposed on at least one side of the display region AA. In the embodiments of the present disclosure, the non-display region NA may surround a periphery of the display region AA. In the embodiments of the present disclosure, the non-display region NA may include a lateral portion extending in the first direction X and a longitudinal portion extending in the second direction Y.

The pixel unit PX is disposed in the display region AA. The pixel unit PX is the smallest unit used to display images and a plurality of pixel units PX may be provided. For example, the pixel unit PX may include a light-emitting device that emits white light and/or colored light.

A plurality of pixel units PX may be provided and arranged in a matrix form along rows extending in the first direction X and columns extending in the second direction Y. However, the embodiments of the present disclosure do not specifically limit the arrangement form of the pixel units PX, and the pixel units PX may be arranged in various forms. For example, the pixel units PX may be arranged such that a direction inclined relative to the first direction X and the second direction Y becomes a column direction, and a direction intersecting with the column direction becomes a row direction.

That is to say, a plurality of pixel units PX are arranged in an array along the first direction X and the second direction Y, so as to form a plurality of rows of pixel units and a plurality of columns of pixel units.

A pixel unit PX may include a plurality of sub-pixels. For example, a pixel unit PX may include three sub-pixels, that is, a first sub-pixel SP1, a second sub-pixel SP2 and a third sub-pixel SP3. For example, the first sub-pixel SP1 may be a red sub-pixel, the second sub-pixel SP2 may be a blue sub-pixel, and the third sub-pixel SP3 may be a green sub-pixel.

It should be noted that in the embodiments of the present disclosure, there is no special limitation on the number of sub-pixels included in a pixel unit, and it is not limited to the three mentioned above.

For example, in the exemplary embodiment shown in FIG. 1, a scanning control signal line GL and a data line DL are schematically shown. The display substrate also includes: a plurality of scanning control signal lines GL and a plurality of data lines DL which are disposed on the base substrate. The plurality of scanning control signal lines GL supply scanning control signals to the plurality of rows of pixel units, respectively. The plurality of data lines DL supply data signals to the plurality of columns of pixel units, respectively. The scanning control signal line GL extends in the first direction X. The plurality of scanning control signal lines GL are arranged at intervals in the second direction Y. The data line DL extends in the second direction Y. The plurality of data lines DL are arranged at intervals in the first direction X.

For example, the scanning control signal line GL may be a representative of lateral wire, and the data line DL may be a representative of longitudinal wire. It should be understood that the lateral wire may also include other types of wires or wires used to supply other signals, and the longitudinal wire may also include other types of wires or wires used to supply other signals.

Each sub-pixel may include a light-emitting element and a pixel driving circuit for driving the light-emitting element. For example, in an OLED display substrate or display panel, the light-emitting element of the sub-pixel may include an anode, a luminescent material layer and a cathode, which are disposed in a stack. The anodes of the light-emitting elements of respective sub-pixels are spaced apart and arranged in a matrix form along rows extending in the first direction X and columns extending in the first direction Y.

Hereinafter, taking a 7T1C (i.e., seven transistors and one capacitor) pixel driving circuit as an example, the structure of the pixel driving circuit will be described in detail. However, the embodiments of the present disclosure are not limited to the 7TIC pixel driving circuit. Without conflict, other known pixel driving circuit structures may be applied to the embodiments of the present disclosure. It should be noted that in the embodiment of the present disclosure, each pixel driving circuit may be a structure including other numbers of transistors, such as 8TIC structure, 7T2C structure, 6TIC structure, 6T2C structure or 9T2C structure, in addition to the 7TIC structure shown in FIG. 2. The embodiments of the present disclosure are not limited to this.

Figure 2:
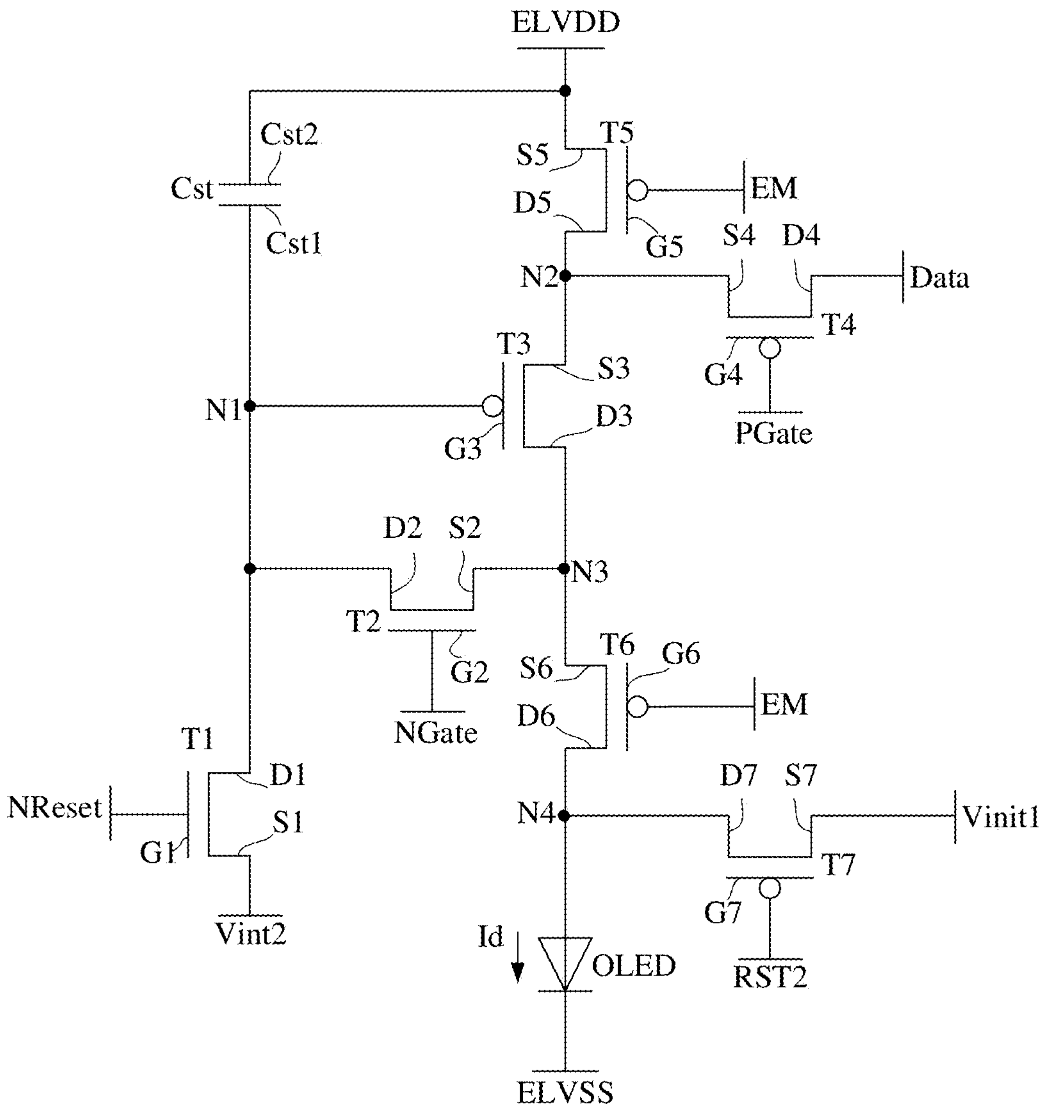
FIG. 2 is an equivalent circuit diagram of a pixel driving circuit of a display substrate according to some exemplary embodiments of the present disclosure.

FIG. 2 is an equivalent circuit diagram of a pixel driving circuit of a display substrate according to some exemplary embodiments of the present disclosure. The pixel driving circuit is used to drive the light-emitting element such as organic light-emitting diode (OLED). With reference to FIG.

2, the pixel driving circuit may include a second reset transistor T1, a compensation transistor T2, a driving transistor T3, a data writing transistor T4, a first light-emitting control transistor T5, a second light-emitting control transistor T6, a first reset transistor T7 and a storage capacitor Cst. The display substrate also includes a first scanning control signal line GL1 (corresponding to the first scanning control signal PGate in FIG. 2), a second scanning control signal line GL2 (corresponding to the second scanning control signal NGate in FIG. 2), a first reset control signal line PRT1 (corresponding to the first reset control signal RST2), a second reset control signal line PRT2 (corresponding to the second reset control signal NReset), a light-emitting control signal line EML (corresponding to the light-emitting control signal EM in FIG. 2), a first initialization voltage signal line VIL1 (corresponding to the first initialization voltage signal Vinit1 in FIG. 2), a second initialization voltage signal line VIL2 (corresponding to the second initialization voltage signal Vinit2 in FIG. 2), a data line DL (corresponding to the data signal Data in FIG. 2), a first voltage signal line VDL (corresponding to the first voltage signal ELVDD in FIG. 2) and a second voltage signal line VSL (corresponding to the second voltage signal ELVSS in FIG. 2).

With continued reference to FIG. 2, a first electrode of the second reset transistor T1 (such as the source S1) is electrically connected to the second initialization voltage signal line VIL2, a second electrode of the second reset transistor T1 (such as the drain D1) is electrically connected to a gate of the driving transistor T3, that is, a node N1, and a gate G1 of the second reset transistor T1 is electrically connected to the second reset control signal line PRT2. Under control of the second reset control signal line PRT2, the second initialization voltage signal Vinit2 transmitted by the second initialization voltage signal line VIL2 is selectively written into the node N1 by the second reset transistor T1.

A first electrode of the compensation transistor T2 (such as the source S2) is electrically connected to a first electrode of driving transistor T3 (such as the drain D3), that is, a node N3; a second electrode of the compensation transistor T2 (such as the drain D2) is electrically connected to the gate G1 of driving transistor T3, that is, the node N1; a gate G2 of the compensation transistor T2 is electrically connected to the second scanning control signal line GL2 to receive a compensation control signal.

A first electrode of the driving transistor T3 (such as the drain D3) is electrically connected to the first electrode of the compensating transistor T2 (such as the source S2), that is, the node N3; a second electrode of the driving transistor T3 (such as the source S3) is electrically connected to a second electrode of the first light-emitting control transistor T5 (such as the drain D5), that is, a node N2; and the gate G3 of the driving transistor T3 is electrically connected to the node N1.

A first electrode of the data writing transistor T4 (such as the source S4) is electrically connected to the second electrode of driving transistor T3 (such as the source S3), that is, the node N2; a second electrode of the data writing transistor T4 (such as the drain D4) is electrically connected to the data line DL to receive a data signal, and a gate G4 of the data writing transistor T4 is electrically connected to the first scanning control signal line GL1 to receive a first scanning control signal. Under control of the first scanning control signal, the data signal is selectively written into the node N2.

A first electrode of the first light-emitting control transistor T5 (such as the source S5) is electrically connected to the first voltage signal line VDL to receive a first voltage signal ELVDD, a second electrode of the first light-emitting control transistor T5 (such as the drain D5) is electrically connected to the second electrode of the driving transistor T3 (such as the source S3), that is, the node N2, and a gate G5 of the first light-emitting control transistor T5 is electrically connected to the light-emitting control signal line EML to receive a light-emitting control signal EM.

A first electrode of the second light-emitting control transistor T6 (such as the source S6) is electrically connected to the first electrode of the driving transistor T3 (such as the drain D3), that is, the node N3, a second electrode of the second light-emitting control transistor T6 (such as the drain D6) is electrically connected to a first electrode of the light-emitting element OLED (such as the anode), that is, a node N4, and a gate G6 of the second light-emitting control transistor T6 is electrically connected to the light-emitting control signal line EML to receive the light-emitting control signal EM.

A first electrode of the first reset transistor T7 (such as the source S7) is electrically connected to the first initialization voltage signal line VIL1 to receive a first initialization voltage signal Vinit1, a second electrode of the first reset transistor T7 (such as the drain D7) is electrically connected to the first electrode of the light-emitting element OLED, that is, the node N4, and a gate G7 of the first reset transistor T7 is electrically connected to the first reset control signal line PRT1 to receive a first reset control signal.

One terminal of the storage capacitor Cst (hereinafter referred to as a first capacitor electrode) Cst1 is electrically connected to the gate G3 of the driving transistor T3 (that is the node N1), and the other terminal of the storage capacitor Cst (hereinafter referred to as a second capacitor electrode) Cst2 is electrically connected to the first voltage signal line VDL. The second electrode (such as the cathode) of the light-emitting element OLED is electrically connected to the second voltage signal line VSL to receive a second voltage signal ELVSS. Correspondingly, the light-emitting element OLED receives a driving current Id from the driving transistor T3 to emit light, thereby displaying images.

For example, the first voltage signal line VDL and the second voltage signal line VSL mentioned above may be signal lines for transmitting voltage signals ELVDD and ELVSS, respectively. They may be connected to a voltage source to output a constant voltage signal, such as a positive voltage signal and a negative voltage signal.

It should be noted that according to different semiconductor characteristics of transistors, the transistors may be divided into N-type transistors and P-type transistors. When the transistor is implemented as a switching transistor, the N-type switching transistor is controlled to be turned on by a high-level switching control signal and controlled to be turned off by a low-level switching control signal. The P-type switching transistor is controlled to be turned on by a low-level switching control signal and controlled to be turned off by a high-level switching control signal.

In the embodiments of the present disclosure, the pixel driving circuit may use an LTPO circuit, that is, low-temperature poly silicon (LTPS) technology and oxide (IGZO) are used to manufacture an LTPO circuit. Low temperature poly silicon thin film transistor (abbreviated as LTPS) is formed by depositing polycrystalline silicon to form an active layer. LTPS has high electron mobility, fast reaction speed and advantages such as high brightness, high resolution and low power consumption. Oxide thin-film transistor (abbreviated as oxide TFT), for example, taking oxide semiconductors as the active layer of TFT, such as indium gallium zinc oxide (abbreviated as IGZO), the oxide semiconductors have high electron mobility and good turn off characteristics. Compared with LTPS, oxide semiconductors have a simpler process and higher compatibility with amorphous silicon processes. Of course, the oxide thin-film transistors may also be other metal oxide semiconductors, such as indium zinc tin oxide (IZTO) or indium gallium zinc tin oxide (IGZTO). It is possible to effectively reduce the size of the transistor and prevent leakage current by using oxide thin film transistors, thereby allowing the pixel circuit to be suitable for low-frequency driving while increasing the resolution of the display substrate.

In some exemplary embodiments of the present disclosure, the exemplary 7TIC circuit includes 7 thin film transistors (T1-T8), where T1 and T2 are N-type thin film transistors NMOS using oxide thin film transistors; and the others are P-type thin film transistors PMOS using low-temperature poly silicon thin film transistors. Correspondingly, the reset control signal applied to the gate of the transistor T1 is referred to as NReset, the scanning control signal applied to the gate of the transistor T2 is referred to as NGate, the scanning control signal applied to the gate of the transistor T4 is referred to as PGate, and the reset control signal applied to the gate of the transistor T7 is referred to as Preset (that is RST2).

It should be noted that in the above description, nodes N1, N2, N3 and N4 do not represent actual components, but rather represent convergence points of the relevant circuit connections in the circuit diagram.

It should also be noted that in the embodiments of the present disclosure, an effective signal (level) refers to the signal (level) used to turn on the corresponding switching element, and an ineffective signal (level) refers to the signal (level) used to turn off the corresponding switching element. Similarly, this explanation is provided in other embodiments of the present disclosure. The effective level and the ineffective level only represent that the level of the signal has two state quantities, and do not represent that the effective level or the ineffective level in the entire text has a specific value.

Figure 3:
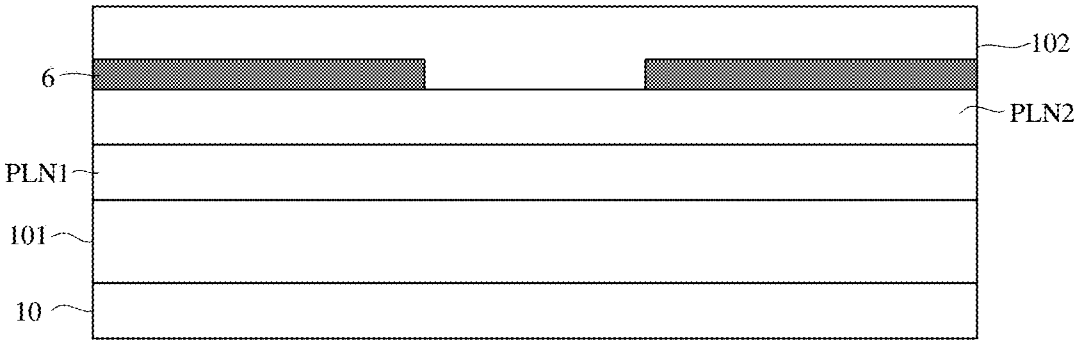
FIG. 3 is a cross-sectional view of a display substrate taken along line AA' in FIG. 1 according to some exemplary embodiments of the present disclosure.

FIG. 3 is a cross-sectional view of a display substrate taken along line AA' in FIG. 1 according to some exemplary embodiments of the present disclosure. With reference to FIG. 3, the display substrate may include: a base substrate 10; a driving circuit layer 101 disposed on the base substrate 10; a light-emitting element layer 102 disposed on a side of the driving circuit layer 101 away from the base substrate 10. For example, each element, component or pattern of the pixel driving circuit may be located in the driving circuit layer 101. Each element, component or pattern of the pixel driving circuit may include: an active layer, a gate, a source and a drain of each thin film transistor of the pixel driving circuit, and each signal line for providing a signal to the pixel driving circuit, etc. Each element, component or pattern of the light-emitting element may be located in the light-emitting elements layer 102, and each element, component or pattern of the light-emitting element may include a first electrode (such as the anode), a light-emitting layer and a second layer (such as the cathode), etc. of an organic light-emitting diode.

With continued reference to FIG. 3, the display substrate may also include a plurality of insulation layers located between the driving circuit layer 101 and the light-emitting element layer 102. For example, the plurality of insulation layers may include a first planarization layer PLN1 and a second planarization layer PLN2. For example, the second planarization layer PLN2 may be located on a side of the first planarization layer PLN1 away from the base substrate 10. The layer where the first electrode is located (that is the first electrode layer 6) may be located on a side of the second planarization layer PLN2 away from the base substrate 10, for example, the first electrode may be directly located on a surface of the second planarization layer PLN2 away from the base substrate 10.

Figure 4:
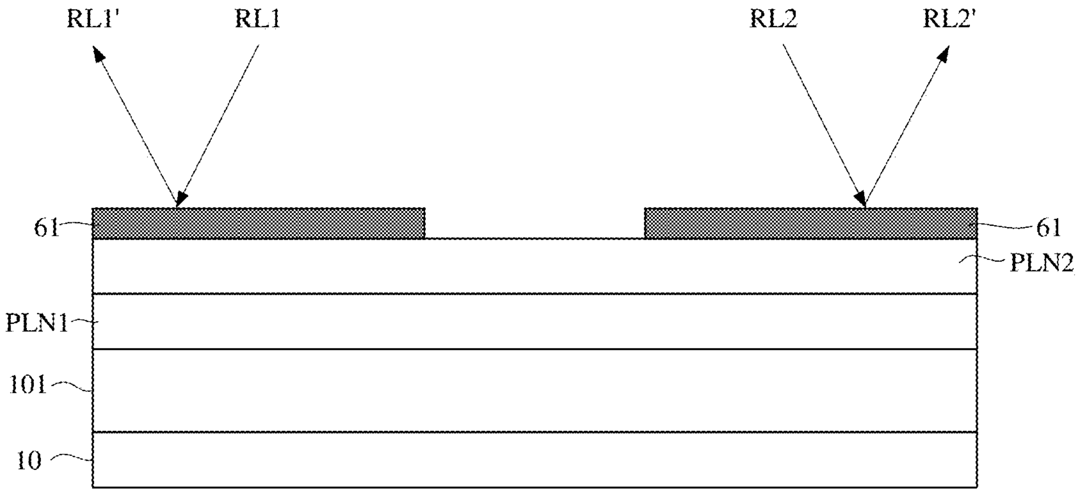
FIG. 4 schematically shows an optical path of light reflected by a first electrode in a display substrate.

FIG. 4 schematically shows an optical path of light reflected by a first electrode in a display substrate. OLED display typically uses a top emitting mode, that is, a first electrode (such as the anode) of the light-emitting element is a film layer with high reflectivity, and part of the light emitted by the light-emitting layer of the light-emitting element is directly emitted, while another part of the light is emitted after being reflected by the first electrode 61, as shown in FIG. 4. Theoretically, after the planarization of the first planarization layer PLN1 and the second planarization layer PLN2, a surface of the second planarization layer PLN2 away from the base substrate 10 (that is an upper surface in FIG. 4) has a higher planarity, as shown in FIG. 4, which is a basic horizontal plane. In this way, the first electrode formed on the surface of the second planarization layer PLN2 away from the base substrate 10 has a higher planarity. In this case, as shown in FIG. 4, reflected optical paths of the first electrodes of the light-emitting elements of two adjacent sub-pixels are substantially consistent. For example, for the left sub-pixel in FIG. 4, light RL1 is incident to a position of the first electrode 61, and after being reflected by the first electrode 61, the light RL1 becomes light RL1' to emit. For the right sub-pixel in FIG. 4, light RL2 is incident to a corresponding position of the first electrode 61, and after being reflected by the first electrode 61, the light RL2 becomes light RL2' to emit. Since the first electrodes have higher planarity, the reflected optical paths of the first electrodes of the light-emitting elements of the two adjacent sub-pixels are substantially consistent, and a symmetry of the two relative to a centerline between the two sub-pixels is relatively high. For example, the emitted lights RL1' and RL2' in FIG. 4 are substantially symmetrical. Therefore, there is almost no color deviation between adjacent sub-pixels, that is, the display effect of the display substrate is good and there is no color deviation problem.

Figure 5A:
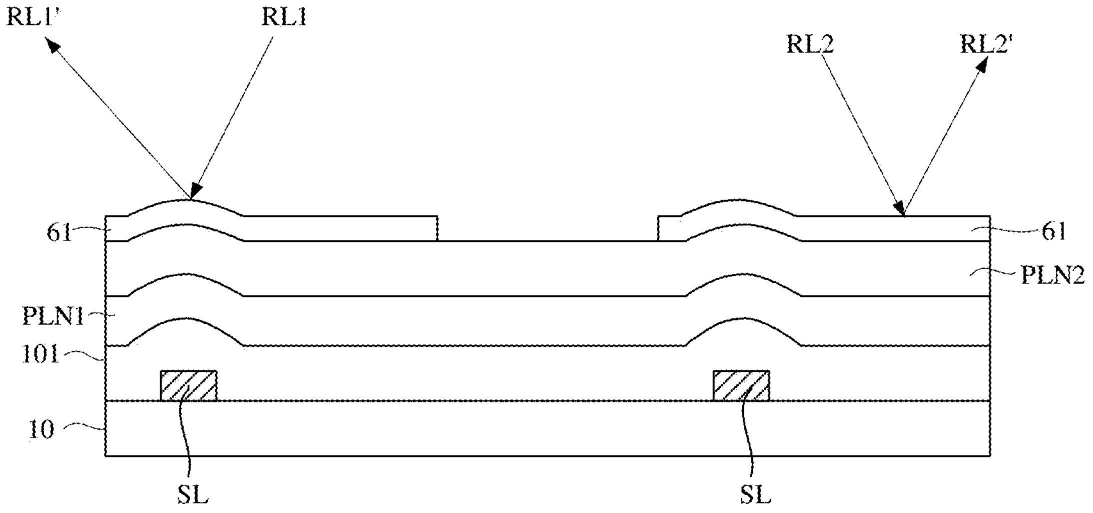
FIG. 5A schematically shows an optical path of light reflected by a first electrode in a display substrate, where the first electrode has a partial protrusion.
Figure 5B:
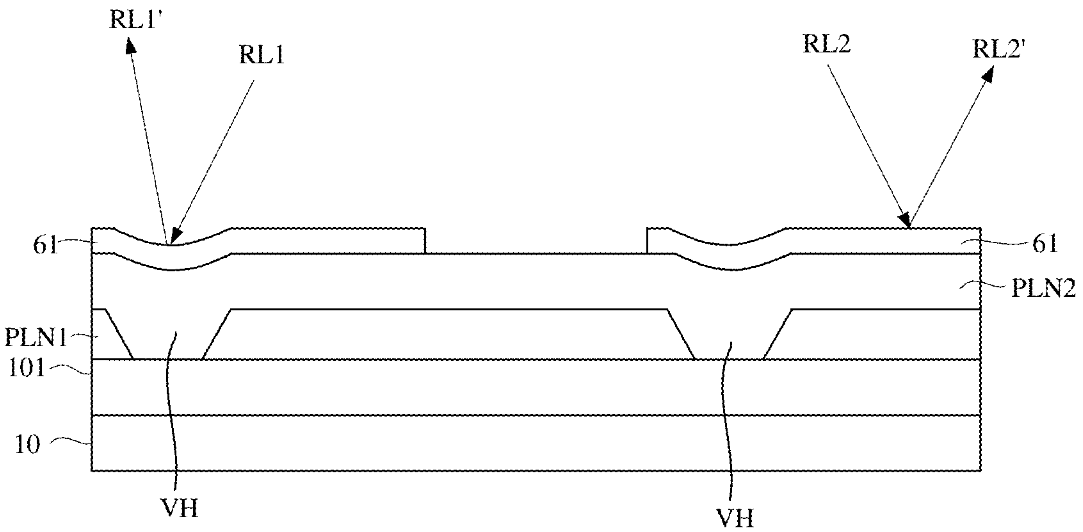
FIG. 5B schematically shows an optical path of light reflected by a first electrode in a display substrate, where the first electrode has a partial recess.

However, the inventor found through research that a plurality of elements, components, patterns, via holes or grooves which are located in the driving circuit layer 101 are provided below the first electrode of the light-emitting element. In manufacturing process of the display substrate, due to morphology preservation characteristics of the process, the plurality of elements, components, patterns, via holes or grooves which are located in the driving circuit layer 101 may affect the planarity of upper surfaces of the first planarization layer PLN1 and the second planarization layer PLN2, thereby affecting the planarity of the first electrode 61. For example, FIG. 5A schematically shows an optical path of light reflected by a first electrode in a display substrate, where the first electrode has a partial protrusion. FIG. 5B schematically shows an optical path of light reflected by a first electrode in a display substrate, where the first electrode has a partial recess.

With reference to FIG. 5A, at a first position, a signal line SL is provided below the first electrode of the light-emitting element. The signal line SL has a pattern with a certain thickness. Due to the presence of this signal line, the upper surface of the first planarization layer PLN1 and the upper surface of the second planarization layer PLN2 will be caused to be partially protruded at the first position, thereby causing the first electrode 61 to be partially protruded at the first position P1. In this case, as shown in FIG. 5A, reflected optical paths of the first electrodes of the light-emitting elements of two adjacent sub-pixels are inconsistent. For example, for the left sub-pixel in FIG. 5A, light RL1 is incident to a position of the first electrode 61, and after being reflected by the first electrode 61, the light RL1 becomes light RL1' to emit. For the right sub-pixel in FIG. 5A, light RL2 is incident to a corresponding position of the first electrode 61, and after being reflected by the first electrode 61, the light RL2 becomes light RL2' to emit. Due to the partial protrusions of the first electrodes, the reflected optical paths of the first electrodes of the light-emitting elements of two adjacent sub-pixels are inconsistent, and the two are asymmetrical relative to a centerline between the two sub-pixels. For example, the emitted light RL1' and RL2' in FIG. 5A are asymmetrical. Therefore, there is color deviation between adjacent sub-pixels.

For another example, with reference to FIG. 5B, at a second position, a via hole or a groove VH is provided below the first electrode of the light-emitting element. The pattern of the via hole or the groove is a pattern that material with a certain thickness is removed. Due to the presence of the via hole or the groove, the upper surface of the first planarization layer PLN1 and the upper surface of the second planarization layer PLN2 will be caused to be partially recessed at the second position, thereby causing the first electrode 61 to be partially recessed at the second position. In this case, as shown in FIG. 5B, the reflected optical paths of the first electrodes of the light-emitting elements of the two adjacent sub-pixels are inconsistent. For example, for the left sub-pixel in FIG. 5B, light RL1 is incident to a position of the first electrode 61, and after being reflected by the first electrode 61, the light RL1 becomes light RL1' to emit. For the right sub-pixel in FIG. 5B, light RL2 is incident to a corresponding position of the first electrode 61, and after being reflected by the first electrode 61, the light RL2 becomes light RL2' to emit. Due to the partial recesses of the first electrodes, the reflected optical paths of the first electrodes of the light-emitting elements of two adjacent sub-pixels are inconsistent, and the two are asymmetrical relative to a centerline between the two sub-pixels. For example, the emitted light RL1' and RL2' in FIG. 5B are asymmetrical. Therefore, there is color deviation between adjacent sub-pixels.

For the above-mentioned case, in the embodiments of the present disclosure, positions of the plurality of elements, components, patterns, via holes or grooves which are located in the driving circuit layer 101 below the first electrode of the light-emitting element are designed. For example, for two adjacent sub-pixels of the same color located in a same row, the plurality of elements, components, patterns, via holes or grooves which are located in the driving circuit layer 101 below the first electrodes of the light-emitting elements are respectively disposed on opposite sides of the first electrodes or pixel openings of the corresponding sub-pixels, so that the first electrodes of the light-emitting elements of adjacent sub-pixels may still be substantially symmetrical relative to a centerline between the two sub-pixels. In this way, the reflected optical paths of the first electrodes of the light-emitting elements of two adjacent sub-pixels may still maintain to be substantially consistent, and the symmetry of the two relative to a centerline between the two sub-pixels is relatively high. Therefore, there is almost no color deviation between adjacent sub-pixels, that is, the display effect of the display substrate is good and there is no color deviation problem.

Figure 6:
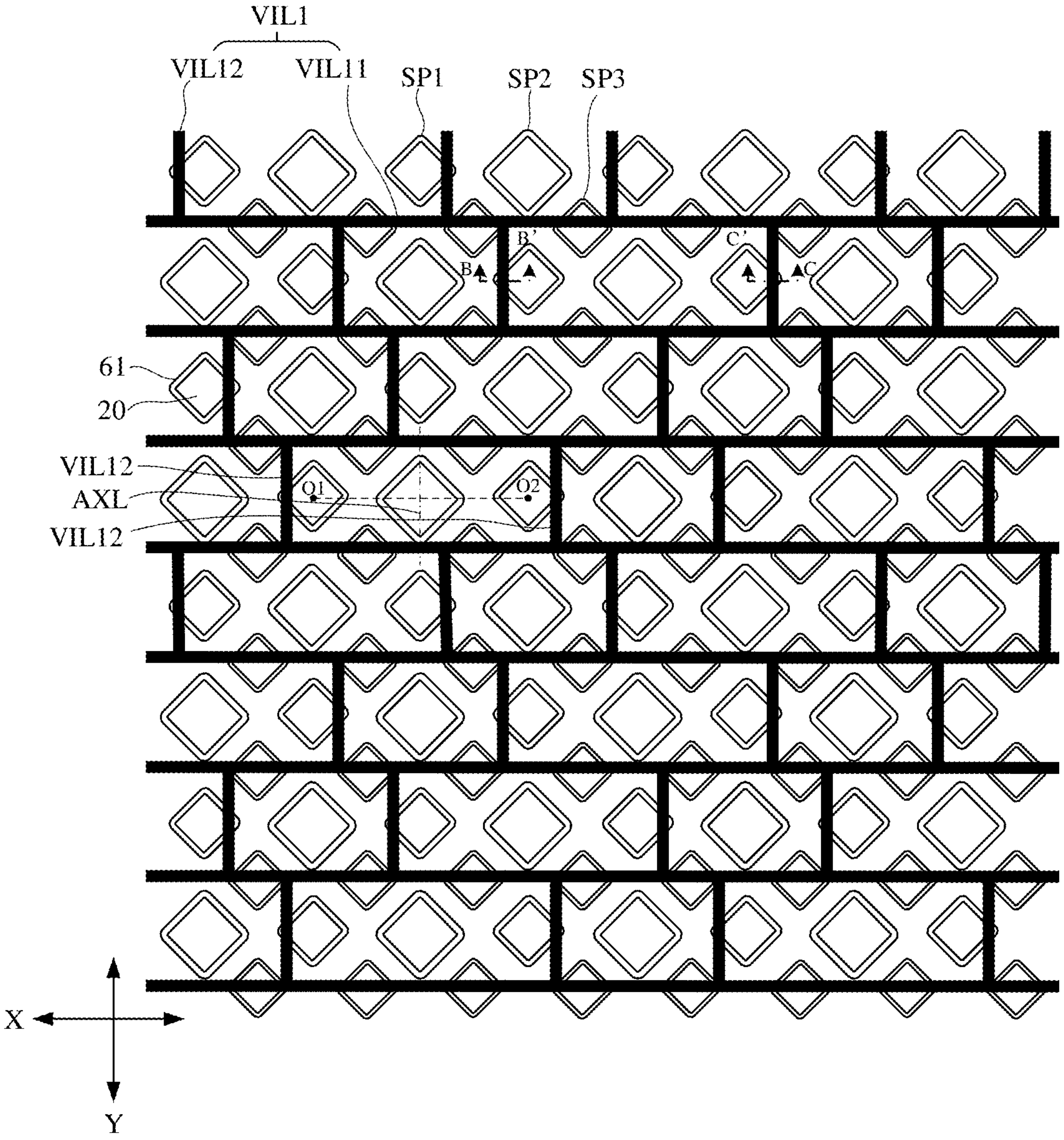
FIG. 6 is a partial plan view of a display substrate according to some exemplary embodiments of the present disclosure, which schematically shows a first electrode and a signal line located below the first electrode.
Figure 7:
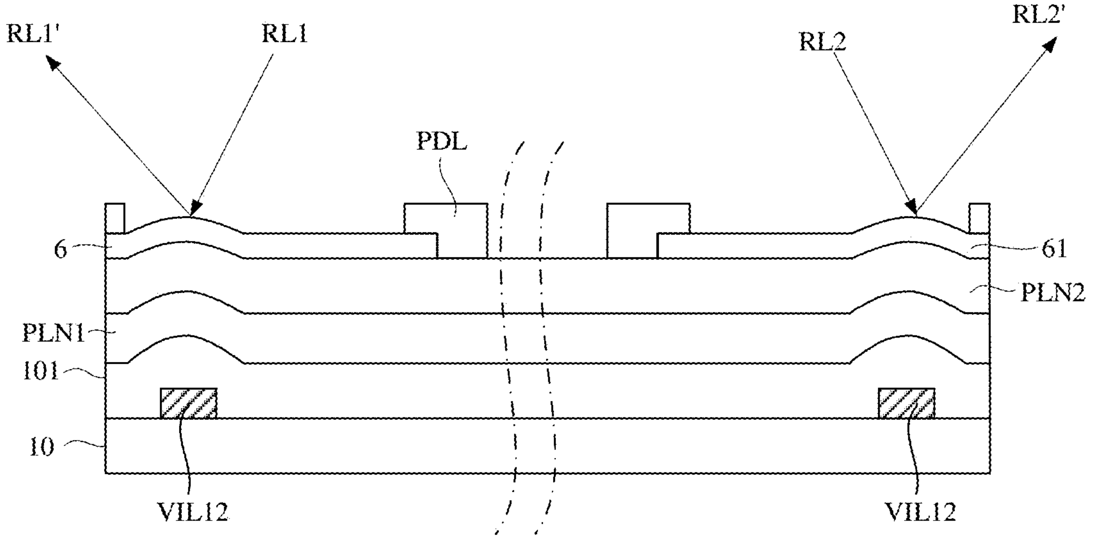
FIG. 7 is a cross-sectional view taken along line BB' and line CC' in FIG. 6, which schematically shows an optical path of light reflected by the first electrode in the display substrate shown in FIG. 6.

FIG. 6 is a partial plan view of a display substrate according to some exemplary embodiments of the present disclosure, which schematically shows a first electrode and a signal line located below the first electrode. FIG. 7 is a cross-sectional view taken along line BB' and CC' in FIG. 6, which schematically shows an optical path of light reflected by the first electrode in the display substrate shown in FIG. 6. With reference to FIG. 6 and FIG. 7, the display substrate may include: a base substrate 10; a plurality of sub-pixels SP1, SP2 and SP3 arranged in an array along a first direction X and a second direction Y on the base substrate 10, so as to form a plurality of rows of sub-pixels and a plurality of columns of sub-pixels, respectively; a first initialization voltage signal line VIL1 disposed on the base substrate 10, where the first initialization voltage signal line VIL1 is used to transmit a first initialization voltage signal Vinit1; a first electrode layer 6 disposed on the base substrate 10, where the light-emitting element of at least one sub-pixel includes a first electrode 61 located on the first electrode layer 6; and a pixel defining layer PDL disposed on the base substrate 10, where at least one sub-pixel includes a pixel opening 20 located on the pixel defining layer PDL, and an orthographic projection of the pixel opening 20 of at least one sub-pixel on the base substrate 10 falls into an orthographic projection of the first electrode 61 of the at least one sub-pixel on the base substrate 10.

For example, the display substrate may include a plurality of pixel units arranged in an array on the base substrate 10. Each pixel unit may include a plurality of sub-pixels. For example, the plurality of sub-pixels may include a first sub-pixel SP1, a second sub-pixel SP2 and a third sub-pixel SP3. In the embodiment shown in FIG. 6, a pixel unit may include four sub-pixels. For example, a pixel unit may be arranged in an RGBG manner. For example, the first sub-pixel SP1 may be a red sub-pixel, the second sub-pixel SP2 may be a blue sub-pixel, the third sub-pixel SP3 may be a green sub-pixel. A pixel unit may include one first sub-pixel SP1, one second sub-pixel SP2 and two third sub-pixels SP3. It should be noted that the embodiments of the present disclosure are not limited to the pixel arrangement shown in FIG. 6. The arrangement of sub-pixels in pixel units may refer to conventional pixel arrangements, such as GGRB, RGB and other arrangements. The embodiments of the present disclosure do not impose special limitations on this.

It should also be noted that in the embodiment shown in FIG. 6, the pixel opening 20 has a rounded rectangular shape. In the embodiment of the present disclosure, the pixel opening is not limited to this shape and any appropriate shape may be chosen, such as a circle, an ellipse, a rhomb, a quadrangle, a pentagon, a hexagon, an octagon, etc.

In the embodiments of the present disclosure, the first initialization voltage signal line VIL1 includes a first initialization voltage signal sub-line VIL11 and a second initialization voltage signal sub-line VIL12. A main body of the first initialization voltage signal sub-line VIL11 extends in the first direction X, and a main body of the second initialization voltage signal sub-line VIL12 extends in the second direction Y.

It should be noted that in this text, the "main body of the first initialization voltage signal sub-line" may indicate a portion with 50% or more of a total length of the first initialization voltage signal sub-line. Correspondingly, the "main body of the second initialization voltage signal sub-line" may indicate a portion with 50% or more of a total length of the second initialization voltage signal sub-line.

For example, as shown in FIG. 6, the first initialization voltage signal line VIL1 may include a plurality of first initialization voltage signal sub-lines VIL11 and a plurality of second initialization voltage signal sub-lines VIL12. The plurality of first initialization voltage signal sub-lines VIL11 intersect with the plurality of second initialization voltage signal sub-lines VIL12, and the plurality of first initialization voltage signal sub-lines are connected to the plurality of second initialization voltage signal sub-lines, so that the first initialization voltage signal line VIL1 forms a mesh structure.

With reference to FIG. 6, orthographic projections of the plurality of second initialization voltage signal sub-lines VIL12 on the base substrate 10 partially overlap with orthographic projections of the first electrodes 61 of the plurality of first sub-pixels SP1 on the base substrate 10, respectively. For example, the orthographic projections of the plurality of second initialization voltage signal sub-lines VIL12 on the base substrate 10 are line segments that extend substantially in the second direction Y. The line segment passes through an edge of the orthographic projection of the first electrode 61 of at least one first sub-pixel SP1 on the base substrate 10.

The first electrodes 61 of the plurality of first sub-pixels SP1 have respective first sides and respective second sides in the first direction X, respectively. For example, the first side may be one of the left and right sides, and the second side may be the other one of the left and right sides. That is to say, the first side and the second side may be opposite sides of the first electrode 61 in the first direction X. Correspondingly, the pixel openings 20 of the plurality of first sub-pixels SP1 have respective first sides and respective second sides in the first direction X, respectively. For example, the first side may be one of the left and right sides, and the second side may be the other one of the left and right sides. That is to say, the first side and the second side may be opposite sides of the pixel opening 20 in the first direction X.

With reference to FIG. 6, for any two adjacent first sub-pixels SP1 located in the same row, the orthographic projection of one second initialization voltage signal sub-line VIL12 on the base substrate 10 passes through an edge of the first side of the orthographic projection of the first electrode 61 of one first sub-pixel among the two first sub-pixels SP1 on the base substrate 10, and the orthographic projection of another second initialization voltage signal sub-line VIL12 on the base substrate 10 passes through an edge of the second side of the orthographic projection of the first electrode 61 of the other first sub-pixel among the two first sub-pixels SP1 on the base substrate 10.

With continued reference to FIG. 6, for any two adjacent first sub-pixels SP1 located in the same row, the orthographic projection of the second initialization voltage signal sub-line VIL12 on the base substrate 10 is located on the first side of the orthographic projection of the pixel opening 20 of one first sub-pixel among the two first sub-pixels SP1 on the base substrate 10, and the orthographic projection of another second initialization voltage signal sub-line VIL12 on the base substrate 10 is located on the second side of the orthographic projection of the pixel opening 20 of the other first sub-pixel among the two first sub-pixel SP1 on the base substrate 10.

For example, in the embodiment shown in FIG. 6, for the first and second first sub-pixels SP1 located from the left side of a second row, the orthographic projection of one second initialization voltage signal sub-line VIL12 on the base substrate 10 is located on the right side of the orthographic projection of the pixel opening 20 of the first first sub-pixel SP1 on the base substrate 10, and the orthographic projection of another second initialization voltage signal sub-line VIL12 on the base substrate 10 is located on the left side of the orthographic projection of the pixel opening 20 of the second first sub-pixel SP1 on the base substrate 10. For the second and third first sub-pixels SP1 located from the left side of the second row, the orthographic projection of one second initialization voltage signal sub-line VIL12 on the base substrate 10 is located on the left side of the orthographic projection of the pixel opening 20 of the second first sub-pixel SP1 on the base substrate 10, and the orthographic projection of another second initialization voltage signal sub-line VIL12 on the base substrate 10 is located to the right side of the orthographic projection of the pixel opening 20 of the third first sub-pixel SP1 on the base substrate 10.

With reference to FIG. 6 and FIG. 7, in the embodiment of the present disclosure, for any two adjacent first sub-pixels located in the same row, the second initialization voltage signal sub-lines VIL12 provided below the first electrodes 61 of the light-emitting elements are respectively disposed on opposite sides of the first electrodes 61 or pixel openings 20 of the corresponding sub-pixels, so that the first electrodes 61 of the light-emitting elements of adjacent sub-pixels in the row direction may still be substantially symmetrical relative to the centerline AXL between the two sub-pixels. In this way, the reflected optical paths of the first electrodes 61 of the light-emitting elements of the two adjacent sub-pixels in the row direction may still maintain to be consistent, and the symmetry of the two relative to the centerline AXL between the two sub-pixels is relatively high. Therefore, there is almost no color deviation between adjacent sub-pixels in the row direction, that is, the display effect of the display substrate is good and there is no color deviation problem.

Furthermore, in the embodiments of the present disclosure, for any two adjacent first sub-pixels SP1 located in the same row, orthographic projections of the two second initialization voltage signal sub-lines VIL12 partially overlapping with the first electrodes 61 of the two first sub-pixels on the base substrate 10 are symmetrical relative to a first symmetry axis AX1. The first symmetry axis AX1 passes through a center point of a line connecting the centers of the pixel openings 20 of the two first sub-pixels (such as center O1 and center O2 in FIG. 6) and extends in the second direction Y.

In this text, unless otherwise specified, the expression "center of the pixel opening" represents the geometric center or centroid of the orthographic projection of the pixel opening on the base substrate. For example, in a case of a pixel opening being in a shape of rectangle or rounded rectangle, the center of the pixel opening is an intersection of two diagonals of the rectangle. In a case of the pixel opening being in a shape of circle, the center of the pixel opening is the center of the circle. In a case of the pixel opening being in a shape of ellipse, the center of the pixel opening is the center of the ellipse, that is, an intersection point of major and minor axes of the ellipse.

Through symmetrically designing the second initialization voltage signal sub-lines VIL12, the symmetry of the reflected optical paths of the first electrodes 61 of the light-emitting elements of the two adjacent sub-pixels in the row direction may be further improved, thereby further improving and even eliminating the color deviation problem between adjacent sub-pixels in the row direction, and enhancing the display effect.

With continued reference to FIG. 6, for any two adjacent first sub-pixels SP1 located in a same column, the orthographic projection of one second initialization voltage signal sub-line VIL12 on the base substrate 10 passes through the edge of the first side of the orthographic projection of the first electrode 61 of one first sub-pixel SP1 among the two first sub-pixels SP1 on the base substrate 10, and the orthographic projection of another second initialization voltage signal sub-line VIL12 on the base substrate 10 passes through the edge of the second side of the orthographic projection of the first electrode 61 of the other one of the two first sub-pixels SP1 on the base substrate 10.

For any two adjacent first sub-pixels SP1 located in the same column, the orthographic projection of one second initialization voltage signal sub-line VIL12 on the base substrate 10 is located on the first side of the orthographic projection of the pixel opening 20 of one first sub-pixel among the two first sub-pixels SP1 on the base substrate 10, and the orthographic projection of another second initialization voltage signal sub-line VIL12 on the base substrate 10 is located on the second side of the orthographic projection of the pixel opening 20 of the other one of the two first sub-pixels SP1 on the base substrate 10.

For example, in the embodiment shown in FIG. 6, for the first and second first sub-pixels SP1 located from an upper side of the second column, the orthographic projection of one second initialization voltage signal sub-line VIL12 on the base substrate 10 is located to the right side of the orthographic projection of the pixel opening 20 of the first first sub-pixel SP1 on the base substrate 10, and the orthographic projection of another second initialization voltage signal sub-line VIL12 on the base substrate 10 is located on the left side of the orthographic projection of the pixel opening 20 of the second first sub-pixel SP1 on the base substrate 10. For the second and third first sub-pixels SP1 located from the upper side of the second column, the orthographic projection of one second initialization voltage signal sub-line VIL12 on the base substrate 10 is located to the left side of the orthographic projection of the pixel opening 20 of the second first sub-pixel SP1 on the base substrate 10, and the orthographic projection of another second initialization voltage signal sub-line VIL12 on the base substrate 10 is located on the right side of the orthographic projection of the pixel opening 20 of the third first sub-pixel SP1 on the base substrate 10.

In the embodiments of the present disclosure, for any two adjacent first sub-pixels located in the same column, the second initialization voltage signal sub-lines VIL12 provided below the first electrodes 61 of the light-emitting elements are respectively disposed on opposite sides of the first electrodes 61 or pixel openings 20 of the corresponding sub-pixels. Therefore, there is almost no color deviation between adjacent sub-pixels in the column direction, that is, the display effect of the display substrate is good and there is no color deviation problem.

Figure 8:
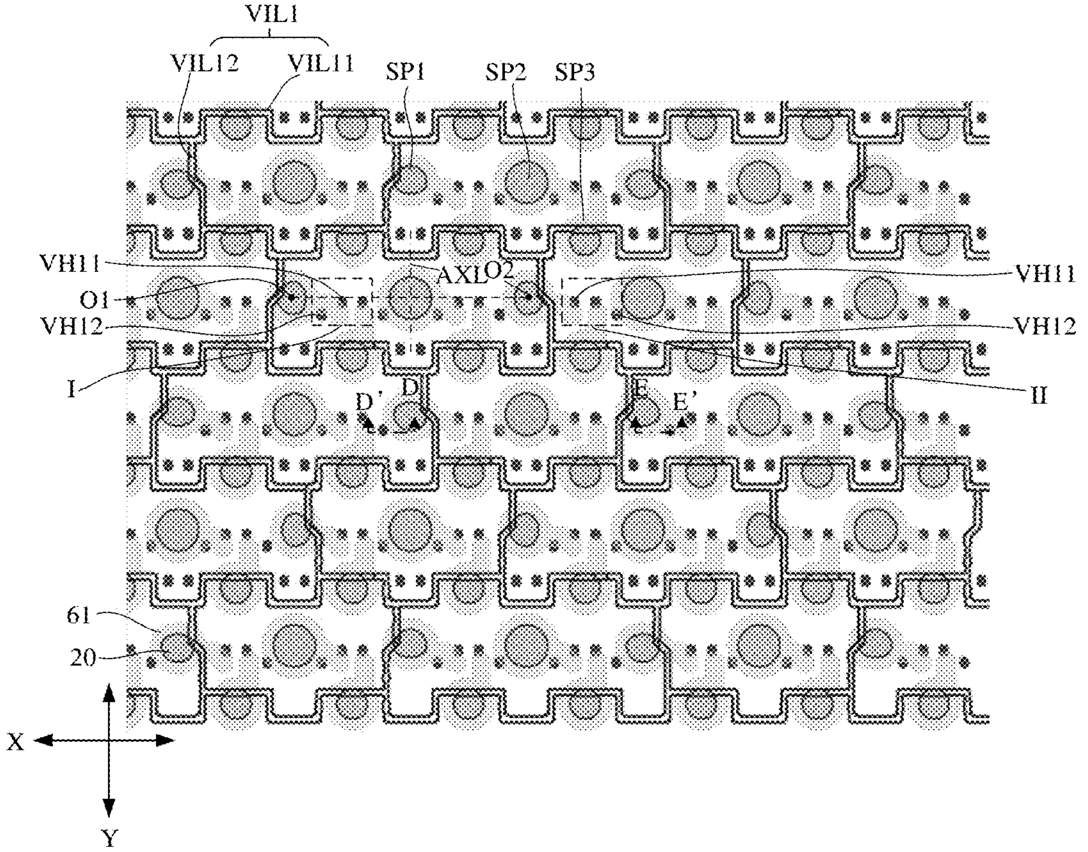
FIG. 8 is a partial plan view of a display substrate according to some exemplary embodiments of the present disclosure, which schematically shows a first electrode, a signal line located below the first electrode and a via hole located in a planarization layer.
Figure 9:
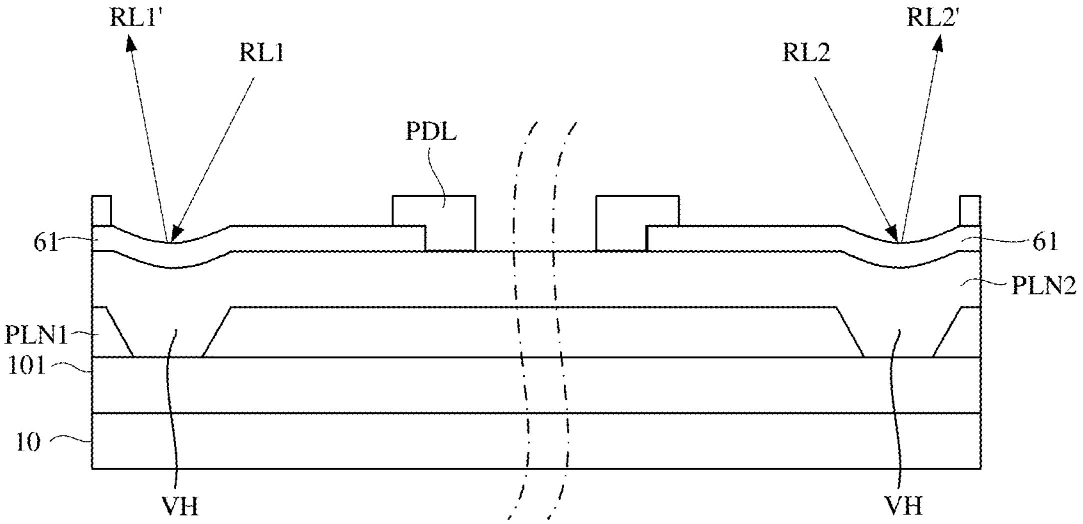
FIG. 9 is a cross-sectional view taken along line DD' and line EE' in FIG. 8, which schematically shows an optical path of light reflected by the first electrode in the display substrate shown in FIG. 8.

FIG. 8 is a partial plan view of a display substrate according to some exemplary embodiments of the present disclosure, which schematically shows a first electrode, a signal line located below the first electrode and a via hole located in a planarization layer. FIG. 9 is a cross-sectional view taken along line DD' and line EE' in FIG. 8, which schematically shows an optical path of light reflected by the first electrode in the display substrate shown in FIG. 8. It should be noted that in the following text, the differences between the embodiment shown in FIG. 8 and the aforementioned embodiments will be mainly described. For the similarities, reference may be made to the previous description, which will not be repeated in the following text. It should be understood that, in a case without conflict, the various embodiments of the present disclosure may be combined arbitrarily.

With reference to FIG. 8 and FIG. 9, the display substrate may also include: a first insulation layer disposed between the base substrate 10 and the layer where the first electrode 61 is located (i.e., the first electrode layer 6). For example, the first insulation layer may include at least one planarization layer, such as the planarization layer PLN1. The display substrate may also include a plurality of via holes located in the first insulation layer. The plurality of via holes may be located in at least one planarization layer, for example, the plurality of via holes may penetrate through at least one planarization layer. For example, the plurality of via holes may include at least one first via hole VH11 and at least one second via hole VH12.

With continued reference to FIG. 8, for any two adjacent first sub-pixels SP1 located in the same row, orthographic projections of some via holes among the plurality of via holes on the base substrate 10 are located on the first side of the orthographic projection of the pixel opening 20 of one sub-pixel among the two first sub-pixels SP1 on the base substrate 10, and orthographic projections of some other via holes of the plurality of via holes on the base substrate 10 are located on the second side of the orthographic projection of the pixel opening 20 of the other one of the two first sub-pixels SP1 on the base substrate 10.

In the embodiment of the present disclosure, the number of some via holes of the plurality of via holes located on the first side of the pixel opening 20 of one first sub-pixel may be the same as the number of some other via holes of the plurality of via holes located on the second side of the pixel opening 20 of the other first sub-pixel. For example, in the embodiment shown in FIG. 8, for any two adjacent first sub-pixels SP1 located in the same row, orthographic projections of three via holes (such as two first via holes VH11 and one second via hole VH12) located in the first insulation layer IL1 on the base substrate 10 are located on the first side of the orthographic projection of the pixel opening 20 of one first sub-pixel among the two first sub-pixels SP1 on the base substrate 10, and orthographic projections of another three via holes (such as two first via holes VH11 and one second via hole VH12) located in the first insulation layer IL1 on the base substrate 10 are located on the second side of the orthographic projection of the pixel opening 20 of the other first sub-pixel among the two sub-pixels SP1 on the base substrate 10.

For example, in the embodiment shown in FIG. 8, for the first and second first sub-pixels SP1 located from the left side of the second row, an orthographic projection of one second via hole VH12 and orthographic projections of two first via holes VH11 (three via holes outlined by dashed box I) on the base substrate 10 are located on the right side of the orthographic projection of the pixel opening 20 of the first first sub-pixel SP1 on the base substrate 10, and the orthographic projections of two first via holes VH11 and the orthographic projection of one second via hole VH12 (three via holes outlined by dashed box II) on the base substrate 10 are located on the left side of the orthographic projection of the pixel opening 20 of the second first sub-pixel SP1 on the base substrate 10.

With reference to FIG. 8 and FIG. 9, in the embodiment of the present disclosure, for any two adjacent first sub-pixels located in the same row, the via holes located in the first insulation layer below the first electrodes 61 of the light-emitting elements are respectively disposed on opposite sides of the first electrodes 61 or pixel openings 20 of the corresponding sub-pixels, so that the first electrodes 61 of the light-emitting elements of the adjacent sub-pixels in the row direction may still be substantially symmetrical relative to the centerline AXL between the two sub-pixels. In this way, the reflected optical paths of the first electrodes 61 of the light-emitting elements of the two adjacent sub-pixels in the row direction may still maintain to be substantially consistent, and the symmetry of the two relative to the centerline AXL between the two sub-pixels is relatively high. Therefore, there is almost no color deviation between adjacent sub-pixels in the row direction, that is, the display effect of the display substrate is good and there is no color deviation problem.

Furthermore, in the embodiment of the present disclosure, for any two adjacent first sub-pixels SP1 located in the same row, the orthographic projections of some via holes (such as the one second via hole VH12 and two first via holes VH11 shown in FIG. 8) on the base substrate 10 and the orthographic projections of the other via holes (such as the two first via holes VH11 and one second via hole VH12 shown in FIG. 8) on the base substrate 10 are symmetrical relative to the first symmetry axis AX1. The first symmetry axis AX1 passes through the center point of the line connecting the centers of the pixel openings 20 of the two first sub-pixels and extends in the second direction Y.

Through symmetrically designing the via holes located in the planarization layer below the first electrode, the symmetry of the reflected optical paths of the first electrodes 61 of the light-emitting elements of the two adjacent sub-pixels in the row direction may be further improved, thereby further improving or even eliminating the color deviation problem between adjacent sub-pixels in the row direction, and enhancing the display effect.

In the embodiment of the present disclosure, in various rows of first sub-pixels SP1, positions of the second initialization voltage signal sub-line VIL12 relative to the pixel opening periodically change. For example, with reference to FIG. 6 and FIG. 8, the positions of the second initialization voltage signal sub-line VIL12 relative to the pixel opening change periodically by taking four rows of first sub-pixels as a period. Specifically, the position of the second initialization voltage signal sub-line VIL12 partially overlapping with the first electrode 61 of the first sub-pixel in an $i^{th}$ row and a $j^{th}$ column and a position of the second initialization voltage signal sub-line VIL12 partially overlapping with the first electrode 61 of the first sub-pixel in an $(i+4)^{th}$ row and the $j^{th}$ column are aligned in the second direction Y, where i is a positive integer greater than or equal to 1, and j is a positive integer greater than or equal to 1. For example, as shown in FIG. 6, positions of the second initialization voltage signal sub-lines VIL12 partially overlapping with the first electrodes 61 of the first sub-pixels SP1 in the first row are respectively aligned with positions of the second initialization voltage signal sub-lines VIL12 partially overlapping with the first electrodes 61 of the first sub-pixels SP1 in the fifth row in the second direction Y.

Figure 10:
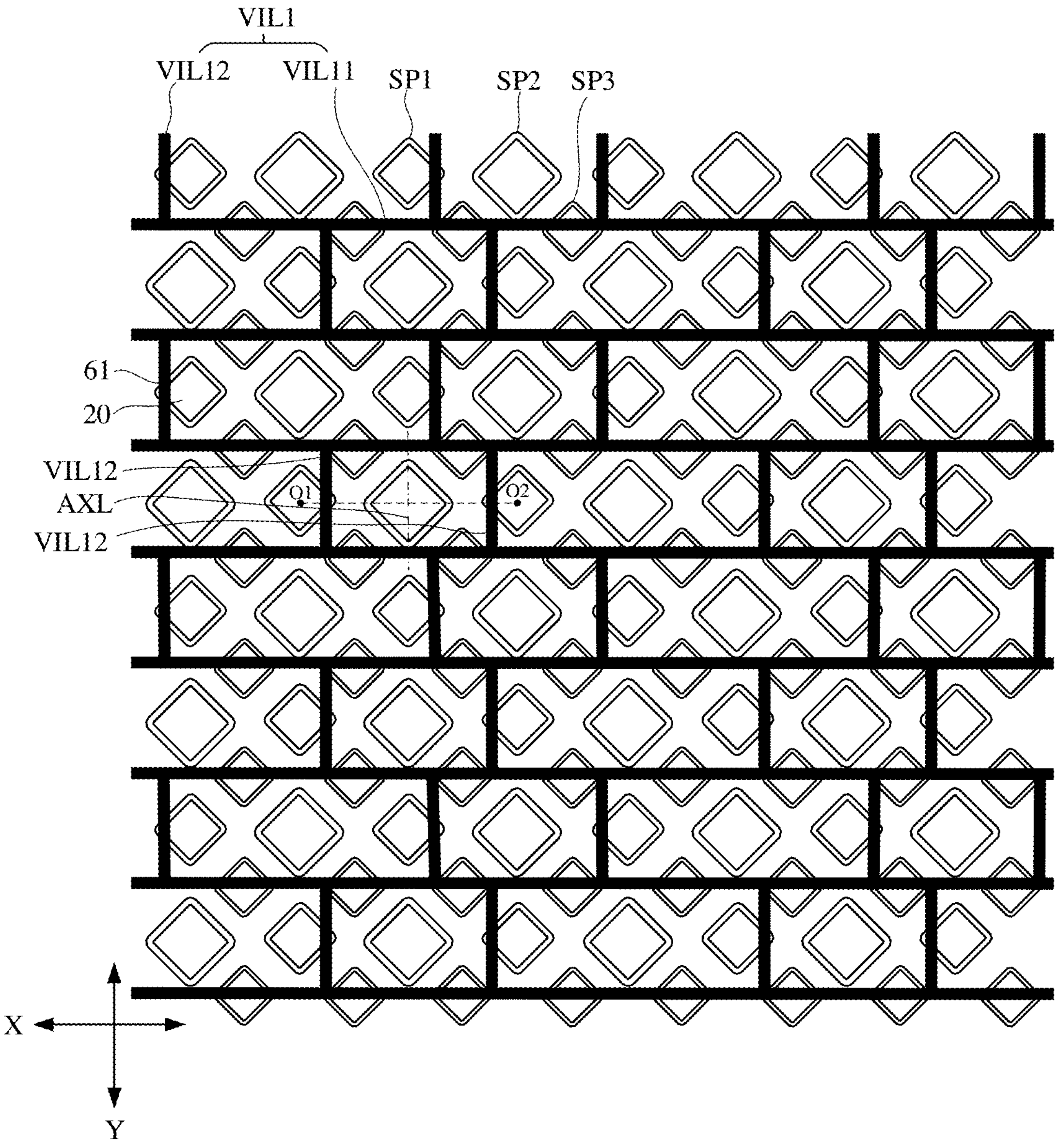
FIG. 10 is a partial plan view of a display substrate according to some other exemplary embodiments of the present disclosure, which schematically shows a first electrode and a signal line located below the first electrode.

FIG. 10 is a partial plan view of a display substrate according to some other exemplary embodiments of the present disclosure, which schematically shows a first electrode and a signal line located below the first electrode. With reference to FIG. 10, the positions of the second initialization voltage signal sub-line VIL12 relative to the pixel opening change periodically by taking two rows of first sub-pixels as a period. Specifically, the position of the second initialization voltage signal sub-line VIL12 partially overlapping with the first electrode 61 of the first sub-pixel in the $i^{th}$ row and the $j^{th}$ column and the position of the second initialization voltage signal sub-line VIL12 partially overlapping with the first electrode 61 of the first sub-pixel in an $(i+2)^{th}$ row and the $j^{th}$ column are aligned in the second direction Y, where i is a positive integer greater than or equal to 1, and j is a positive integer greater than or equal to 1. For example, as shown in FIG. 10, the positions of the second initialization voltage signal sub-lines VIL12 partially overlapping with the first electrodes 61 of the first sub-pixels SP1 in the first row are respectively aligned with the positions of the second initialization voltage signal sub-lines VIL12 partially overlapping with the first electrodes 61 of the first sub-pixels SP1 in the third row in the second direction Y.

In the embodiment of the present disclosure, a relative position of the second initialization voltage signal sub-line VIL12 relative to the first electrode of the sub-pixel periodically changes in the second direction Y, which is beneficial to further improving the symmetry of the first electrode 61 of the light-emitting element of the sub-pixel, while beneficial to reducing manufacturing difficulty of the second initialization voltage signal sub-line.

Figure 11:
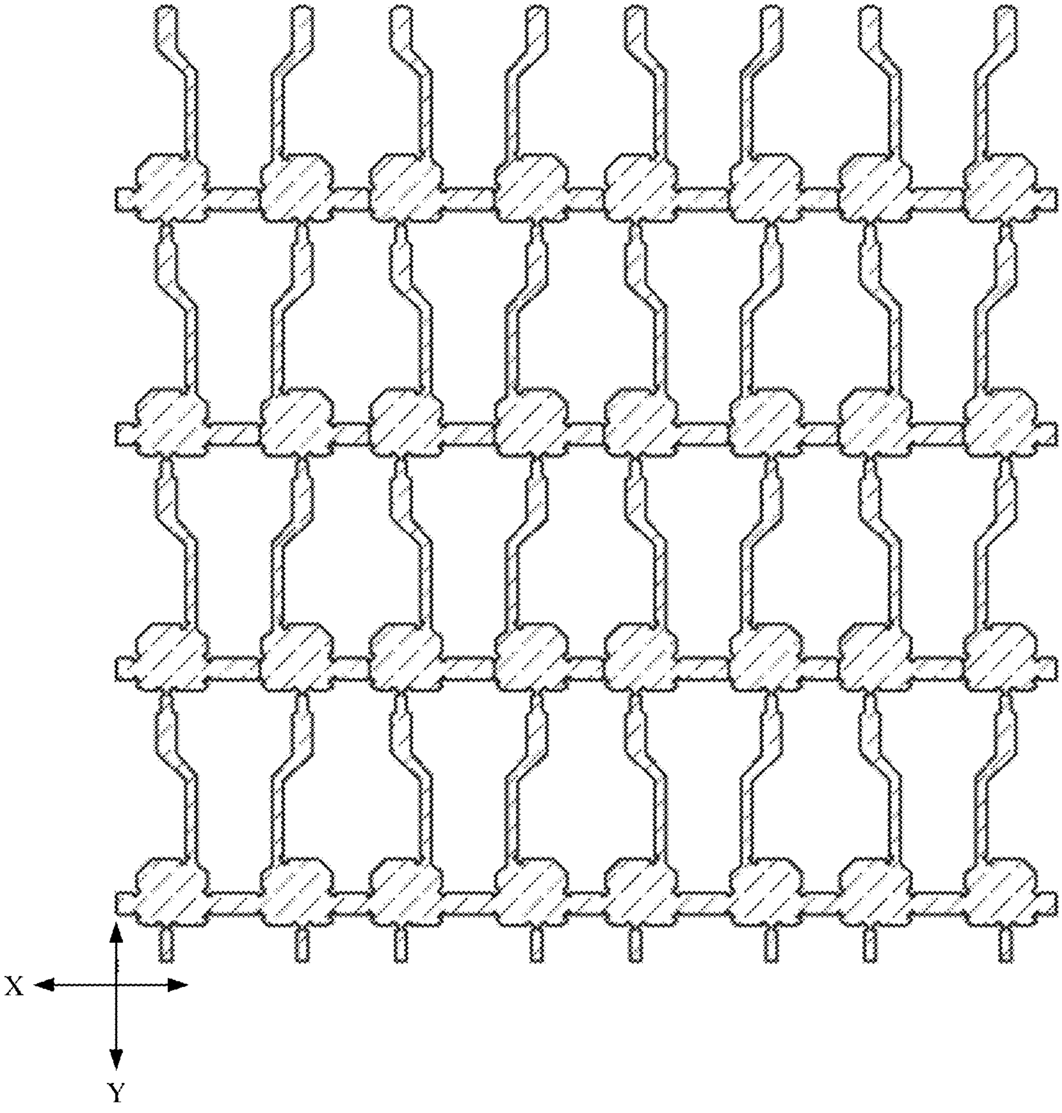
FIG. 11 to FIG. 27 are partial plan views of a display substrate according to some exemplary embodiments of the present disclosure.
Figure 12:
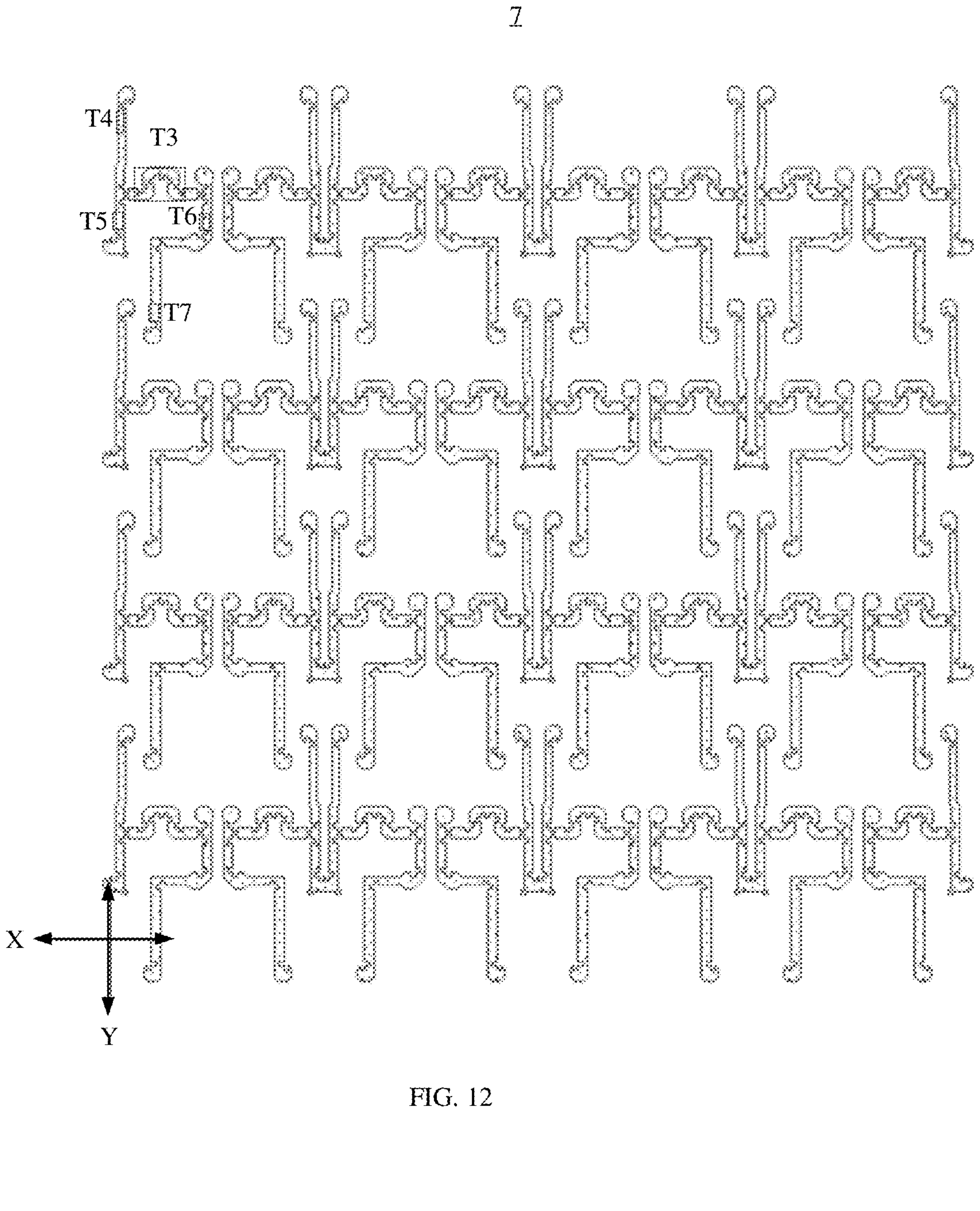
Figure 13:
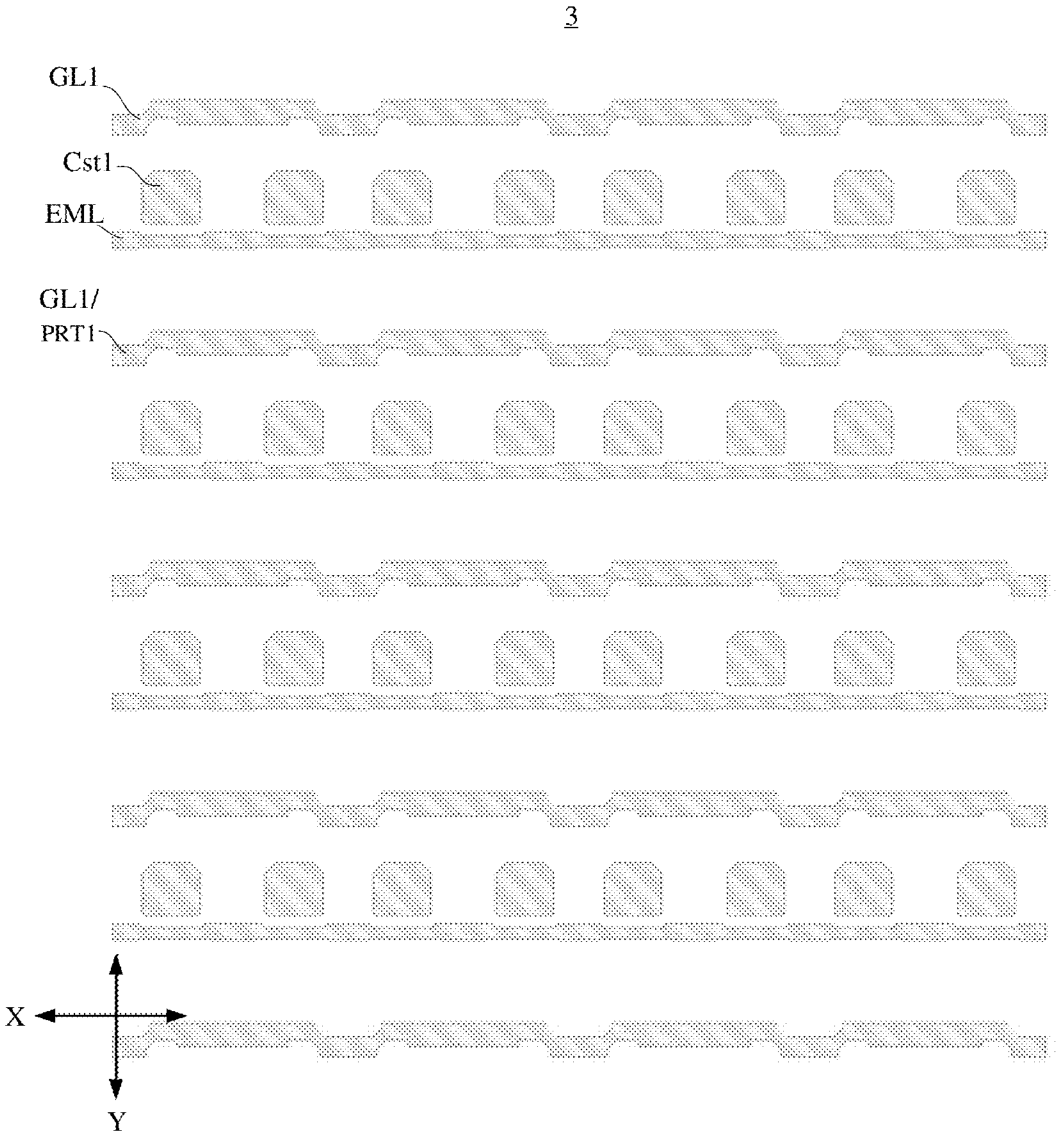
Figure 14:
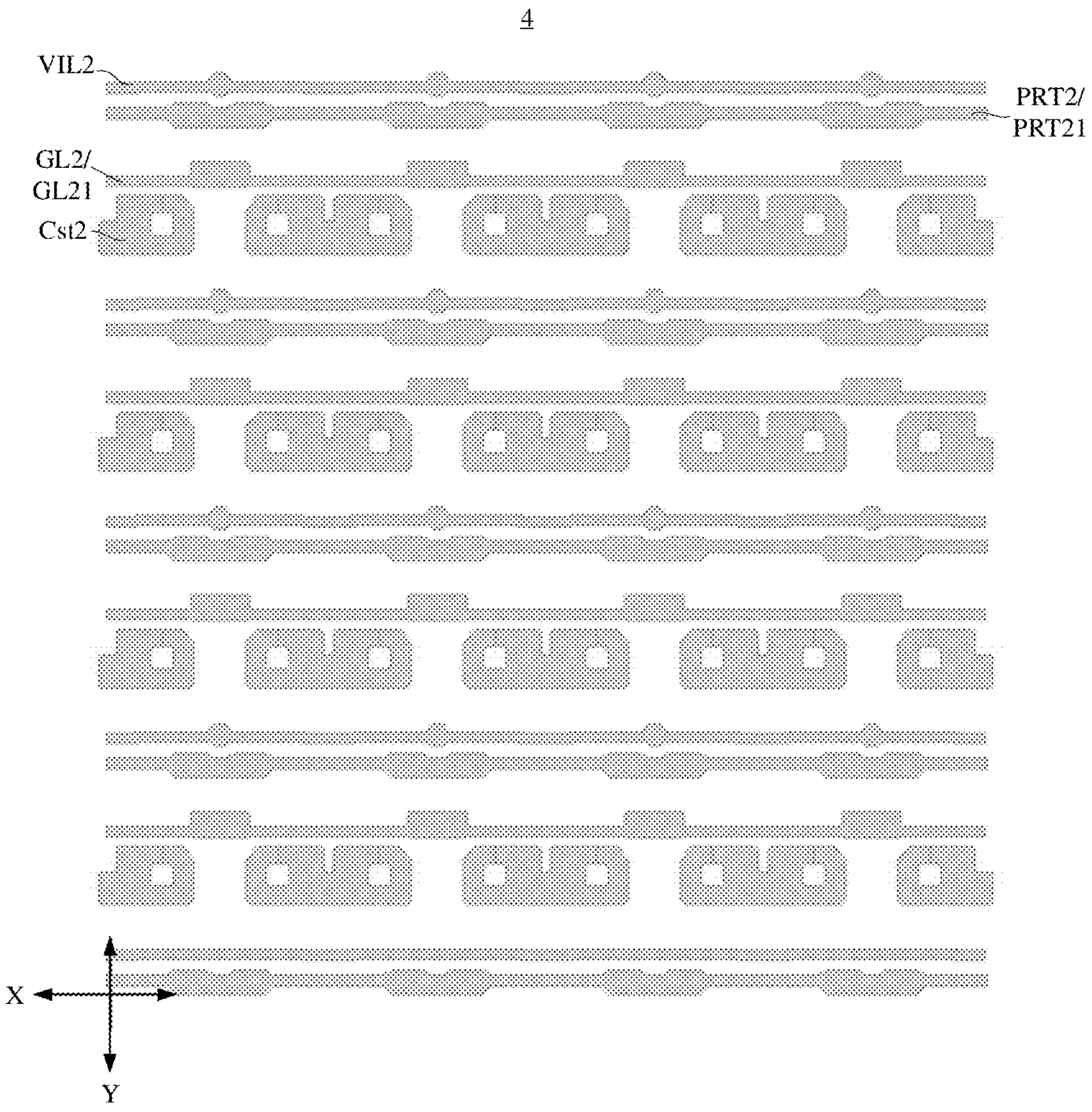
Figure 15:
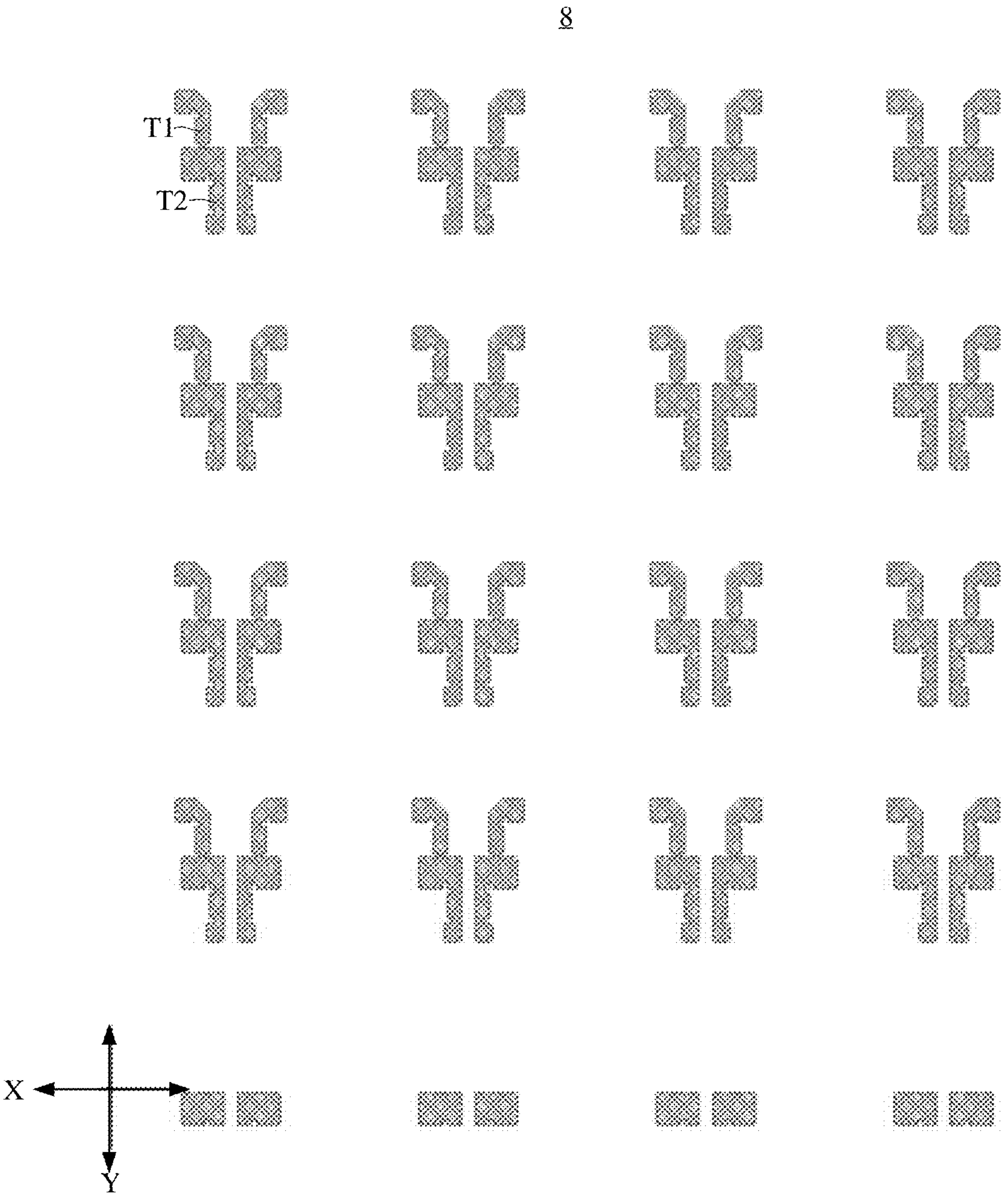
Figure 16:
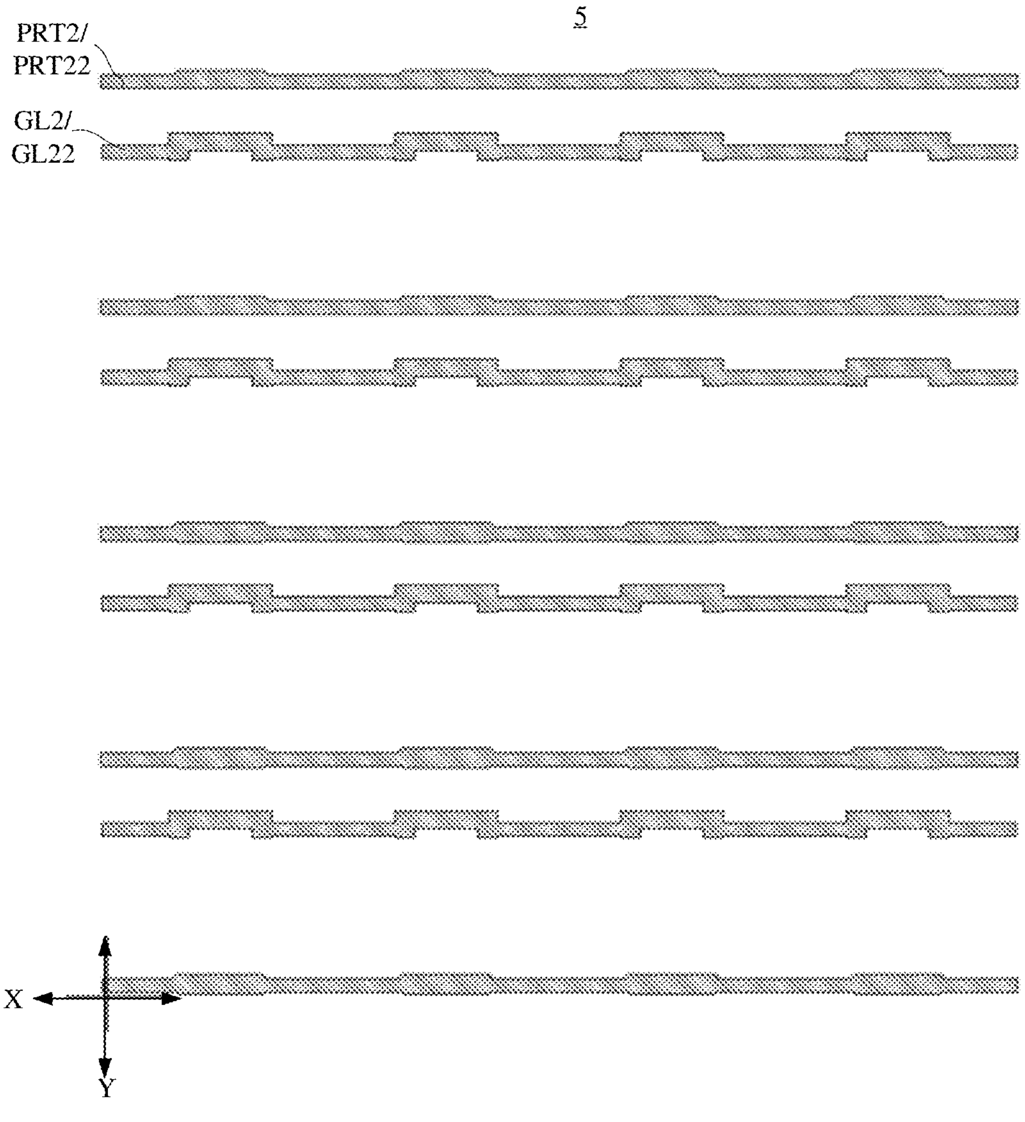
Figure 17:
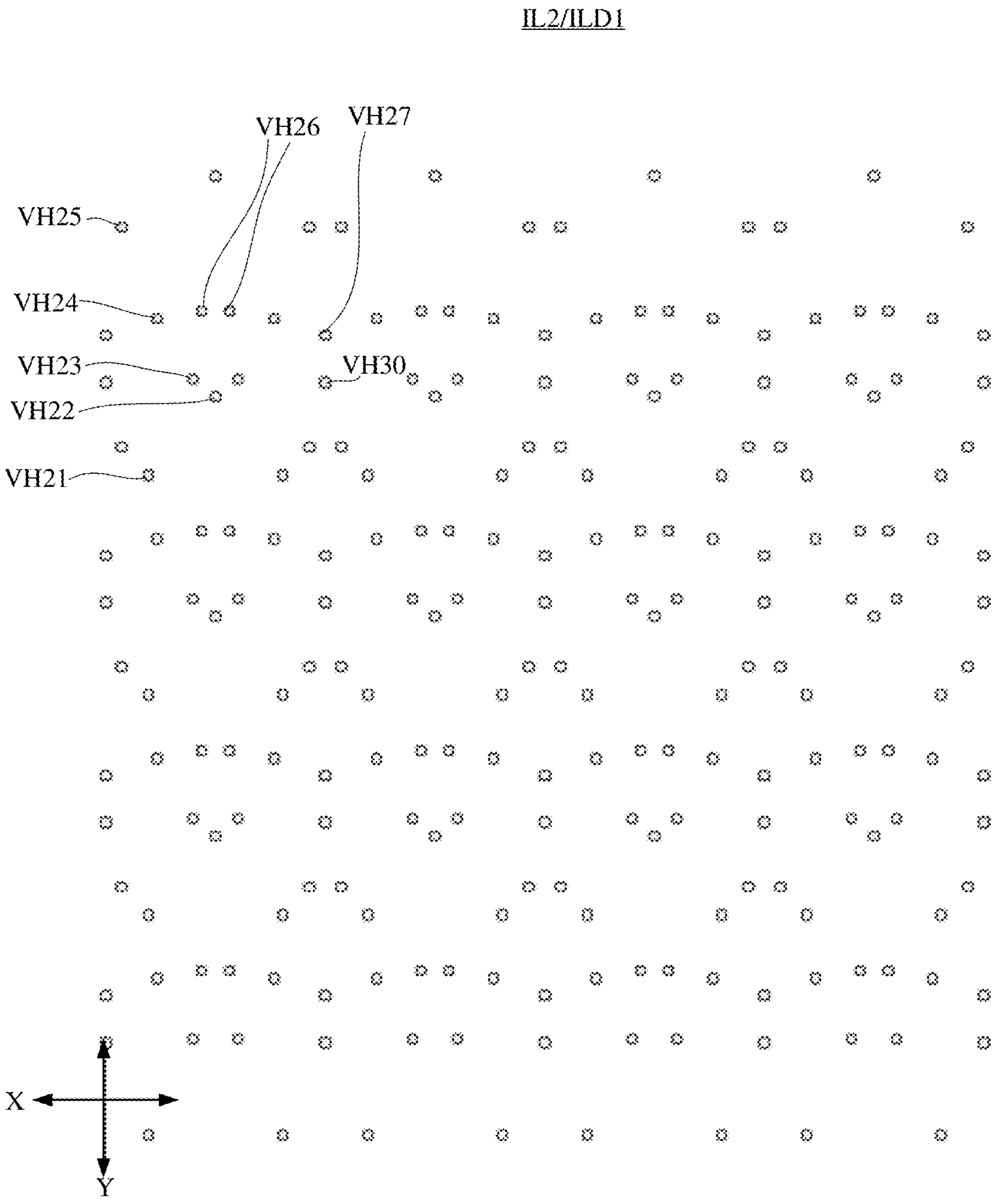
Figure 18:
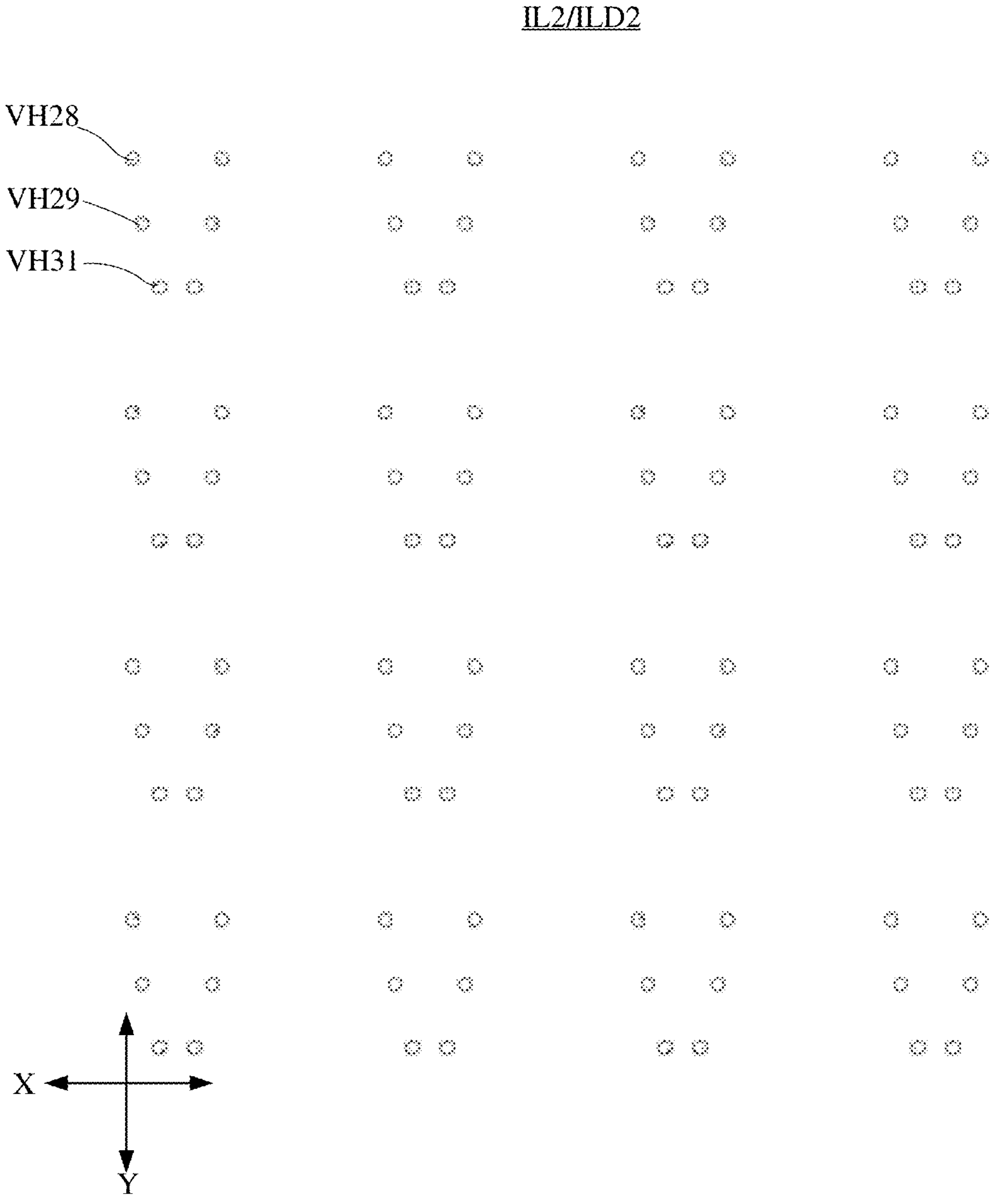
Figure 19:
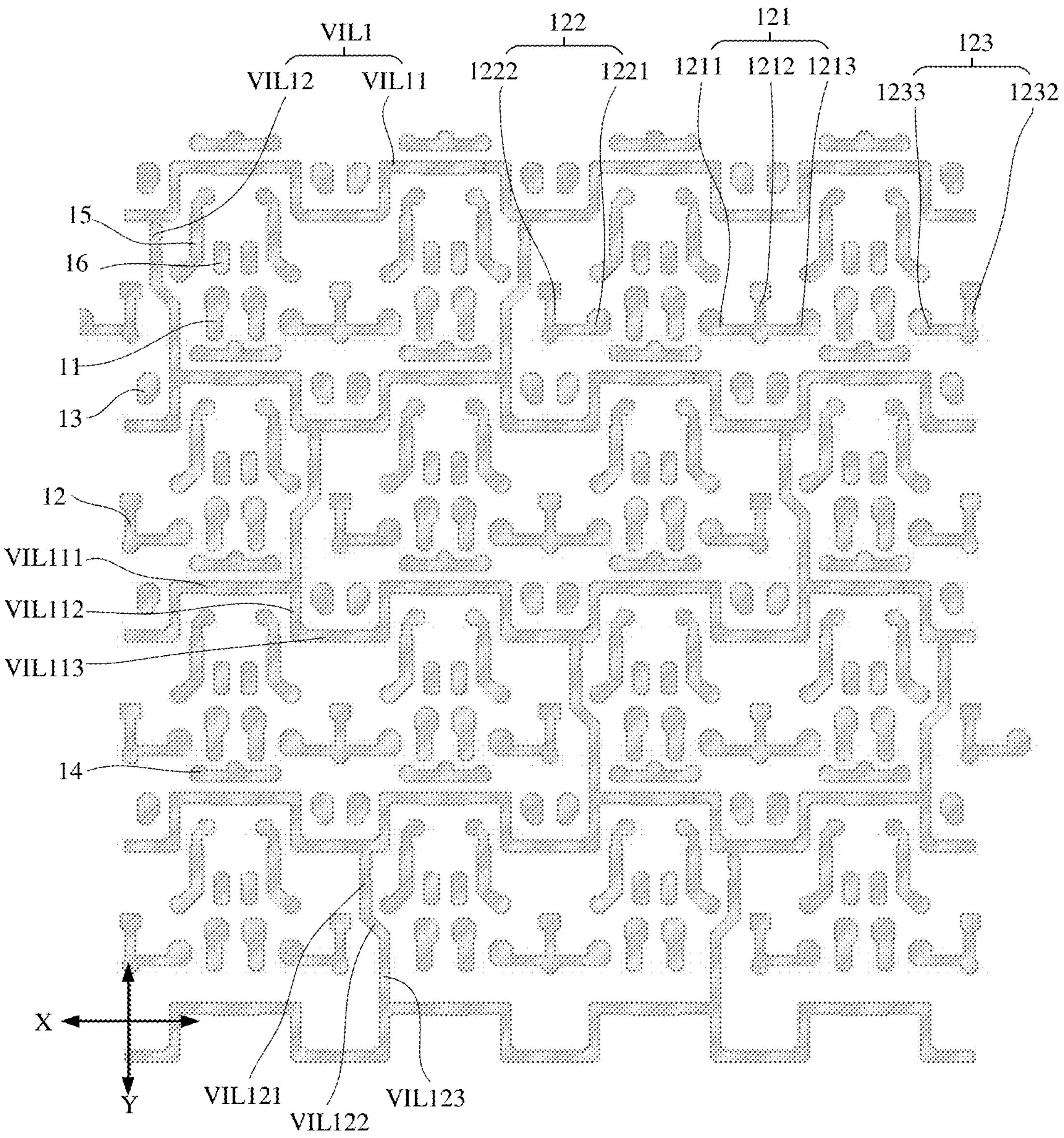
Figure 20:
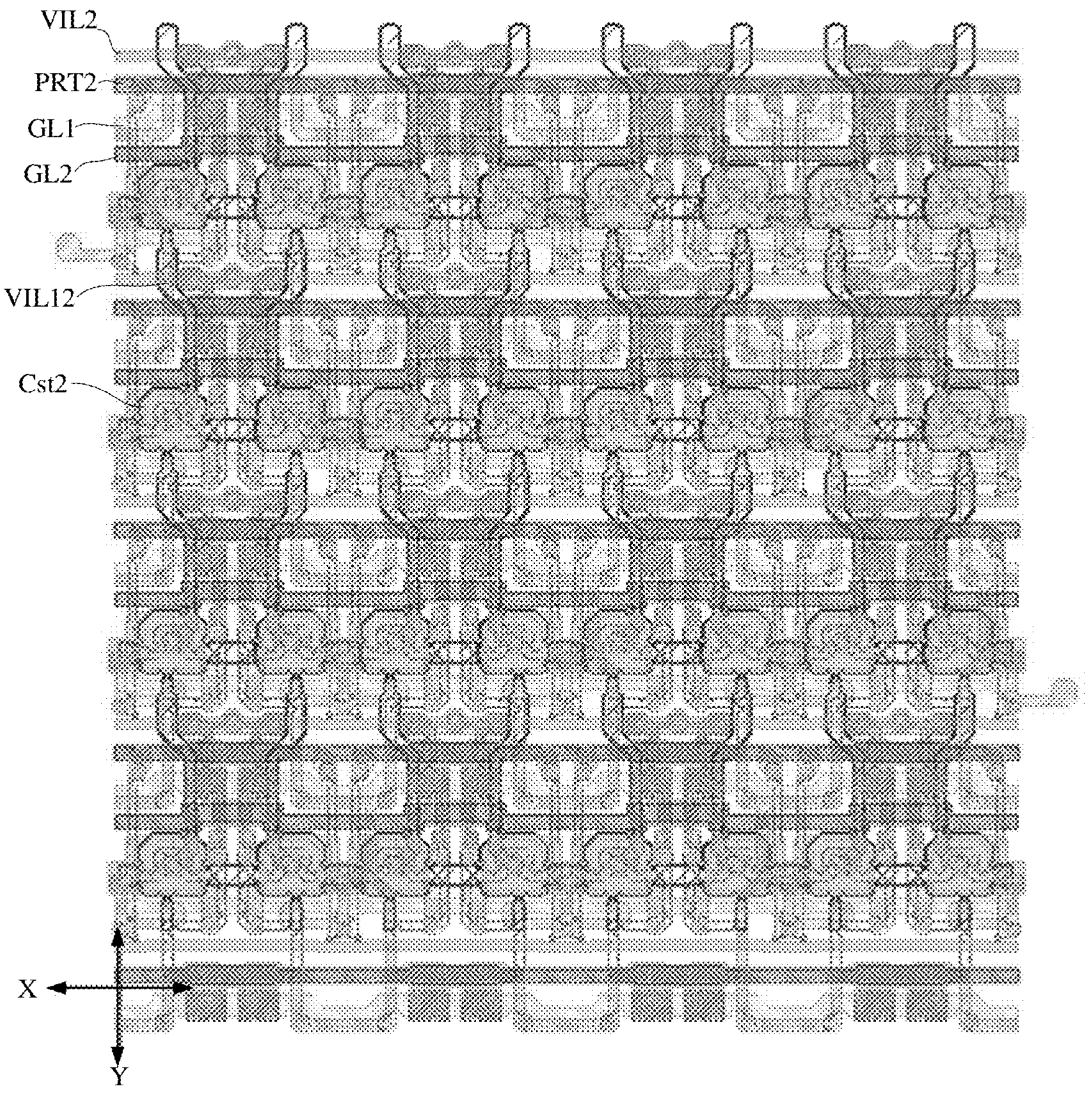
Figure 21:
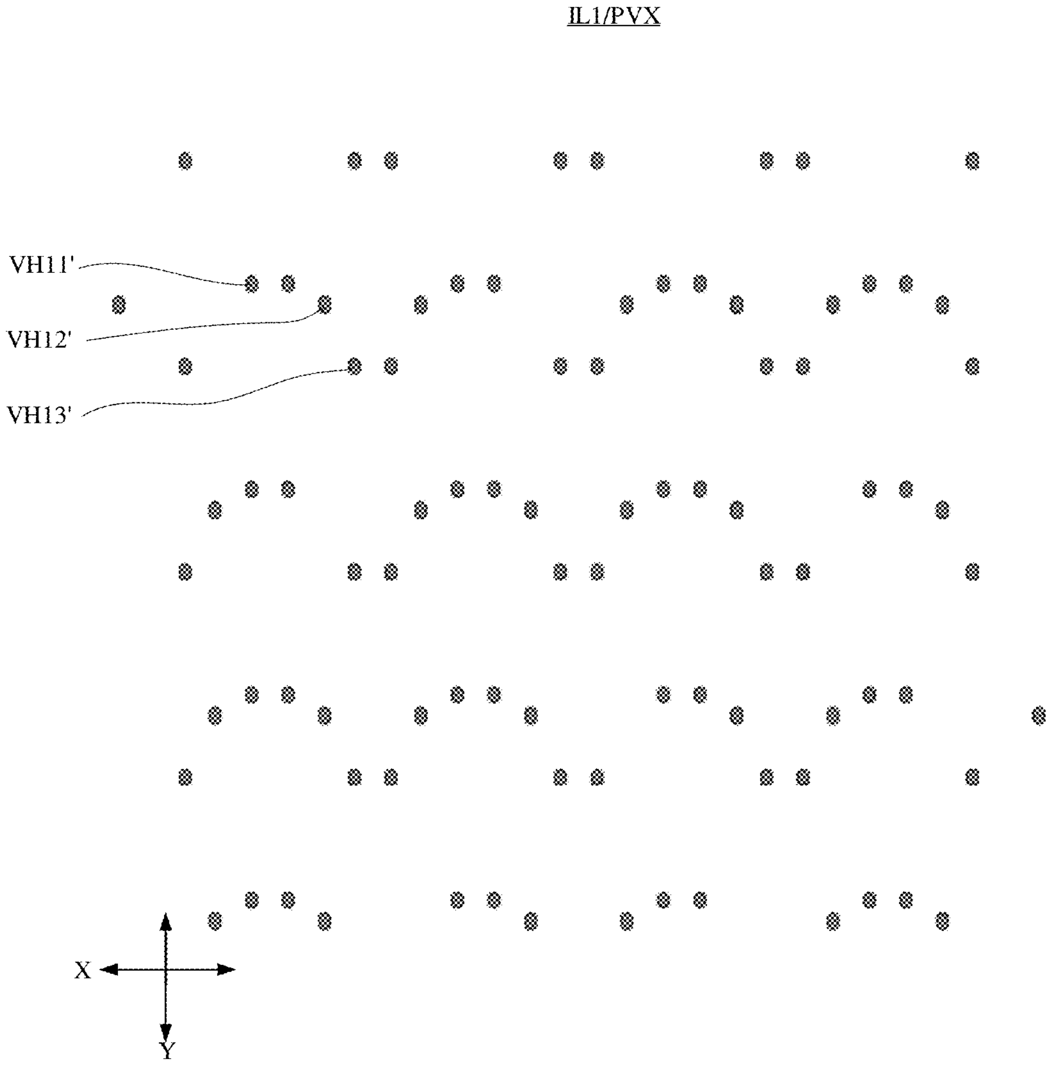
Figure 22:
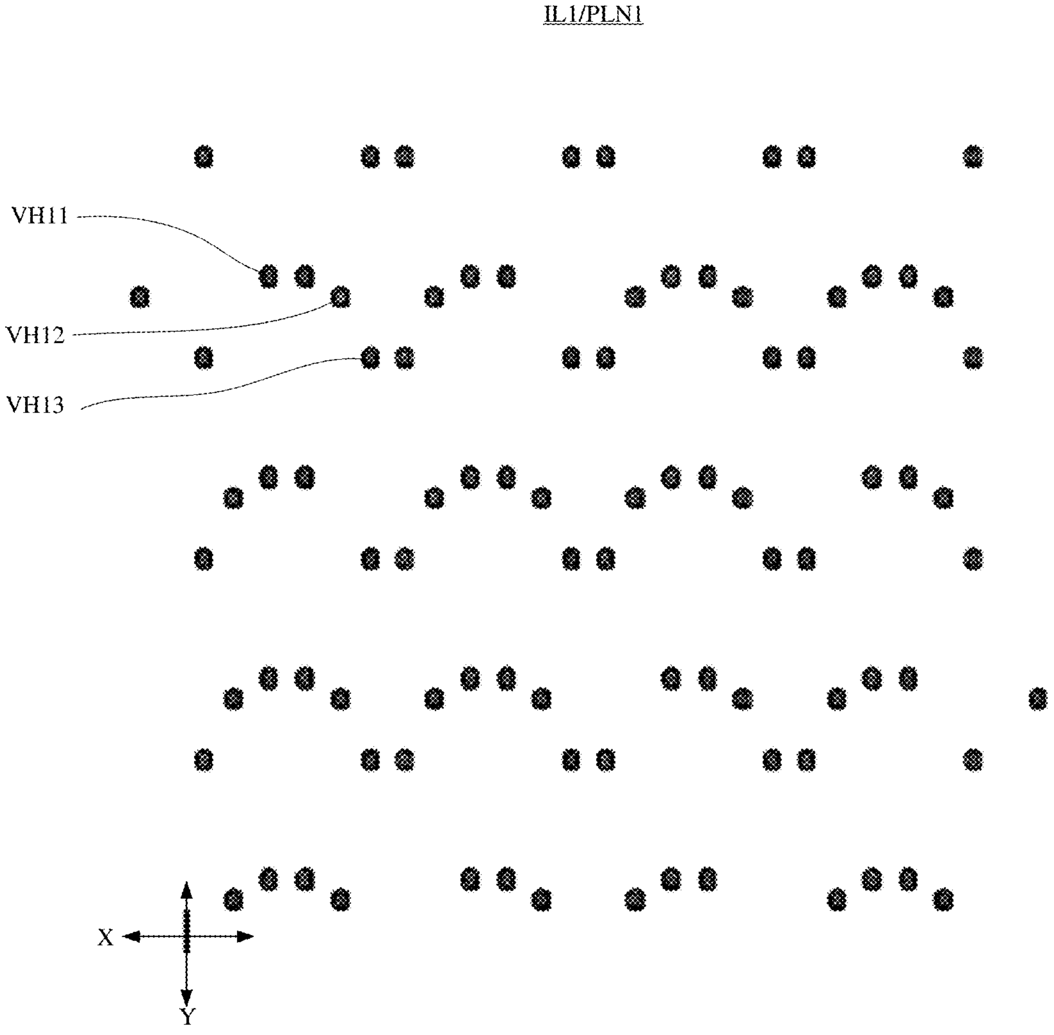
Figure 23:
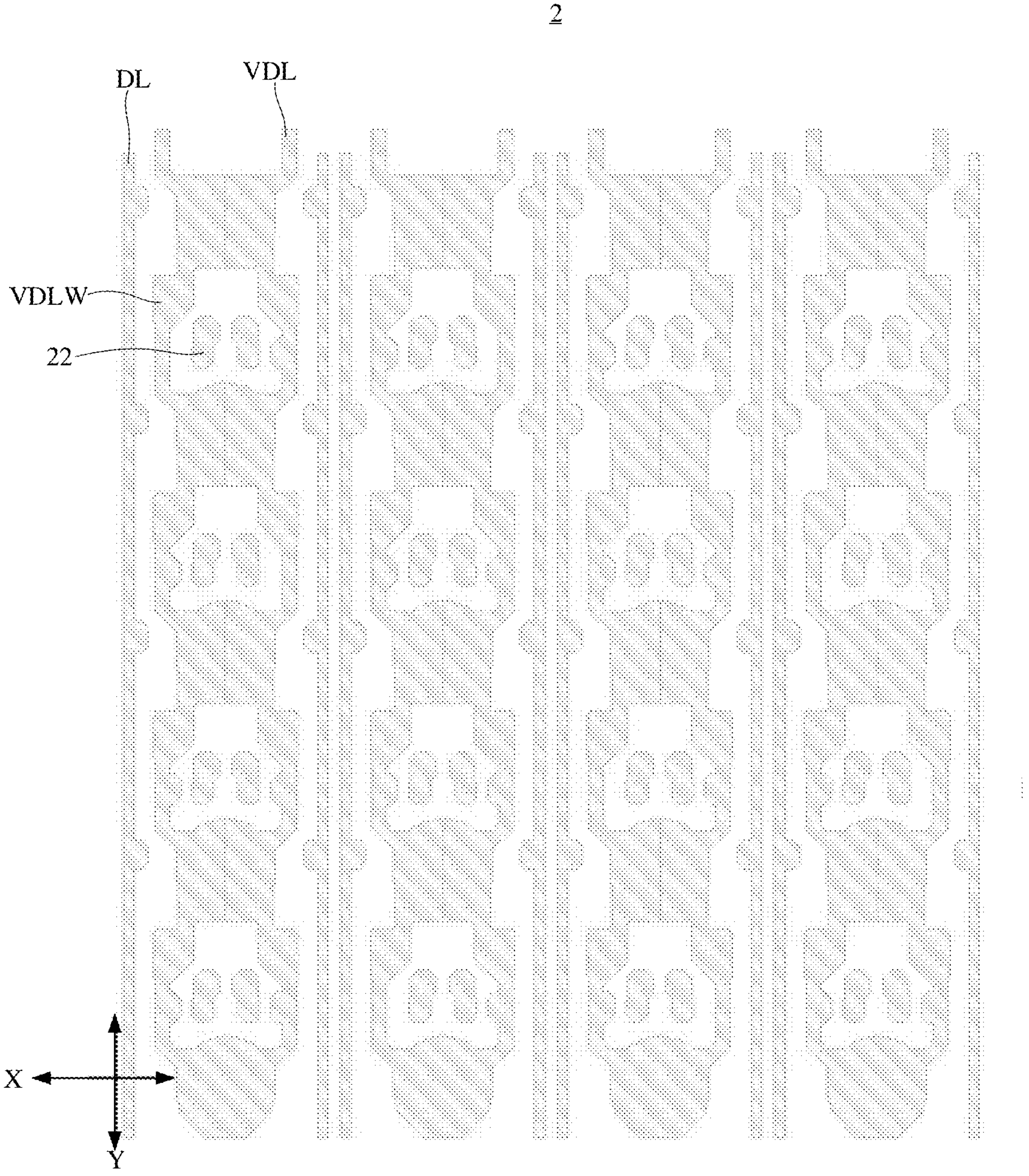
Figure 24:
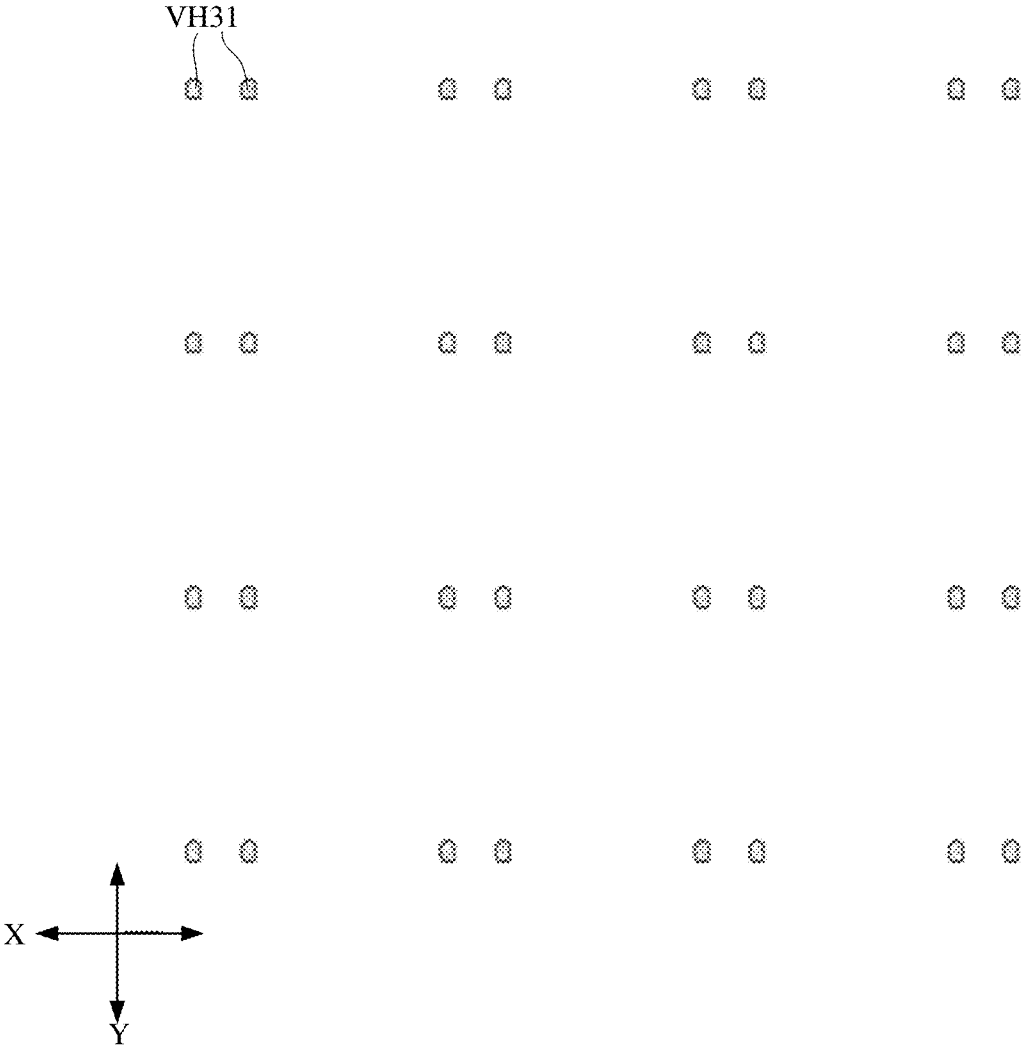
Figure 25:
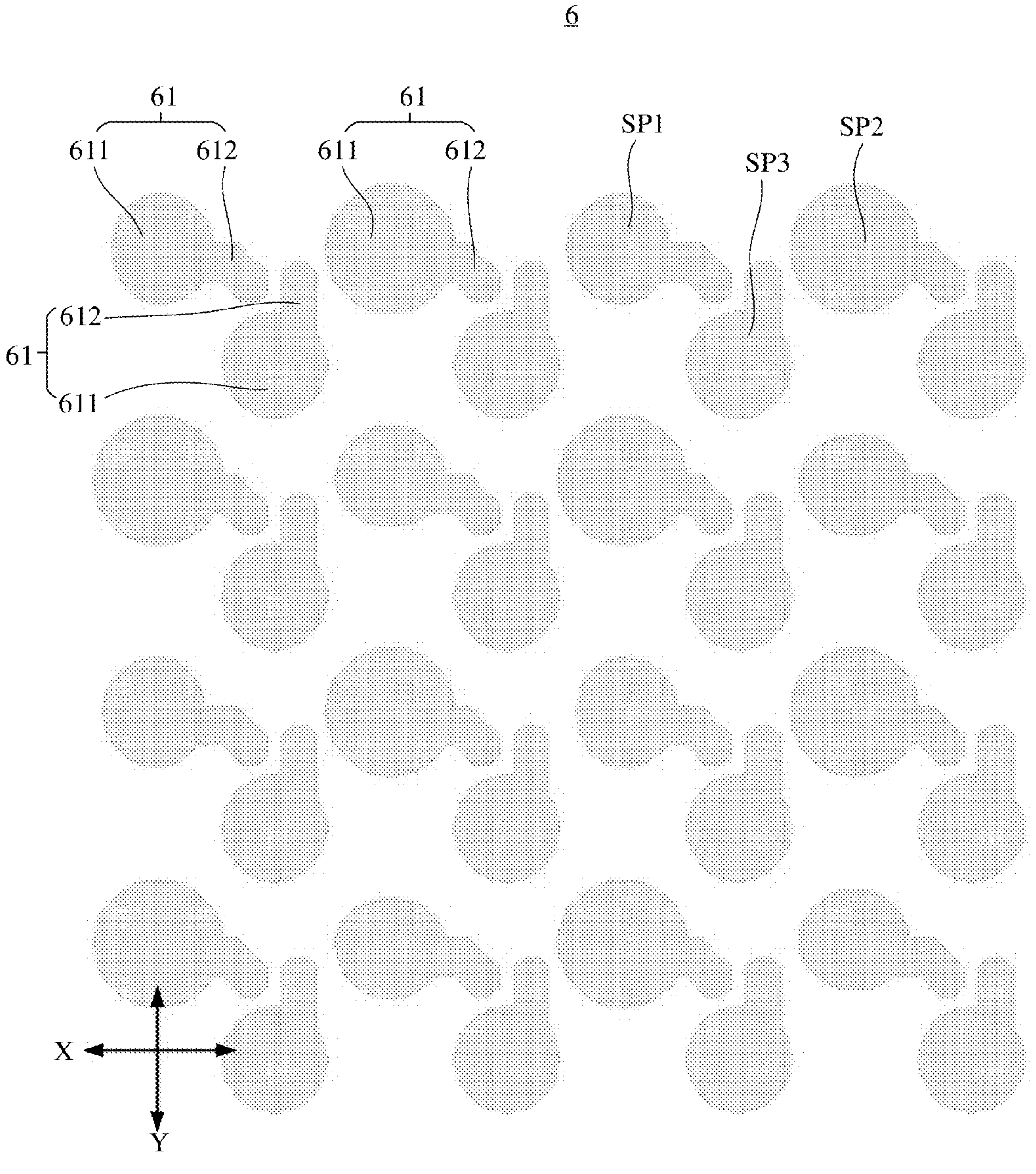
Figure 26:
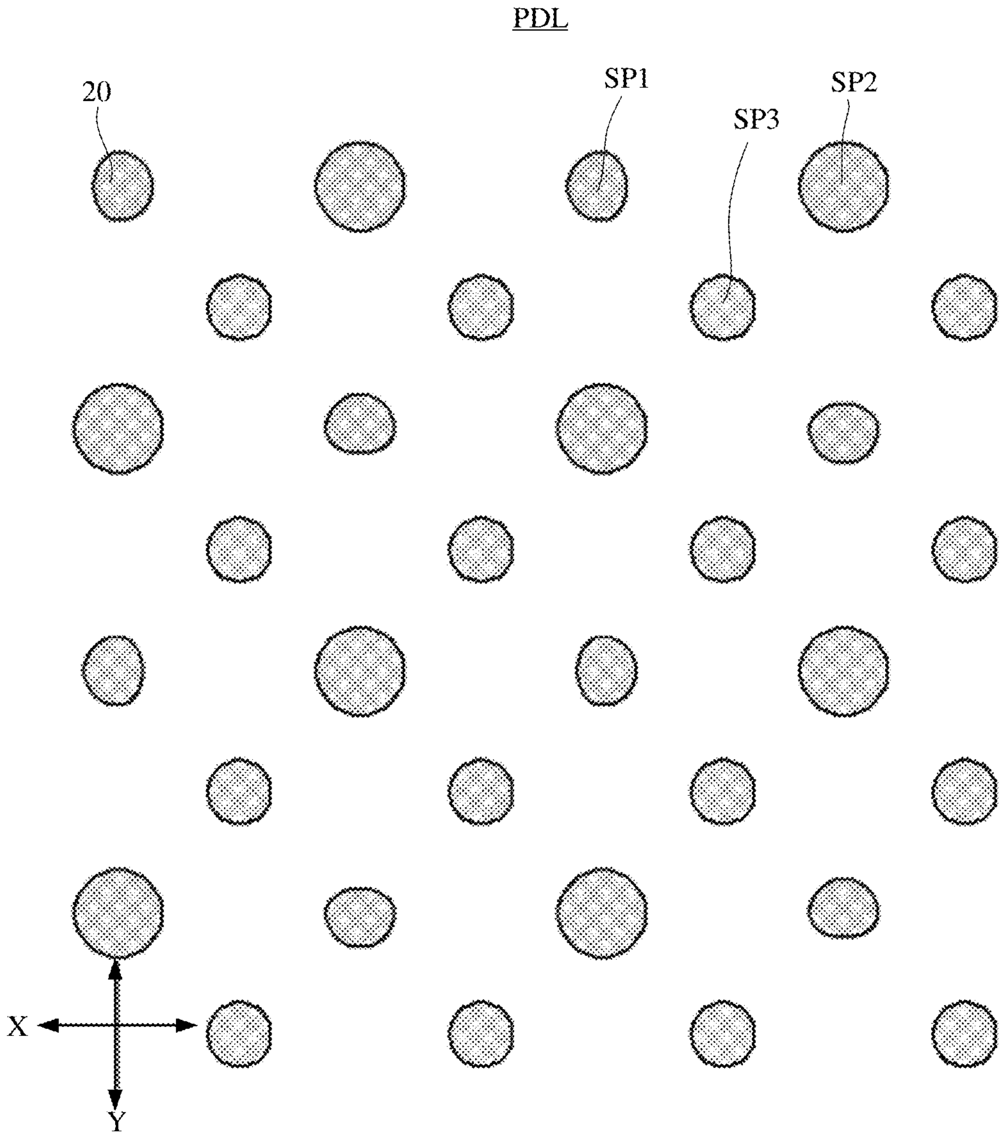
Figure 27:
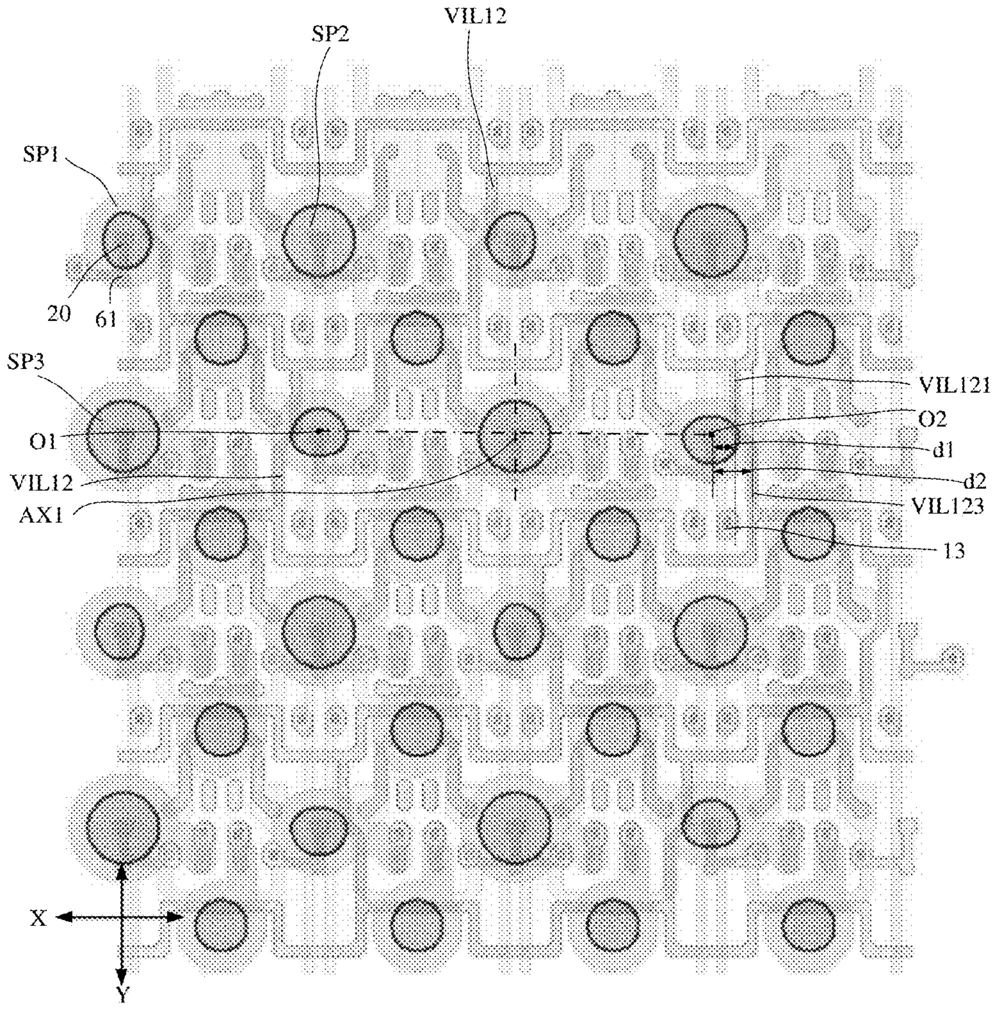
Figure 28:
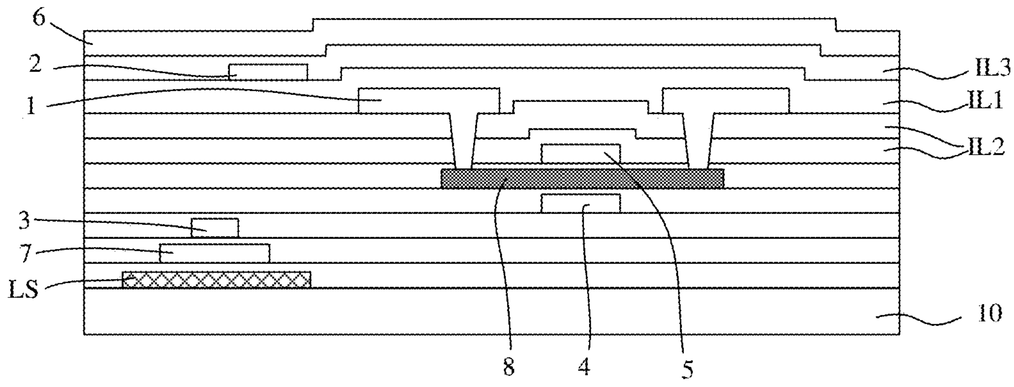
FIG. 28 is a schematic cross-sectional view of a display substrate taken along line FF' in FIG. 1 of some exemplary embodiments of the present disclosure, which schematically shows a position of each film layer of the display substrate.
Figure 29:
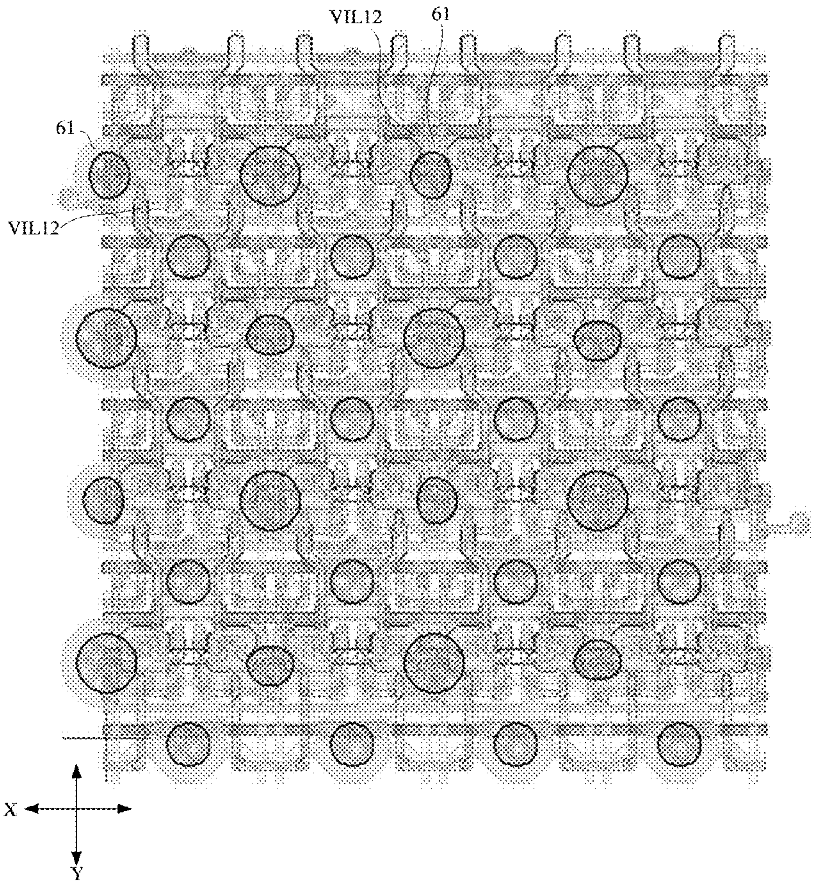
FIG. 29 is a partial plan view of a display substrate, which schematically shows an overlay from the light shielding layer to the pixel defining layer.

FIG. 11 to FIG. 27 are partial plan views of a display substrate according to some exemplary embodiments of the present disclosure. FIG. 11 is a partial plan view of a light shielding layer of the display substrate. FIG. 12 is a partial plan view of a first semiconductor layer of the display substrate. FIG. 13 is a partial plan view of a third conductive layer of the display substrate. FIG. 14 is a partial plan view of a fourth conductive layer of the display substrate. FIG. 15 is a partial plan view of a second semiconductor layer of the display substrate. FIG. 16 is a partial plan view of a fifth conductive layer of the display substrate. FIG. 17 is a partial plan view of a first interlayer dielectric layer of the display substrate, which schematically shows a plurality of via holes located in the first interlayer dielectric layer. FIG. 18 is a partial plan view of a second interlayer dielectric layer of the display substrate, which schematically shows a plurality of via holes located in the second interlayer dielectric layer. FIG. 19 is a partial plan view of a first conductive layer of the display substrate. FIG. 20 is a partial plan view of the display substrate, which schematically shows an overlay from the light shielding layer to the first conductive layer. FIG. 21 is a partial plan view of a passivation layer of the display substrate, which schematically shows a plurality of via holes located in the passivation layer. FIG. 22 is a partial plan view of a first planarization layer of the display substrate, which schematically shows a plurality of via holes located in the first planarization layer. FIG. 23 is a partial plan view of a second conductive layer of the display substrate. FIG. 24 is a partial plan view of a second planarization layer of the display substrate, which schematically shows a plurality of via holes located in the second planarization layer. FIG. 25 is a partial plan view of a first electrode layer of the display substrate. FIG. 26 is a partial plan view of a pixel defining layer of the display substrate, which schematically shows a plurality of pixel openings located in the pixel defining layer. FIG. 27 is a partial plan view of the display substrate, which schematically shows an overlay from the first conductive layer to the pixel defining layer. FIG. 28 is a schematic cross-sectional view of a display substrate taken along line FF' in FIG. 1 of some exemplary embodiments of the present disclosure, which schematically shows a position of each film layer of the display substrate. FIG. 29 is a partial plan view of a display substrate, which schematically shows an overlay from the light shielding layer to the pixel defining layer.

With reference to FIG. 11 to FIG. 29, the display substrate may include: a base substrate 10, a light shielding layer LS disposed on the base substrate 10, a first semiconductor layer 7 disposed on a side of the light-shielding layer LS away from the base substrate, a third conductor layer 3 disposed on a side of the first semiconductor layer 7 away from the base substrate, a fourth conductive layer 4 on a side of the third conductive layer 3 away from the base substrate, a second semiconductor layer 8 on a side of the fourth conductive layer 4 away from the base substrate, a fifth conductive layer 5 disposed on a side of the second semiconductor layer 8 away from the base substrate, a first conductive layer 1 disposed on a side of the fifth conductive layer 5 away from the base substrate, and a second conductive layer 2 disposed on a side of the first conductive layer 1 away from the base substrate.

For example, the third conductive layer 3, the fourth conductive layer 4 and the fifth conductive layer 5 may be conductive layers formed by gate materials, such as Mo. For example, the first conductive layer 1 and the second conductive layer 2 may be conductive layers formed by source drain materials, such as Ti/Al/Ti.

The semiconductor materials that form the active layer may include amorphous silicon, polycrystalline silicon, oxide semiconductors, etc. The oxide semiconductor materials may include IGZO (indium gallium zinc oxide), ZnO (zinc oxide), etc.

In the embodiment of the present disclosure, at least one insulation layer may be disposed between two adjacent conductive layers. The insulation layer may be formed by inorganic materials such as silicon nitride, silicon oxide or silicon oxynitride. Alternatively, the insulation layer may be formed by organic materials such as resin. The insulation layer may have a single film layer structure or may have a stacked structure formed by a plurality of film layers. For example, in the illustrated embodiment, the display substrate may include: a first insulation layer IL1 disposed between the first conductive layer 1 and the second conductive layer 2; a second insulation layer IL2 disposed between the fifth conductive layer 5 and the first conductive layer 1; and a third insulation layer IL3 disposed between the second conductive layer 2 and the first electrode layer 6. For example, the first insulation layer IL1 may include a passivation layer PVX and a first planarization layer PLN1. The second insulation layer IL2 may include a first interlayer dielectric layer ILD1 and a second interlayer dielectric layer ILD2. The third insulation layer IL3 may include a second planarization layer PLN2.

It should be understood that the display substrate may have more insulation layers, and the structure of the insulation layer may refer to the structure of the insulation layer in the existing display substrate, which will not be repeated here.

FIG. 12 shows a first semiconductor layer 7. For example, as shown in FIG. 12, the first semiconductor layer 7 may be used to manufacture active layers of a driving transistor T3, a data writing transistor T4, a first light-emitting control transistor T5, a second light-emitting control transistor T6 and a first reset transistor T7 for forming a channel region of the aforementioned transistors. The first semiconductor layer 7 may include active region patterns (channel regions) and doped region patterns (source drain regions) of the aforementioned transistors of each sub-pixel, and the active region patterns and doped region patterns of the aforementioned transistors in the same pixel driving circuit are integrally provided.

For example, the first semiconductor layer 7 may include an integrally formed low-temperature polycrystalline silicon layer, and the source region and the drain region may be conductive through doping and other means to achieve electrical connection between various structures. For example, the source region and the drain region mentioned above may be regions doped with p-type impurities.

FIG. 11 shows a light shielding layer LS. For example, the light shielding layer LS may be formed by metal materials. An orthographic projection of the light shielding layer LS on the base substrate 10 may at least partially overlap with orthographic projections of the channel regions of at least some transistors on the base substrate 10. In this way, the light shielding layer LS may avoid interference from external light on the channel regions of the transistors.

FIG. 13 shows a third conductive layer 3 located on a side of the first semiconductor layer 7 away from the base substrate. For example, as shown in FIG. 13, a first scanning control signal line GL1, a first capacitor electrode Cst1 of a storage capacitor Cst, a light-emitting control signal line EML and a first reset control signal line PRT1 may be located in the third conductive layer 3. For example, the third conductive layer 3 may include gates of a driving transistor T3, a data writing transistor T4, a first light-emitting control transistor T5, a second light-emitting control transistor T6 and a first reset transistor T7.

It should be noted that the dashed rectangular boxes in FIG. 12 shows each portion where the first semiconductor layer 7 overlaps with the third conductive layer 3, that is, the channel region. As the channel region of each transistor, an active semiconductor layer on two sides of each channel region is conductive through ion doping and other processes as first and second electrodes of each transistor. A source of a transistor and a drain of the transistor may be symmetrical in structure, so that the source of the transistor and the drain of the transistor have no difference in physical structure. In the embodiments of the present disclosure, for distinguishing the transistors, except for the gate serving as a control electrode, one of the electrodes is directly described as a first electrode and the other one of the electrodes is described as a second electrode. Therefore, in the embodiments of the present disclosure, all or part of the first and second electrodes of the transistors may be interchanged as required.

For example, with reference to FIG. 12, FIG. 13 and FIG. 20, a gate of the data writing transistor T4 may be a portion where the first scanning control signal line GL1 overlaps with the first semiconductor layer 7. A gate of the second light-emitting control transistor T6 may be a first portion where the light-emitting control signal line EML overlaps with the first semiconductor layer 7, and a gate of the first light-emitting control transistor T5 may be a second portion where the light-emitting control signal line EML overlaps with the first semiconductor layer 7. A gate of the first reset transistor T7 is a portion where the first reset control signal line PRT1 overlaps with the first semiconductor layer 7.

FIG. 14 shows a fourth conductive layer 4 located on a side of the third conductive layer 3 away from the base substrate. For example, as shown in FIG. 14, a second scanning control signal line GL2, a second capacitor electrode Cst2 of a storage capacitor Cst, a second reset control signal line PRT2 and a second initialization voltage signal line VIL2 may be located in the fourth conductive layer 4.

FIG. 15 shows a second semiconductor layer 8 located on a side of the fourth conductive layer 4 away from the base substrate. For example, as shown in FIG. 15, the second semiconductor layer 8 includes channel regions of a second reset transistor T1 and a compensation transistor T2. For example, in a case that the active layers in the second reset transistor T1 and the compensation transistor T2 use oxide semiconductors, since the transistor using oxide semiconductors has good hysteresis characteristics and low leakage current, the transistor using oxide semiconductors may replace low-temperature polysilicon materials in the transistor to form a pixel driving circuit of low-temperature polysilicon oxide (LTPO), achieving low leakage current, which is beneficial to improving the stability of the voltage of the gate of the transistor.

For example, as shown in FIG. 14, FIG. 15 and FIG. 20, a gate of the second reset transistor T1 may be a portion where the second reset control signal line PRT2 overlaps with the second semiconductor layer 8, and a gate of the compensation transistor T2 may be a portion where the second scanning control signal line GL2 overlaps with the second semiconductor layer 8.

FIG. 16 shows a fifth conductive layer 5 on a side of the second semiconductor layer 8 away from the base substrate. For example, as shown in FIG. 16, another second scanning control signal line GL2 and another second reset control signal line PRT2 may be located in the fifth conductive layer 5.

For example, as shown in FIG. 12 to FIG. 20, another second reset control signal line PRT2 overlaps with the channel region of the second reset transistor T1. The second reset transistor T1 includes a top gate and a bottom gate which are located on two sides of the active layer. Another second scanning control signal line GL2 overlaps with the channel region of the compensation transistor T2. The compensation transistor T2 includes a top gate and a bottom gate which are located on two sides of the active layer. That is to say, in the embodiment of the present disclosure, the second reset transistor T1 and the compensation transistor T2 may have dual gate structures, that is, each include a top gate and a bottom gate.

In the embodiment of the present disclosure, the second reset control signal line PRT2 may include a first reset control signal sub-line PRT21 and a second reset control signal sub-line PRT22. The second reset control signal line located in the fourth conductive layer 4 is described as a first reset control signal sub-line PRT21, and the second reset control signal line located in the fifth conductive layer 5 is described as a second reset control signal sub-line PRT22. A portion where the first reset control signal sub-line PRT21 overlaps with the second semiconductor layer 8 forms the bottom gate of the second reset transistor T1, and a portion where the second reset control signal sub-line PRT22 overlaps with the second semiconductor layer 8 forms the top gate of the second reset transistor T1.

The second scanning control signal line GL2 may include a first scanning control signal sub-line GL21 and a second scanning control signal sub-line GL22. The second scanning control signal line located in the fourth conductive layer 4 is described as a first scanning control signal sub-line GL21, and the second scanning control signal line located in the fifth conductive layer 5 is described as a second scanning control signal sub-line GL22. A portion where the first scanning control signal sub-line GL21 overlaps with the second semiconductor layer 8 forms the bottom gate of the compensation transistor T2, and a portion where the second scanning control signal sub-line GL22 overlaps with the second semiconductor layer 8 forms the top gate of the compensation transistor T2.

For example, the second reset transistor T1 and the compensation transistor T2 may be N-type transistors. The driving transistor T3, the data writing transistor T4, the first light-emitting control transistor T5, the second light-emitting control transistor T6 and the first reset transistor T7 may be P-type transistors.

FIG. 19 shows a first conductive layer 1 located on a side of the fifth conductive layer 5 away from the base substrate. For example, as shown in FIG. 19, a first initialization voltage signal line VIL1 may be located in the first conductive layer 1. The display substrate may also include a plurality of connection portions or transfer portions located in the first conductive layer 1. In the following text, the plurality of connection portions or transfer portions located in the first conductive layer 1 will be described in conjunction with specific electrical connection relationships.

As shown in FIG. 19, the first initialization voltage signal line VIL1 includes a first initialization voltage signal sub-line VIL11 and a second initialization voltage signal sub-line VIL12. A main body of the first initialization voltage signal sub-line VIL11 extends in the first direction X, while a main body of the second initialization voltage signal sub-line VIL12 extends in the second direction Y.

For example, as shows in FIG. 19, the first initialization voltage signal line VIL1 may include a plurality of first initialization voltage signal sub-lines VIL11 and a plurality of second initialization voltage signal sub-lines VIL12. The plurality of first initialization voltage signal sub-lines VIL11 intersect with the plurality of second initialization voltage signal sub-lines VIL12, and the plurality of first initialization voltage signal sub-lines VIL11 are connected to the plurality of second initialization voltage signal sub-lines VIL12, so that the first initialization voltage signal line VIL1 forms a mesh structure.

The first initialization voltage signal sub-line VIL11 may include a first portion VIL111, a second portion VIL112 and a third portion VIL113. The second portion VIL112 is located between the first portion VIL111 and the third portion VIL113. One end of the second portion VIL112 is connected to the first portion VIL111, and the other end of the second portion VIL112 is connected to the third portion VIL113. The first portion VIL111 and the third portion VIL113 extend in the first direction X, while the second portion VIL112 extends in the second direction Y. For example, a first initialization voltage signal sub-line VIL11 may include a plurality of first portions VIL111, a plurality of second portions VIL112 and a plurality of third portions VIL113. An extension length of a first portion VIL111 in the first direction X is greater than an extension length of a third portion VIL113 in the first direction X.

The second initialization voltage signal sub-line VIL12 includes a first portion VIL121, a second portion VIL122 and a third portion VIL123. The second portion VIL122 is located between the first portion VIL121 and the third portion VIL123. One end of the second portion VIL122 is connected to the first portion VIL121, and the other end of the second portion VIL122 is connected to the third portion VIL123. The first portion VIL121 and the third portion VIL123 both extend in the second direction Y, and the second portion VIL122 extends in the third direction D3. The third direction D3 intersects with the first direction X, and the third direction D3 intersects with the second direction Y.

At least one second initialization voltage signal sub-line VIL12 is located between two adjacent first initialization voltage signal sub-lines VIL11. For example, a plurality of second initialization voltage signal sub-lines VIL12 are located between two adjacent first initialization voltage signal sub-lines VIL11. In the embodiment of the present disclosure, one end of the first portion VIL121 of the second initialization voltage signal sub-line VIL12 is connected to the third portion VIL113 of the first initialization voltage signal sub-line VIL11, and one end of the third portion VIL121 of the second initialization voltage signal sub-line VIL12 is connected to an intersection portion of the first portion VIL111 of the first initialization voltage signal sub-line VIL11 and the second portion VIL112 of the first initialization voltage signal sub-line VIL11.

With reference to FIG. 27, orthographic projections of the plurality of second initialization voltage signal sub-lines VIL12 on the base substrate 10 partially overlap with orthographic projections of the first electrodes 61 of the plurality of first sub-pixels SP1 on the base substrate 10, respectively. For example, orthographic projections of the plurality of second initialization voltage signal sub-lines VIL12 on the base substrate 10 are line segments that extend substantially in the second direction Y. The line segment passes through an edge of the orthographic projection of the first electrode 61 of at least one first sub-pixel SP1 on the base substrate 10.

The first electrodes of the plurality of first sub-pixels SP1 in the first direction X have respective first sides and respective second sides, respectively. For example, the first side may be one of the left side and the right side, and the second side may be the other one of the left side and the right side. That is to say, the first side and the second side may be opposite sides of the first electrode 61 in the first direction X. Correspondingly, the pixel openings 20 of the plurality of first sub-pixels SP1 in the first direction X have respective first sides and respective second sides, respectively. For example, the first side may be one of the left side and the right side, and the second side may be the other one of the left side and the right side. That is to say, the first side and the second side may be the opposite sides of the pixel opening 20 in the first direction X.

With reference to FIG. 27, for any two adjacent first sub-pixels SP1 located in the same row, the orthographic projection of one second initialization voltage signal sub-line VIL12 on the base substrate 10 passes through the edge of the first side of the orthographic projection of the first electrode 61 of one first sub-pixel among the two first sub-pixels SP1 on the base substrate 10, and the orthographic projection of another second initialization voltage signal sub-line VIL12 on the base substrate 10 passes through the edge of the second side of the orthographic projection of the first electrode 61 of the other one of the two first sub-pixels SP1 on the base substrate 10.

With continued reference to FIG. 27, for any two adjacent first sub-pixels SP1 located in the same row, the orthographic projection of one second initialization voltage signal sub-line VIL12 on the base substrate 10 is located on the first side of the orthographic projection of the pixel opening 20 of one first sub-pixel among the two first sub-pixels SP1 on the base substrate 10, and the orthographic projection of another second initialization voltage signal sub-line VIL12 on the base substrate 10 is located on the second side of the orthographic projection of the pixel opening 20 of the other one of the two first sub-pixels SP1 on the base substrate 10.

For example, in the embodiment shown in FIG. 27, for the first and second first sub-pixels SP1 located from the left side of the third row, the orthographic projection of a second initialization voltage signal sub-line VIL12 on the base substrate 10 is located on the left side of the orthographic projection of the pixel opening 20 of the first first sub-pixel SP1 on the base substrate 10, and the orthographic projection of another second initialization voltage signal sub-line VIL12 on the base substrate 10 is located on the right side of the orthographic projection of the pixel opening 20 of the second first sub-pixel SP1 on the base substrate 10.

With reference to FIG. 27 and FIG. 7, in the embodiment of the present disclosure, for any two adjacent first sub-pixels located in the same row, the second initialization voltage signal sub-lines VIL12 provided below the first electrodes 61 of the light-emitting elements are respectively disposed on opposite sides of the first electrodes 61 or pixel openings 20 of the corresponding sub-pixels, so that the first electrodes 61 of the adjacent sub-pixels in the row direction may still be substantially symmetrical relative to the centerline AXL between the two sub-pixels. In this way, the reflected optical paths of the first electrodes 61 of the two adjacent sub-pixels in the row direction may still maintain to be substantially consistent, and the symmetry of the two relative to the centerline AXL between the two sub-pixels is relatively high. Therefore, there is almost no color deviation between adjacent sub-pixels in the row direction, that is, the display effect of the display substrate is good and there is no color deviation problem.

Furthermore, in the embodiment of the present disclosure, for any two adjacent first sub-pixels SP1 located in the same row, orthographic projections of the two second initialization voltage signal sub-lines VIL12 partially overlapping with the first electrodes 61 of the two first sub-pixels on the base substrate are symmetrical relative to the first symmetry axis AX1. The first symmetry axis AX1 passes through a center point of a line connecting the centers of the pixel openings 20 of the two first sub-pixels and extends in the second direction Y.

Through symmetrically designing the second initialization voltage signal sub-lines VIL12, the symmetry of the reflected optical paths of the first electrodes 61 of the two adjacent sub-pixels in the row direction may be further improved, thereby further improving and even eliminating the color deviation problem between adjacent sub-pixels in the row direction, and enhancing the display effect.

With continued reference to FIG. 27, for any two adjacent first sub-pixels SP1 located in the same column, the orthographic projection of one second initialization voltage signal sub-line VIL12 on the base substrate 10 passes through the edge of the first side of the orthographic projection of the first electrode 61 of one first sub-pixel SP1 among the two first sub-pixels SP1 on the base substrate 10, and the orthographic projection of another second initialization voltage signal sub-line VIL12 on the base substrate 10 passes through the edge of the second side of the orthographic projection of the first electrode 61 of the other one first sub-pixel among the two first sub-pixels SP1 on the base substrate 10.

For any two adjacent first sub-pixels SP1 located in the same column, the orthographic projection of one second initialization voltage signal sub-line VIL12 on the base substrate 10 is located on the first side of the orthographic projection of the pixel opening 20 of one first sub-pixel SP1 among the two first sub-pixels SP1, and the orthographic projection of another second initialization voltage signal sub-line VIL12 on the base substrate 10 is located on the second side of the orthographic projection of the pixel opening 20 of the other one of the two first sub-pixels SP1 on the base substrate 10.

For example, in the embodiment shown in FIG. 27, for the first and second first sub-pixels SP1 located from an upper side of the third column, the orthographic projection of one second initialization voltage signal sub-line VIL12 on the base substrate 10 is located on the left side of the orthographic projection of the pixel opening 20 of the first first sub-pixel SP1 on the base substrate 10, and the orthographic projection of another second initialization voltage signal sub-line VIL12 on the base substrate 10 is located on the right side of the orthographic projection of the pixel opening 20 of the second first sub-pixel SP1 on the base substrate 10.

In the embodiment of the present disclosure, for any two adjacent first sub-pixels located in the same column, the second initialization voltage signal sub-lines VIL12 provided below the first electrodes 61 of the light-emitting elements are respectively disposed on opposite sides of the first electrodes 61 or pixel openings 20 of the corresponding sub-pixels. Therefore, there is almost no color deviation between adjacent sub-pixels in the column direction, that is, the display effect of the display substrate is good and there is no color deviation problem.

With continued reference to FIG. 27, the orthographic projection of the second initialization voltage signal sub-line VIL12 on the base substrate 10 does not overlap with the orthographic projection of the first electrode 61 of the second sub-pixel SP2 on the base substrate 10, that is, the orthographic projection of the second initialization voltage signal sub-line VIL12 on the base substrate 10 does not pass through the orthographic projection of the first electrode 61 of the second sub-pixel SP2 on the base substrate 10.

The orthographic projection of the second initialization voltage signal sub-line VIL12 on the base substrate 10 does not overlap with the orthographic projection of the first electrode 61 of the third sub-pixel SP3 on the base substrate 10, that is, the orthographic projection of the second initialization voltage signal sub-line VIL12 on the base substrate 10 does not pass through the orthographic projection of the first electrode 61 of the third sub-pixel SP3 on the base substrate 10.

Through such disposing method, the second initialization voltage signal sub-line VIL12 located in the first conductive layer 1 will not cause any unevenness in the planarization layer at the corresponding position of the first electrode 61 of the second sub-pixel SP2 or the first electrode 61 of the third sub-pixel SP3, which is beneficial to improving the color deviation problem of the second sub-pixel SP2 or the third sub-pixel SP3.

In the embodiment of the present disclosure, the orthographic projections of the plurality of first initialization voltage signal sub-lines VIL11 on the base substrate 10 partially overlap with the orthographic projection of the first electrode 61 of at least one third sub-pixel SP3 on the base substrate 10. The orthographic projection of the first initialization voltage signal sub-line VIL11 on the base substrate 10 does not overlap with the orthographic projection of the first electrode 61 of the first sub-pixel SP1 on the base substrate 10. The orthographic projection of the first initialization voltage signal sub-line VIL11 on the base substrate 10 does not overlap with the orthographic projection of the first electrode 61 of the second sub-pixel SP2 on the base substrate 10.

For example, the orthographic projection of the first electrode 61 of the third sub-pixel SP3 on the base substrate 10 at least partially overlaps with the orthographic projection of the first voltage signal line VDL on the base substrate 10.

Through such design, the first initialization voltage signal sub-line VIL11 located in the first conductive layer 1 will not cause any unevenness in the planarization layer at the corresponding position of the first electrode 61 of the first sub-pixel SP1 or the first electrode 61 of the second sub-pixel SP2, which is beneficial to improving the color deviation problem of the first sub-pixel SP1 or the second sub-pixel SP2. Meanwhile, since the orthographic projection of the first electrode 61 of the third sub-pixel SP3 on the base substrate 10 at least partially overlaps with the orthographic projection of the first voltage signal line VDL located in the second conductive layer 2 on the base substrate 10, the first initialization voltage signal sub-line VIL11 located in the first conductive layer 1 will not have a significant impact on the planarity problem of the planarization layer at the corresponding position of the first electrode 61 of the third sub-pixel SP3.

FIG. 23 shows a second conductive layer 2 located on a side of the first conductive layer 1 away from the base substrate. For example, as shown in FIG. 23, the data line DL and the first voltage signal line VDL may be located in the second conductive layer 2.

The data line DL substantially extends in the second direction Y, and a plurality of data lines DL are disposed at intervals in the first direction X. For example, the plurality of data lines DL correspond to a plurality of columns of sub-pixels, so as to provide data signals to the pixel driving circuits of the plurality of columns of sub-pixels.

A main body of the first voltage signal line VDL extends in the second direction Y, and a width of part of the first voltage signal line VDL in the first direction X is relatively large. For sake of explanation, a portion where the width of the first voltage signal line VDL increases is referred to as a widened portion VDLW (as shown in FIG. 23). The widened portion VDLW protrudes relative to the main body portion of the first voltage signal line VDL in the first direction X. For example, the widened portion VDLW protrudes relative to two sides of the main body portion of the first voltage signal line VDL in the first direction X. In the embodiment of the present disclosure, two adjacent columns of sub-pixels may share a first voltage signal line VDL.

FIG. 25 shows a first electrode layer 6 located on a side of the second conductive layer 2 away from the base substrate. For example, as shown in FIG. 25, the first electrode 61 of each sub-pixel may be located in the first electrode layer 6. The first electrode 61 may include an electrode main body portion 611 and an electrode connection portion 612. For example, in the embodiment shown in FIG. 25, a shape of an orthographic projection of the electrode main body portion 611 on the base substrate 10 is circular or approximately circular. The electrode connection portion 612 protrudes relative to the electrode main body portion 611 towards one side. An orthographic projection of the electrode connection portion 612 on the base substrate 10 at least partially overlaps with an orthographic projection of the electrode connection hole (to be described in detail below) on the base substrate 10, so as to electrically connect the first electrode 61 to the pixel driving circuit below.

With back reference to FIG. 19, the display substrate may also include a plurality of transfer portions located in the first conductive layer 1. For example, the plurality of transfer portions may include a first electrode transfer portion 11, a voltage signal transfer portion 12, a data signal transfer portion 13, a first transfer portion 14, a second transfer portion 15 and a third transfer portion 16.

With back reference to FIG. 23, the display substrate may also include a second electrode transfer portion 22 located in the second conductive layer 2.

With reference to FIG. 21 and FIG. 22, the display substrate may include a plurality of via holes located in the first insulation layer IL1. In some exemplary embodiments, the first insulation layer IL1 may include a passivation layer PVX and a first planarization layer PLN1. The plurality of via holes located in the first insulation layer IL1 may include: a first via hole VH11, a second via hole VH12 and a data signal connection hole VH13 which are located in the first planarization layer PLN1, and a first via hole VH11', a second via hole VH12' and a data signal connection hole VH13' which are located in the passivation layer PVX. In this embodiment, the first via hole VH11, the second via hole VH12 and the data signal connection hole VH13 which are located in the first planarization layer PLN1 correspond to the first via hole VH11', the second via hole VH12' and the data signal connection hole VH13' which are located in the passivation layer PVX, respectively. For example, positions of the first via hole VH11, the second via hole VH12 and the data signal connection hole VH13 which are located in the first planarization layer PLN1 coincide with positions of the first via hole VH11', the second via hole VH12' and the data signal connection hole VH13' which are located in the passivation layer PVX, respectively, that is, orthographic projections of the first via hole VH11, the second via hole VH12 and the data signal connection hole VH13 which are located in the first planarization layer PLN1 on the base substrate 10 coincide or overlap with orthographic projections of the first via hole VH11', the second via hole VH12', and the data signal connection hole VH13' which are located in the passivation layer PVX on the base substrate 10, respectively.

It should be noted that in other embodiments, the first insulation layer IL1 may only include one film layer, for example, include the first planarization layer PLN1.

In this text, in order to make the description more concise, the via hole VH11 located in the first planarization layer PLN1 and the via hole VH11' located in the passivation layer PVX are both referred to as the first via hole, the via hole VH12 located in the first planarization layer PLN1 and the via hole VH12' located in the passivation layer PVX are both referred to as the second via hole, and the via hole VH13 located in the first planarization layer PLN1 and the via hole VH13' located in the passivation layer PVX are both referred to as the data signal connection hole.

With reference to FIG. 17 and FIG. 18, the display substrate may include a plurality of via holes located in the second insulation layer IL2. In some exemplary embodiments, the second insulation layer IL2 may include a first interlayer dielectric layer ILD1 and a second interlayer dielectric layer ILD2. The plurality of via holes located in the second insulation layer IL2 may include: a third via hole VH21 located in the first interlayer dielectric layer ILD1, a fourth via hole VH22 located in the first interlayer dielectric layer ILD1, a fifth via hole VH23 located in the first interlayer dielectric layer ILD1, a sixth via hole VH24 located in the first interlayer dielectric layer ILD1, a seventh via hole VH25 located in the first interlayer dielectric layer ILD1, an eighth via hole VH26 located in the first interlayer dielectric layer ILD1, a ninth via hole VH27 located in the first interlayer dielectric layer ILD1, a twelfth via hole VH30 located in the first interlayer dielectric layer ILD1, a tenth via hole VH28 located in the second interlayer dielectric layer ILD2, a eleventh via hole VH29 located in the second interlayer dielectric layer ILD2, and a thirteenth via hole VH31 located in the second interlayer dielectric layer ILD2.

With reference to FIG. 24, the display substrate may include a plurality of electrode connection holes 31 located in the third insulation layer IL3 (such as the second planarization layer PLN2).

With reference to FIG. 11 to FIG. 27, the first electrode 61 of each sub-pixel is electrically connected to the second electrode transfer portion 22 through a plurality of electrode connection holes 31, respectively. Specifically, an orthographic projection of the electrode connection portion 612 of the first electrode 61 on the base substrate 10 at least partially overlaps with an orthographic projection of the second transfer portion 22 on the base substrate 10. An orthographic projection of the electrode connection hole 31 on the base substrate falls into a portion where the electrode connection portion 612 of the first electrode 61 overlaps with the second electrode transfer portion 22.

The second electrode transfer portion 22 is electrically connected to the first electrode transfer portion 11 through the first via hole VH11. Specifically, the orthographic projection of the second electrode transfer portion 22 on the base substrate 10 at least partially overlaps with the orthographic projection of the first electrode transfer portion 11 on the base substrate 10, and the orthographic projection of the first via hole VH11 on the base substrate falls into a portion where the second electrode transfer portion 22 overlaps with the first electrode transfer portion 11.

The first electrode transfer portion 11 is electrically connected to the second electrode (such as the drain D6) of the second light-emitting control transistor T6 through the fifth via hole VH23. Specifically, the orthographic projection of the first electrode transfer portion 11 on the base substrate 10 at least partially overlaps with the orthographic projection of the second electrode of the second light-emitting control transistor T6 on the base substrate 10, and the orthographic projection of the fifth via hole VH23 on the base substrate falls in a portion where the first electrode transfer portion 11 overlaps with the second light-emitting control transistor T6.

Through such transfer method, the first electrode 61 located in the first electrode layer 6 may be electrically connected to the second electrode (such as the drain D6) of the second light-emitting control transistor T6, that is, corresponding to the node N4 in FIG. 2.

In the embodiment of the present disclosure, the first voltage signal line VDL is electrically connected to the voltage signal transfer portion 12 through the second via hole VH12.

As shown in FIG. 19, the voltage signal transfer portion 12 may include three structures. For convenience in description, the voltage signal transfer portion 12 of the three structures are respectively referred to as a first voltage signal transfer portion 121, a second voltage signal transfer portion 122 and a third voltage signal transfer portion 123.

For example, the first voltage signal transfer portion 121 may include a first part 1211, a second part 1212 and a third part 1213. The second part 1212 extends in the second direction Y, the first part 1211 and the third part 1213 extend in the first direction X, respectively, and the first part 1211 and the third part 1213 extend in opposite directions from the second part 1212, respectively. The first part 1211, the second part 1212 and the third part 1213 of the first voltage signal transfer portion 121 are connected together to form an "inverted T-shaped" structure. In this case, an orthographic projection of an end of the first part 1211 away from the second part 1212 on the base substrate 10 at least partially overlaps with an orthographic projection of a second via hole VH12 on the base substrate 10, and an orthographic projection of an end of the third part 1213 away from the second part 1212 on the base substrate 10 at least partially overlaps with an orthographic projection of another second via hole VH12 on the base substrate 10. For example, the orthographic projection of an end of the first part 1211 away from the second part 1212 on the base substrate 10 at least partially overlaps with an orthographic projection of the widened portion VDLW on the base substrate 10. The first voltage signal transfer portion 121 is electrically connected to the widened portion VDLW of the first voltage signal line VDL through the second via hole VH12, thereby achieving electrical connection between the first voltage signal transfer portion 121 and the first voltage signal line VDL. An orthographic projection of an end of the third part 1213 away from the second part 1212 on the base substrate 10 at least partially overlaps with an orthographic projection of another widened portion VDLW on the base substrate 10. The first voltage signal transfer portion 121 is electrically connected to the widened portion VDLW of another first voltage signal line VDL through another second via hole VH12, thereby achieving electrical connection between the first voltage signal transfer portion 121 and another first voltage signal line VDL.

The second voltage signal transfer portion 122 may include a first part 1221 and a second part 1222. The second part 1222 extends in the second direction Y, the first part 1221 extends in the first direction X, and the first part 1221 extends from the second part 1222 towards one side. The first part 1221 and the second part 1222 of the second voltage signal conversion part 122 are connected together to form an “L-shaped” structure. In this case, an orthographic projection of an end of the first part 1221 away from the second part 1222 on the base substrate 10 at least partially overlaps with an orthographic projection of a second via hole VH12 on the base substrate 10. For example, the orthographic projection of an end of the first part 1211 away from the second part 1212 on the base substrate 10 at least partially overlaps with the orthographic projection of the widened portion VDLW on the base substrate 10. The second voltage signal transfer portion 122 is electrically connected to the widened portion VDLW of the first voltage signal line VDL through the second via hole VH12, thereby achieving electrical connection between the second voltage signal transfer portion 122 and the first voltage signal line VDL.

In this embodiment, the second voltage signal transfer portion 122 forms an “L-shaped” structure. Compared with the “inverted T-shaped” structure of the first voltage signal transfer portion 121, one lateral extension portion is reduced in the second voltage signal transfer portion 122. With reference to FIG. 19, on the left side of the second voltage signal transfer portion 122 in the “L-shaped” structure, a second initialization voltage signal sub-line VIL12 extending in the second direction Y is provided. By reducing a lateral extension portion, it is possible to avoid short circuit between the second voltage signal transfer portion 122 and the second initialization voltage signal sub-line VIL12.

The third voltage signal transfer portion 123 may include a second part 1232 and a third part 1233. The second part 1232 extends in the second direction Y, the third part 1233 extends in the first direction X, and the third part 1233 extends from the second part 1232 towards the other side. The second part 1232 and the third part 1233 of the third voltage signal conversion part 123 are connected together to form a “reverse L-shaped” structure. In this case, an orthographic projection of an end of the third part 1233 away from the second part 1222 on the base substrate 10 at least partially overlaps with the orthographic projection of a second via hole VH12 on the base substrate 10. For example, the orthographic projection of the end of the third part 1213 away from the second part 1212 on the base substrate 10 at least partially overlaps with the orthographic projection of the widened portion VDLW on the base substrate 10. The third voltage signal transfer portion 123 is electrically connected to the widened portion VDLW of the first voltage signal line VDL through the second via hole VH12, thereby achieving electrical connection between the third voltage signal transfer portion 123 and the first voltage signal line VDL.

In this embodiment, the third voltage signal transfer portion 123 has an “reverse L-shaped” structure, and compared to the “inverted T-shaped” structure of the first voltage signal transfer portion 121, one lateral extension portion is reduced in the third voltage signal transfer portion 123. With reference to FIG. 19, on the right side of the third voltage signal transfer portion 123 in the “reverse L-shaped” structure, a second initialization voltage signal sub-line VIL12 extending in the second direction Y is provided. By reducing a lateral extension portion, it is possible to avoid short circuit between the third voltage signal transfer portion 123 and the second initialization voltage signal sub-line VIL12.

In the embodiment of the present disclosure, the voltage signal transfer portion 12 is electrically connected to the second capacitive electrode Cst2 located in the second conductive layer 32 through the ninth via hole VH27. For example, the orthographic projection of the end of the second portion of each of the first voltage signal transfer portion 121, the second voltage signal transfer portion 122 and the third voltage signal transfer portion 123 away from the first portion or the third portion at least partially overlaps with the orthographic projection of the second capacitive electrode Cst2 on the base substrate 10. The orthographic projection of the ninth via hole VH27 on the base substrate 10 is located at a portion where the second portion of each of the first voltage signal transfer portion 121, the second voltage signal transfer portion 122 and the third voltage signal transfer portion 123 overlaps with the second capacitor electrode Cst2.

The voltage signal transfer portion 12 is also electrically connected to the first electrode (such as the source S5) of the first light-emitting control transistor T5 through the twelfth via hole VH30. For example, an orthographic projection of an end of the second portion of each of the first voltage signal transfer portion 121, the second voltage signal transfer portion 122 and the third voltage signal transfer portion 123 connecting to the first portion or the third portion at least partially overlaps with an orthographic projection of the first electrode of the first light-emitting control transistor T5 on the base substrate 10. An orthographic projection of the twelfth via hole VH30 on the base substrate 10 is located in a portion where the second portion of each of the first voltage signal transfer portion 121, the second voltage signal transfer portion 122 and the third voltage signal transfer portion 123 overlaps with the first electrode of the first light-emitting control transistor T5.

Through such connection method, the first voltage signal line VDL is electrically connected to the second capacitor electrode Cst2 and the first electrode of the first light-emitting control transistor T5.

With reference to FIG. 21 to FIG. 27, for any two adjacent first sub-pixels SP1 located in the same row, orthographic projections of some via holes among the plurality of via holes are located on the first side of an orthographic projection of the pixel opening 20 of one first sub-pixel SP1 among the two first sub-pixels SP1 on the base substrate 10, and orthographic projections of some other via holes among the plurality of via holes on the base substrate 10 are located on the second side of the orthographic projection of the pixel opening 20 of the other one of the two first sub-pixels SP1 on the base substrate 10.

In the embodiment of the present disclosure, the number of some via holes of the plurality of via holes located on the first side of the pixel opening 20 of one first sub-pixel and the number of some other via holes of the plurality of via holes located on the second side of the pixel opening 20 of the other first sub-pixel may be the same. For example, in the embodiments shown in FIG. 21 to FIG. 27, for any two adjacent first sub-pixels SP1 located in the same row, orthographic projections of three via holes (such as two first via holes VH11 and one second via hole VH12) located in the first insulation layer IL1 on the base substrate 10 are located on the first side of the orthographic projection of the pixel opening 20 of one first sub-pixel SP1 among the two first sub-pixels SP1 on the base substrate 10, and orthographic projections of another three via holes (such as two first via holes VH11 and one second via hole VH12) located in the first insulation layer IL1 on the base substrate 10 are located on the second side of the orthographic projection of the pixel opening 20 of the other one of the two first sub-pixels SP1 on the base substrate 10.

For example, in the embodiment shown in FIG. 27, for the first and second first sub-pixels SP1 located from the left side of the third row, an orthographic projection of one second via hole VH12 on the base substrate 10 and orthographic projections of two first via holes VH11 on the base substrate 10 are located on the right side of the orthographic projection of the pixel opening 20 of the first first sub-pixel SP1 on the base substrate 10, and the orthographic projections of two first via holes VH11 on the base substrate 10 and the orthographic projection of one second via hole VH12 on the base substrate 10 are located on the left side of the orthographic projection of the pixel opening 20 of the second first sub-pixel SP1 on the base substrate 10.

In the embodiment of the present disclosure, for any two adjacent first sub-pixels located in the same row, via holes located in the first insulation layer below the first electrodes 61 of the light-emitting elements are respectively disposed on opposite sides of the first electrodes 61 or pixel openings 20 of the corresponding sub-pixels, so that the first electrodes 61 of the light-emitting elements of adjacent sub-pixels in the row direction may still be substantially symmetrical relative to the centerline AXL between the two sub-pixels. In this way, the reflected optical paths of the first electrodes 61 of the two adjacent sub-pixels in the row direction may still maintain to be substantially consistent, and the symmetry of the two relative to the centerline AXL between the two sub-pixels is relatively high. Therefore, there is almost no color deviation between adjacent sub-pixels in the row direction, that is, the display effect of the display substrate is good and there is no color deviation problem.

Furthermore, in the embodiment of the present disclosure, for any two adjacent first sub-pixels SP1 located in the same row, orthographic projections of some via holes (such as the one second via hole VH12 and two first via holes VH11 shown in FIG. 27) on the base substrate 10 and orthographic projections of some other via holes (such as the two first via holes VH11 and one second via hole VH12 shown in FIG. 27) on the base substrate 10 are symmetrical relative to the first symmetry axis AX1. The first symmetry axis AX1 passes through a center point of a line connecting the centers of the pixel openings 20 of the two first sub-pixels and extends in the second direction Y.

Through symmetrically designing via holes located in the planarization layer below the first electrode, the symmetry of the reflected optical paths of the first electrodes 61 of the light-emitting elements of the two adjacent sub-pixels in the row direction may be further improved, thereby further improving or even eliminating the color deviation problem between adjacent sub-pixels in the row direction, and enhancing the display effect.

In the embodiment of the present disclosure, the first voltage signal transfer portion 121 is provided between the second voltage signal transfer portion 122 and the third voltage signal transfer portion 133 adjacent to the second voltage signal transfer portion 122 in the first direction X. For example, in the embodiment shown in FIG. 27, for the row where the first row of first sub-pixels SP1 are located, the voltage signal transfer portions may be arranged in sequence in a periodic order according to a sequence of the third voltage signal transfer portion 123, the first voltage signal transfer portion 121, the second voltage signal transfer portion 122 and the first voltage signal transfer portion 121. Through such periodically disposing the voltage signal transfer portions, the second via holes VH12 close to the first electrodes of the first sub-pixels SP1 may be symmetrically designed, thereby achieving good display performance of the display substrate without color deviation problem.

The data line DL is electrically connected to the data signal transfer portion 13 through the data signal connection hole VH13, and the data signal transfer portion 13 is electrically connected to the second electrode (such as the drain D4) of the data writing transistor T4 through the seventh via hole VH25. Through such connection method, the data signal transmitted by the data line DL may be transmitted to the second electrode of the data writing transistor T4.

In the embodiment of the present disclosure, the first initialization voltage signal line VIL1 is electrically connected to the first electrode (such as the source S7) of the first reset transistor T7 through the third via hole VH21. For example, an orthographic projection of a portion where the first portion VIL111 of the first initialization voltage signal sub-line VIL11 is connected to the second portion VIL112 of the first initialization voltage signal sub-line VIL11 on the base substrate 10 at least partially overlaps with an orthographic projection of the first electrode of the first reset transistor T7 on the base substrate 10, and an orthographic projection of the third via hole VH21 on the base substrate 10 falls into a portion where the portion of the first portion VIL111 connected to the second portion VIL112 overlaps with the first electrode of the first reset transistor T7. Alternatively, an orthographic projection of a portion where the third portion VIL113 of the first initialization voltage signal sub-line VIL11 is connected to the second portion VIL112 of the first initialization voltage signal sub-line VIL11 on the base substrate 10 at least partially overlaps with the orthographic projection of the first electrode of the first reset transistor T7 on the base substrate 10, and the orthographic projection of the third via hole VH21 on the base substrate 10 falls into the portion where the portion of the third portion VIL113 connected to the second portion VIL112 overlaps with the first electrode of the first reset transistor T7.

The first transfer portion 14 is electrically connected to the second initialization voltage signal line VIL2 through the fourth via hole VH22. The first transfer portion 14 is also electrically connected to the first electrode (such as the source S1) of the second reset transistor T1 through the tenth via hole VH28. For example, the first transfer portion 14 includes a first portion 141 located in the middle and a second portion 142 and a third portion 143 located at two ends. An orthographic projection of the first portion 141 on the base substrate 10 at least partially overlaps with an orthographic projection of the fourth via hole VH22 on the base substrate 10. The first portion 141 of the first transfer portion 14 is electrically connected to the second initialization voltage signal line VIL2 through the fourth via hole VH22. The orthographic projection of the second portion 142 on the base substrate 10 at least partially overlaps with the orthographic projection of a tenth via hole VH28 on the base substrate 10. The second portion 142 of the first transfer portion 14 is electrically connected to the first electrode (such as the source S1) of the second reset transistor T1 of a pixel driving circuit of a sub-pixel through a tenth via hole VH28. An orthographic projection of the third portion 143 on the base substrate 10 at least partially overlaps with an orthographic projection of another tenth via hole VH28 on the base substrate 10. The third portion 143 of the first transfer portion 14 is electrically connected to the first electrode (such as the source S1) of the second reset transistor T1 of the pixel driving circuit of another sub-pixel through another tenth via hole VH28.

In the embodiment of the present disclosure, at least a part of the first capacitive electrode Cst1 is simultaneously implemented as a gate G3 of the driving transistor T3. One end of the second transfer portion 15 is electrically connected to the first capacitor electrode Cst1 through the sixth via hole VH24, and the other end of the second transfer portion 15 is electrically connected to the second electrode of the second reset transistor T1 (such as the drain D1) or the second electrode of the compensation transistor T2 (such as the drain D2) through VH29. Through such connection method, the electrical connection at the node N1 is achieved.

One end of the third transfer portion 16 is electrically connected to the first electrode (such as the source S6) of the second light-emitting control transistor T6 through the eighth via hole VH26, and the other end of the third transfer portion 16 is electrically connected to the first electrode (such as the source S2) of the compensation transistor T2 through the thirteenth via hole VH31. Through such connection method, the electrical connection at the node N3 is achieved.

With reference to FIG. 26, FIG. 26 schematically shows pixel openings 20 of a plurality of sub-pixels. For example, in the embodiment shown in FIG. 26, a shape of an orthographic projection of the pixel opening 20 on the base substrate 10 is circular or approximately circular. It should be noted that in other embodiments, the shape of the orthographic projection of the pixel opening 20 on the base substrate 10 may be other shapes, and the embodiments of the present disclosure do not impose special limitations on this.

For example, with reference to FIG. 26, the shape of the orthographic projection of the pixel opening of the first sub-pixel SP1 on the base substrate 10 is approximately circular.

For example, by taking a first straight line XL1 passing through the midpoint of the pixel opening and extending parallel to the first direction X as the dividing line, the orthographic projection of the pixel opening of the first sub-pixel SP1 on the base substrate 10 may be divided into a first portion and a second portion. In the embodiment shown in FIG. 26, the first portion is an upper half portion, and the second portion is a lower half portion. The areas of the first portions of the orthographic projections of the pixel openings of at least some first sub-pixels SP1 on the base substrate 10 are not equal to the areas of the second portions of the orthographic projections of the pixel openings of these first sub-pixels SP1 on the base substrate 10. For example, the areas of the first portions of the orthographic projections of the pixel openings of some first sub-pixels SP1 on the base substrate 10 are larger than the areas of the second portions of the orthographic projections of the pixel openings of these first sub-pixels SP1 on the base substrate 10, that is, presenting a shape of "larger top and smaller bottom". The areas of the first portions of the orthographic projections of the pixel openings of some other first sub-pixels SP1 on the base substrate 10 are smaller than the areas of the second portions of the orthographic projections of the pixel openings of those first sub-pixels SP1 on the base substrate 10, that is, presenting a shape of "smaller top and larger bottom". For example, for two adjacent first sub-pixels SP1 in the second direction Y, the pixel opening of one first sub-pixel SP1 has a shape of "larger top and smaller bottom", the pixel opening of the other first sub-pixel SP1 has a shape of "smaller top and larger bottom". Through such disposing method, the uniformity of red light in the second direction Y may be improved.

For example, by taking a second straight line YL1 passing through the midpoint of the pixel opening and extending parallel to the second direction Y as the dividing line, the orthographic projection of the pixel opening of the first sub-pixel SP1 on the base substrate 10 may be divided into a third portion and a fourth portion. In the embodiment shown in FIG. 26, the third portion is the left half portion, and the fourth portion is the right half portion. The areas of the third portions of the orthographic projections of the pixel openings of at least some first sub-pixels SP1 on the base substrate 10 are not equal to the areas of the fourth portions of the orthographic projections of the pixel openings of these first sub-pixels SP1 on the base substrate 10. For example, the areas of the third portions of the orthographic projections of the pixel openings of some first sub-pixels SP1 on the base substrate 10 are greater than the areas of the fourth portions of the orthographic projections of the pixel openings of these first sub-pixels SP1 on the base substrate 10, that is, presenting a shape of "larger left and smaller right". The areas of the third portions of the orthographic projections of the pixel openings of some other first sub-pixels SP1 on the base substrate 10 are smaller than the areas of the fourth portions of the orthographic projections of the pixel openings of those first sub-pixels SP1 on the base substrate 10, that is, presenting a shape of "smaller left and larger right". For example, for two adjacent first sub-pixels SP1 in the first direction X, the pixel opening of one first sub-pixel SP1 has a shape of "large left and small right", while the pixel opening of the other first sub-pixel SP1 has a shape of "small left and large right". Through such disposing method, the uniformity of red light in the first direction X may be improved. With reference to FIG. 27, the orthographic projection of the pixel opening 20 of each sub-pixel fall into the orthographic projection of the first electrode 61 of the corresponding sub-pixel on the base substrate 10.

With reference to FIG. 27, a vertical distance between the center of the pixel opening 20 of the first sub-pixel and the first portion VIL121 of the second initialization voltage signal sub-line which is closest to the center of the pixel opening 20 is a first distance d1. A vertical distance between the center of the pixel opening 20 of the first sub-pixel and the third portion VIL123 of the second initialization voltage signal sub-line which is closest to the center of the pixel opening 20 is a second distance d2. The first distance d1 is less than the second distance d2.

Specifically, the first portion VIL121 of at least one second initialization voltage signal sub-line passes through at least one data signal transfer portion 13 in an extension line of the second direction Y (for example, the straight line L1 in FIG. 27). The third portion VIL123 of the at least one second initialization voltage signal sub-line is spaced apart from the at least one data signal transfer portion 13 in the first direction X.

That is to say, in the embodiment of the present disclosure, compared with the third portion VIL123, the first portion VIL121 of the second initialization voltage signal sub-line located below the first electrode of the first sub-pixel is closer to the center of the pixel opening 20 of the first sub-pixel. In order to avoid interference between the first portion VIL121 of the second initialization voltage signal sub-line and the data signal transfer portion 13, in an extension process of the second initialization voltage signal sub-line, the second portion VIL122 extending obliquely makes the second initialization voltage signal sub-line further away from the center of the pixel opening 20 of the first sub-pixel, so that the third portion VIL123 and at least one data signal transfer portion 13 are spaced apart from each other in the first direction X.

With continued reference to FIG. 27, the orthographic projection of the second initialization voltage signal sub-line VIL12 on the base substrate does not overlap with the orthographic projection of the first electrode of the second sub-pixel SP2 on the base substrate, and the orthographic projection of the second initialization voltage signal sub-line VIL12 on the base substrate does not overlap with the orthographic projection of the first electrode of the third sub-pixel SP3 on the base substrate.

Figure 30A:
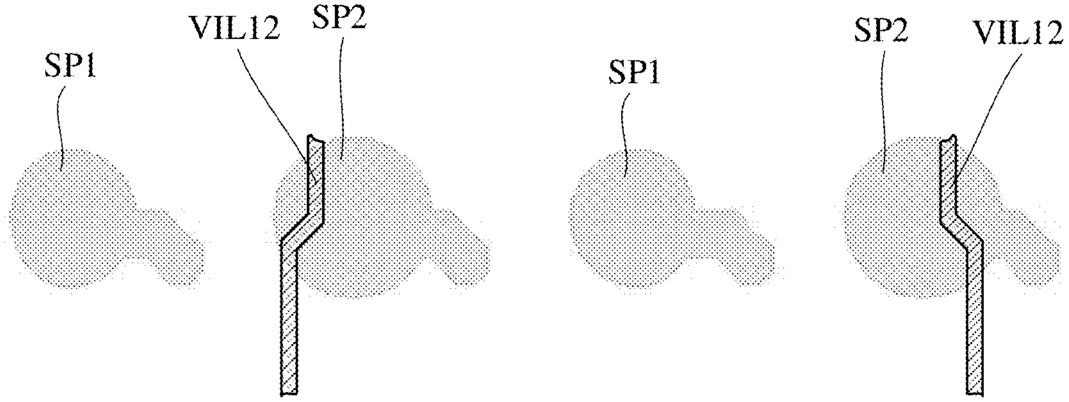
FIG. 30A schematically shows a relative position relationship between a sub-pixel and a second initialization voltage signal sub-line according to some other embodiments of the present disclosure.

FIG. 30A schematically shows a relative position relationship between a sub-pixel and a second initialization voltage signal sub-line according to some other embodiments of the present disclosure. As shown in FIG. 30A, for any two adjacent second sub-pixels SP2 located in the same column, the orthographic projection of one second initialization voltage signal sub-line VIL12 on the base substrate 10 passes through an edge of the first side of the orthographic projection of the first electrode 61 of one second sub-pixel SP2 among the two second sub-pixels SP2 on the base substrate 10, and the orthographic projection of another second initialization voltage signal sub-line VIL12 on the base substrate 10 passes through an edge of the second side of the orthographic projection of the first electrode 61 of the other one of the two second sub-pixels SP2 on the base substrate 10.

For any two adjacent second sub-pixels SP2 located in the same column, the orthographic projection of one second initialization voltage signal sub-line VIL12 on the base substrate 10 is located on the first side of the orthographic projection of the pixel opening 20 of one second sub-pixel SP2 among the two second sub-pixels SP2 on the base substrate 10, and the orthographic projection of another second initialization voltage signal sub-line VIL12 on the base substrate 10 is located on the second side of the orthographic projection of the pixel opening 20 of the other one of the two second sub-pixels SP2 on the base substrate 10.

Figure 30B:
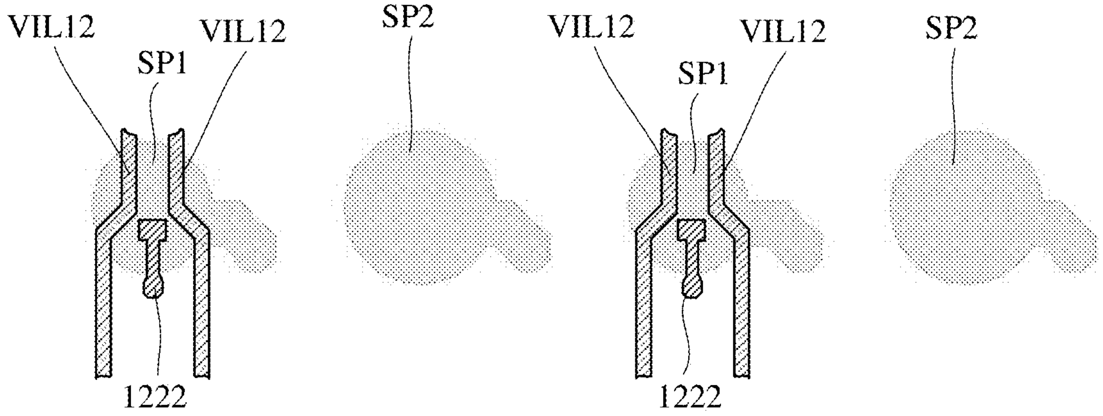
FIG. 30B schematically shows a relative position relationship between a sub-pixel and a second initialization voltage signal sub-line according to some yet embodiments of the present disclosure.

FIG. 30B schematically shows a relative position relationship between a sub-pixel and a second initialization voltage signal sub-line according to some yet other embodiments of the present disclosure. As shown in FIG. 30B, the orthographic projections of two second initialization voltage signal sub-lines VIL12 on the base substrate 10 pass through the edge of the first side of the orthographic projection of the first electrode 61 of a first sub-pixel SP1 on the base substrate 10 and the edge of the second side of the orthographic projection of the first electrode 61 of the same first sub-pixel SP1 on the base substrate 10, respectively. For example, the orthographic projections of the two second initialization voltage signal sub-lines VIL12 on the base substrate 10 are symmetrical relative to the centerline of the orthographic projection of the first electrode 61 of the same first sub-pixel SP1 on the base substrate 10. Through such design, the planarity of the first electrode 61 of the first sub-pixel SP1 may be improved.

With reference to FIG. 19, FIG. 27 and FIG. 30B, in the embodiment shown in FIG. 30B, the lateral extension portion of the second voltage signal transfer portion 122 is further reduced, that is, the first part 1221 of the second voltage signal transfer portion 122 is removed. The lateral extension portion of the third voltage signal transfer portion 123 is further reduced, that is, the third part 1233 of the third voltage signal transfer portion 123 is removed. In this way, it is possible to avoid short circuit between the second voltage signal transfer portion 122 or the third voltage signal transfer portion 123 and the two second initialization voltage signal sub-lines VIL12. In this case, a plurality of second capacitor electrodes Cst2 located in the same row may be connected to each other, as shown in FIG. 30D. Next, according to the actual wiring space, the second capacitor electrode Cst2 may be electrically connected to the first voltage signal line VDL. In this way, the first voltage signal line VDL may be electrically connected to the second capacitor electrode Cst2 and the first electrode of the first light-emitting control transistor T5 (such as the source S5).

Figure 30C:
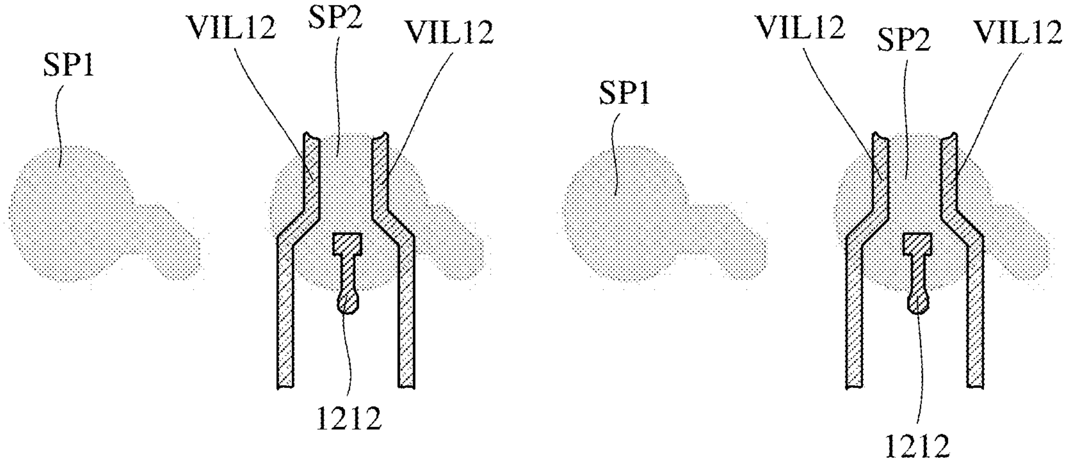
FIG. 30C schematically shows a relative position relationship between a sub-pixel and a second initialization voltage signal sub-line according to some yet other embodiments of the present disclosure.
Figure 30D:
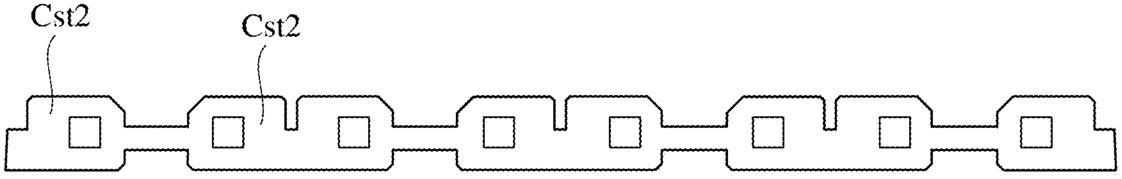
FIG. 30D schematically shows a case that a plurality of second capacitor electrodes located in a same row are connected to each other according to some other embodiments of the present disclosure.

FIG. 30C schematically shows a relative position relationship between a sub-pixel and a second initialization voltage signal sub-line according to some yet other embodiments of the present disclosure. As shown in FIG. 30C, the orthographic projections of two second initialization voltage signal sub-lines VIL12 on the base substrate 10 pass through the edge of the first side of the orthographic projection of the first electrode 61 of a second sub-pixel SP2 on the base substrate 10 and the edge of the second side of the orthographic projection of the first electrode 61 of the same second sub-pixel SP2 on the base substrate 10, respectively. For example, the orthographic projections of the two second initialization voltage signal sub-lines VIL12 on the base substrate 10 are symmetrical relative to the centerline of the orthographic projection of the first electrode 61 of the same second sub-pixel SP2 on the base substrate 10. Through such design, the planarity of the first electrode 61 of the second sub-pixel SP2 may be improved.

With reference to FIG. 19, FIG. 27 and FIG. 30C, in the embodiment shown in FIG. 30C, it is possible to reduce two lateral extension portions of the first voltage signal transfer portion 121, that is, the first part 1211 of the first voltage signal transfer portion 121 and third part 1213 of the first voltage signal transfer portion 121 are removed, so as to avoid short circuit between the first voltage signal transfer portion 121 and the two second initialization voltage signal sub-lines VIL12. In this case, a plurality of second capacitor electrodes Cst2 located in the same row may be connected to each other, as shown in FIG. 30D. Next, according to the actual wiring space, the second capacitor electrode Cst2 may be electrically connected to the first voltage signal line VDL. In this way, the first voltage signal line VDL may be electrically connected to the second capacitor electrode Cst2 and the first electrode of the first light-emitting control transistor T5 (such as the source S5).

At least some embodiments of the present disclosure also provide a display panel. The display panel includes the display substrate as described above. For example, the display panel may be an OLED display panel.

With back reference to FIG. 1, at least some embodiments of the present disclosure also provide a display device. The display device may include the display substrate as described above. The display device includes a display region AA and a non-display region NA.

The display device may include any device or product with display function. For example, the display device may be a smartphone, mobile phone, e-book reader, desktop computer (PC), laptop PC, netbook PC, personal digital assistant (PDA), portable multimedia player (PMP), digital audio player, mobile medical device, camera, wearable device (such as head worn device, electronic clothing, electronic bracelet, electronic necklace, electronic accessory, electronic tattoo, or smartwatch), television, etc.

It should be understood that the display panel and the display device according to the present embodiments of the present disclosure have all the characteristics and advantages of the display substrate mentioned above, which may be described in detail above and will not be repeated here.

Although some embodiments of the entire technical concept of the present disclosure have been shown and explained, those of skill in the art will understand that changes may be made to these embodiments without departing from the principles and spirit of the entire technical concept. The scope of the present disclosure is limited by the claims and their equivalents.

What is claimed is:

1. A display substrate, comprising:

a base substrate;

a plurality of sub-pixels arranged in an array along a first direction and a second direction on the base substrate, so as to form a plurality of rows of sub-pixels and a plurality of columns of sub-pixels, respectively, wherein at least one sub-pixel comprises a light-emitting element;

a first initialization voltage signal line disposed on the base substrate, wherein the first initialization voltage signal line is configured to transmit a first initialization voltage signal;

a first electrode layer disposed on the base substrate, wherein the light-emitting element of the at least one sub-pixel comprises a first electrode located in the first electrode layer; and a pixel defining layer disposed on a side of the first electrode layer away from the base substrate, wherein the at least one sub-pixel comprises a pixel opening located in the pixel defining layer, an orthographic projection of the pixel opening of the at least one sub-pixel on the base substrate falls into an orthographic projection of the first electrode of the at least one sub-pixel on the base substrate, wherein the first initialization voltage signal line comprises a first initialization voltage signal sub-line and a second initialization voltage signal sub-line, a main body of the first initialization voltage signal sub-line extends in the first direction, and a main body of the second initialization voltage signal sub-line extends in the second direction;

the at least one sub-pixel comprises a plurality of first sub-pixels, and the plurality of first sub-pixels are sub-pixels of a first color;

orthographic projections of a plurality of second initialization voltage signal sub- lines on the base substrate partially overlap with orthographic projections of the first electrodes of the plurality of first sub-pixels on the base substrate, respectively;

orthographic projections of the pixel openings of the plurality of first sub-pixels have respective first sides and respective second sides on the base substrate, respectively, orthographic projections of the pixel openings of the plurality of first sub-pixels have respective midpoints on the base substrate, respectively, the midpoint is a midpoint of a virtual line segment of the orthographic projection of the pixel opening on the base substrate extending in the first direction, and the first side and the second side are opposite sides relative to the midpoint in the first direction; and for at least two first sub-pixels, an orthographic projection of one second initialization voltage signal sub-line on the base substrate is located on the first side of the midpoint of the pixel opening of one first sub-pixel among the two first sub-pixels, an orthographic projection of another second initialization voltage signal sub-line on the base substrate is located on the second side of the midpoint of the pixel opening of the other first sub-pixel among the two first sub-pixels.

2. The display substrate of claim 1, wherein the two first sub-pixels are any two adjacent first sub-pixels located in a same row.

3. The display substrate of claim 2, wherein a plurality of first initialization voltage signal sub-lines intersect with a plurality of second initialization voltage signal sub-lines, and the plurality of first initialization voltage signal sub-lines are connected to the plurality of second initialization voltage signal sub-lines, so that the first initialization voltage signal line forms a mesh structure.

4. The display substrate of claim 3, wherein the orthographic projections of the plurality of second initialization voltage signal sub-lines on the base substrate partially overlap with the orthographic projections of the pixel openings of the plurality of first sub-pixels on the base substrate, respectively.

5. The display substrate of claim 2, wherein for the any two adjacent first sub-pixels located in the same row, orthographic projections of the two second initialization voltage signal sub-lines partially overlapping with the first electrodes of the two first sub-pixels on the base substrate are symmetrical relative to a first symmetry axis, and the first symmetry axis passes through a center point of a line connecting centers of the pixel openings of the two first sub-pixels and extends in the second direction.

6. The display substrate of claim 1, wherein for any two adjacent first sub-pixels located in a same column, an orthographic projection of one second initialization voltage signal sub-line on the base substrate is located on the first side of the orthographic projection of the pixel opening of one first sub-pixel among the two first sub-pixels on the base substrate, and an orthographic projection of another second initialization voltage signal sub-line on the base substrate is located on the second side of the orthographic projection of the pixel opening of the other first sub-pixel among the two first sub-pixels on the base substrate.

7. The display substrate of claim 1, wherein the plurality of rows of sub-pixels comprise a plurality of rows of first sub-pixels, the plurality of columns of sub-pixels comprise a plurality of columns of first sub-pixels; and a position of the second initialization voltage signal sub-line partially overlapping with the first electrode of the first sub-pixel in an $i^{th}$ row and a $j^{th}$ column and a position of the second initialization voltage signal sub-line partially overlapping with the first electrode of the first sub-pixel in an $(i+4)^{th}$ row and the $j^{th}$ column are aligned in the second direction, where i is a positive integer greater than or equal to 1, and j is a positive integer greater than or equal to 1.

8. The display substrate of claim 1, wherein the plurality of rows of sub-pixels comprise a plurality of rows of first sub-pixels, the plurality of columns of sub-pixels comprise a plurality of columns of first sub-pixels; and a position of the second initialization voltage signal sub-line partially overlapping with the first electrode of the first sub-pixel in an $i^{th}$ row and a $j^{th}$ column and a position of the second initialization voltage signal sub-line partially overlapping with the first electrode of the first sub-pixel in an $(i+2)^{th}$ row and the $j^{th}$ column are aligned in the second direction, where i is a positive integer greater than or equal to 1, and j is a positive integer greater than or equal to 1.

9. The display substrate of claim 1, wherein at least one second initialization voltage signal sub-line is located between two adjacent first initialization voltage signal sub-lines; and at least one second initialization voltage signal sub-line comprises a first portion, a second portion and a third portion, the second portion is located between the first portion and the third portion, the first portion and the third portion both extend in the second direction, the second portion extends in a third direction, the third direction intersects with the first direction, and the third direction intersects with the second direction.

10. The display substrate of claim 9, wherein a distance between a center of the pixel opening of the first sub-pixel and a first portion of a second initialization voltage signal sub-line closest to the center of the pixel opening of the first sub-pixel in the first direction is a first distance, a distance between the center of the pixel opening of the first sub-pixel and a third portion of a second initialization voltage signal sub-line closest to the center of the pixel opening of the first sub-pixel in the first direction is a second distance, and the first distance is less than the second distance.

11. The display substrate of claim 9, wherein the display substrate comprises a first conductive layer and a second conductive layer which are disposed on the base substrate, the second conductive layer is located between the first conductive layer and the first electrode layer, and the first initialization voltage signal line is located in the first conductive layer;

the display substrate further comprises a data line located in the second conductive layer, and the data line is configured to transmit a data signal;

the display substrate further comprises a data signal transfer portion located in the first conductive layer, and the data signal transfer portion is electrically connected to the data line; and an extension line of the first portion of the at least one second initialization voltage signal sub-line in the second direction passes through at least one data signal transfer portion, and the third portion of the at least one second initialization voltage signal sub-line and at least one data signal transfer portion are spaced apart from each other in the first direction.

12. The display substrate of claim 1, wherein the display substrate further comprises a first insulation layer located between a first conductive layer and a second conductive layer; and a plurality of via holes located in the first insulation layer; and for any two adjacent first sub-pixels located in a same row, orthographic projections of some via holes among the plurality of via holes on the base substrate are located on the first side of the orthographic projection of the pixel opening of one first sub-pixel among the two first sub-pixels on the base substrate, orthographic projections of some other via holes among the plurality of via holes on the base substrate are located on the second side of the orthographic projection of the pixel opening of the other first sub-pixel among the two first sub-pixels on the base substrate.

13. The display substrate of claim 12, wherein for the any two adjacent first sub-pixels located in the same row, the orthographic projections of said some via holes on the base substrate and the orthographic projections of said some other via holes on the base substrate are symmetrical relative to a first symmetry axis, wherein the first symmetry axis passes through a center point of a line connecting centers of the pixel openings of the two first sub-pixels and extends in the second direction.

14. The display substrate of claim 12, wherein the display substrate further comprises a first electrode transfer portion located in the first conductive layer and a second electrode transfer portion located in the second conductive layer, and the plurality of via holes located in the first insulation layer comprise a first via hole;

the first electrode is electrically connected to the second electrode transfer portion, and the second electrode transfer portion is electrically connected to the first electrode transfer portion through the first via hole; and said some via holes comprise at least one first via hole, and said some other via holes comprise at least one first via hole.

15. The display substrate of claim 14, wherein said some via holes comprise two first via holes, and said some other via holes comprise two first via holes, wherein the display substrate further comprises a voltage signal transfer portion located in the first conductive layer and a first voltage signal line located in the second conductive layer, the plurality of via holes located in the first insulation layer comprise a second via hole, and the first voltage signal line is electrically connected to the voltage signal transfer portion through the second via hole; and said some via holes comprise at least one second via hole, and said some other via holes comprise at least one second via hole, wherein the voltage signal transfer portion comprises a first voltage signal transfer portion, the first voltage signal transfer portion comprises a first part, a second part and a third part, the second part of the first voltage signal transfer portion extends in the second direction, the first part and the third part of the first voltage signal transfer portion respectively extend in the first direction, and the first part and the third part of the first voltage signal transfer portion respectively extend in opposite directions from the second part of the first voltage signal transfer portion; and an orthographic projection of an end of the first part of the first voltage signal transfer portion away from the second part of the first voltage signal transfer portion on the base substrate at least partially overlaps with an orthographic projection of one second via hole on the base substrate, and an orthographic projection of an end of the third part of the first voltage signal transfer portion away from the second part of the first voltage signal transfer portion on the base substrate at least partially overlaps with an orthographic projection of another second via hole on the base substrate, wherein the voltage signal transfer portion comprises a second voltage signal transfer portion, the second voltage signal transfer portion comprises a first part and a second part, the second part of the second voltage signal transfer portion extends in the second direction, the first part of the second voltage signal transfer portion extends in the first direction, and the first part of the second voltage signal transfer portion extends from the second part of the second voltage signal transfer portion towards one side; and an orthographic projection of an end of the first part of the second voltage signal transfer portion away from the second part of the second voltage signal transfer portion on the base substrate at least partially overlaps with an orthographic projection of one second via hole on the base substrate, wherein the voltage signal transfer portion comprises a third voltage signal transfer portion, the third voltage signal transfer portion comprises a second part and a third part, the second part of the third voltage signal transfer portion extends in the second direction, the third part of the third voltage signal transfer portion extends in the first direction, and the third part of the third voltage signal transfer portion extends from the second part of the third voltage signal transfer portion towards the other side; and an orthographic projection of an end of the third part of the third voltage signal transfer portion away from the second part of the third voltage signal transfer portion on the base substrate at least partially overlaps with an orthographic projection of one second via hole on the base substrate, wherein the first voltage signal transfer portion is provided between the second voltage signal transfer portion and the third voltage signal transfer portion adjacent to the second voltage signal transfer portion in the first direction.

16. The display substrate of claim 1, wherein the display substrate comprises a plurality of pixel driving circuits disposed on the base substrate, the plurality of pixel driving circuits are arranged in an array along the first direction and the second direction, and the plurality of pixel driving circuits are configured to drive the light-emitting elements of the plurality of sub-pixels, respectively;

the display substrate further comprises: a first semiconductor layer disposed on the base substrate; a third conductive layer located on a side of the first semiconductor layer away from the base substrate; a fourth conductive layer located on a side of the third conductive layer away from the base substrate; a second semiconductor layer located on a side of the fourth conductive layer away from the base substrate; a fifth conductive layer located on a side of the second semiconductor layer away from the base substrate; and a second insulation layer disposed between the fifth conductive layer and the first conductive layer;

the pixel driving circuit comprises a first reset transistor, the first reset transistor comprises an active layer, a gate, a source and a drain, and the active layer of the first reset transistor is located in the first semiconductor layer;

the display substrate further comprises a third via hole located in the second insulation layer, and the first initialization voltage signal line is electrically connected to the source of the first reset transistor or the drain of the first reset transistor through the third via hole, wherein the pixel driving circuit further comprises a second reset transistor, the second reset transistor comprises an active layer, a gate, a source and a drain, and the active layer of the second reset transistor is located in the second semiconductor layer; and the display substrate further comprises a second initialization voltage signal line disposed on the base substrate, the second initialization voltage signal line is configured to transmit a second initialization voltage signal, and the second initialization voltage signal line is electrically connected to the source of the second reset transistor or the drain of the second reset transistor; and the second initialization voltage signal line is located in the fourth conductive layer, and the second initialization voltage signal line extends in the first direction.

17. The display substrate of claim 1, wherein the plurality of sub-pixels further comprise a second sub-pixel and a third sub-pixel;

the orthographic projection of the second initialization voltage signal sub-line on the base substrate does not overlap with an orthographic projection of a first electrode of the second sub-pixel on the base substrate, and the orthographic projection of the second initialization voltage signal sub-line on the base substrate does not overlap with an orthographic projection of a first electrode of the third sub-pixel on the base substrate, wherein orthographic projections of the plurality of first initialization voltage signal sub-lines on the base substrate partially overlap with an orthographic projection of the first electrode of at least one third sub-pixel on the base substrate; and/or, the orthographic projection of the first initialization voltage signal sub-line on the base substrate does not overlap with an orthographic projection of the first electrode of the first sub-pixel on the base substrate; and/or, the orthographic projection of the first initialization voltage signal sub-line on the base substrate does not overlap with the orthographic projection of the first electrode of the second sub-pixel on the base substrate, wherein the first sub-pixel is a red sub-pixel, the second sub-pixel is a blue sub-pixel, and the third sub-pixel is a green sub-pixel.

18. A display device comprising the display substrate of claim 1.

19. A display substrate, comprising:

a base substrate;

a plurality of sub-pixels arranged in an array along a first direction and a second direction on the base substrate, so as to form a plurality of rows of sub-pixels and a plurality of columns of sub-pixels, respectively, wherein at least one sub-pixel comprises a light-emitting element;

a first initialization voltage signal line disposed on the base substrate, wherein the first initialization voltage signal line is configured to transmit a first initialization voltage signal;

a first electrode layer disposed on the base substrate, wherein the light-emitting element of the at least one sub-pixel comprises a first electrode located in the first electrode layer; and a pixel defining layer disposed on a side of the first electrode layer away from the base substrate, wherein the at least one sub-pixel comprises a pixel opening located in the pixel defining layer, an orthographic projection of the pixel opening of the at least one sub-pixel on the base substrate falls into an orthographic projection of the first electrode of the at least one sub-pixel on the base substrate, wherein the at least one sub-pixel comprises a plurality of first sub-pixels, and the plurality of first sub-pixels are sub-pixels of a first color;

orthographic projections of a plurality of second initialization voltage signal sub- lines on the base substrate partially overlap with orthographic projections of the first electrodes of the plurality of first sub-pixels on the base substrate, respectively;

orthographic projections of the pixel openings of the plurality of first sub-pixels have respective first sides and respective second sides on the base substrate, respectively, orthographic projections of the pixel openings of the plurality of first sub-pixels have respective midpoints on the base substrate, respectively, the midpoint is a midpoint of a virtual line segment of the orthographic projection of the pixel opening on the base substrate extending in the first direction, and the first side and the second side are opposite sides relative to the midpoint in the first direction; and wherein the display substrate further comprises: a first conductive layer and a second conductive layer which are disposed on the base substrate; a first insulation layer located between the first conductive layer and the second conductive layer; a plurality of via holes located in the first insulation layer; the second conductive layer is located between the first conductive layer and the first electrode layer, and the first initialization voltage signal line is located in the first conductive layer;

for at least two first sub-pixels, orthographic projections of some via holes among the plurality of via holes on the base substrate are located on the first side of the midpoint of the pixel opening of one first sub-pixel among the two first sub-pixels, orthographic projections of some other via holes among the plurality of via holes on the base substrate are located on the second side of the midpoint of the pixel opening of the other first sub-pixel among the two first sub-pixels.

20. A display device comprising the display substrate of claim 19.

* * * * *